(12) United States Patent
Kurokawa

(10) Patent No.: US 9,541,386 B2
(45) Date of Patent: Jan. 10, 2017

(54) DISTANCE MEASUREMENT DEVICE AND DISTANCE MEASUREMENT SYSTEM

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 922 days.

(21) Appl. No.: 13/795,379

(22) Filed: Mar. 12, 2013

(65) Prior Publication Data
US 2013/0250274 A1 Sep. 26, 2013

(30) Foreign Application Priority Data

Mar. 21, 2012 (JP) .................................. 2012-063338

(51) Int. Cl.
*H01L 27/148* (2006.01)
*G01C 3/08* (2006.01)
(Continued)

(52) U.S. Cl.
CPC ............. *G01C 3/08* (2013.01); *G01S 7/4816* (2013.01); *G01S 7/4861* (2013.01); *G01S 17/08* (2013.01);
(Continued)

(58) Field of Classification Search
CPC ................... H01L 27/14609; H01L 27/14612; H01L 27/14643; H01L 27/14652
See application file for complete search history.

(56) References Cited

U.S. PATENT DOCUMENTS 4,438,455 A 3/1984 Tabei
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Brown.C et al., "31.3: A System LCD with Integrated 3-Dimensional Input Device,", SID Digest '10 : SID International Symposium Digest of Technical Papers, 2010, pp. 453-456.
(Continued)

*Primary Examiner* — Jesse Y Miyoshi
(74) *Attorney, Agent, or Firm* — Robinson Intellectual Property Law Office; Eric J. Robinson

(57) ABSTRACT

A distance measurement device with high detection accuracy. The distance measurement device includes a photosensor including a light-receiving element, a first transistor, and a second transistor; a wiring; a signal line; and a power supply line. The wiring is electrically connected to one electrode of the light-receiving element. The signal line is electrically connected to a gate electrode of the first transistor. The power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other electrode of the light-receiving element and the other of the source electrode and the drain electrode of the second transistor.

18 Claims, 16 Drawing Sheets

(51) Int. Cl.
*H01L 31/02* (2006.01)
*G01S 17/10* (2006.01)
*G01S 17/08* (2006.01)
*G01S 17/36* (2006.01)
*G01S 17/32* (2006.01)
*G01S 17/89* (2006.01)
*G01S 7/481* (2006.01)
*G01S 7/486* (2006.01)

(52) U.S. Cl.
CPC .............. *G01S 17/10* (2013.01); *G01S 17/102* (2013.01); *G01S 17/105* (2013.01); *G01S 17/107* (2013.01); *G01S 17/32* (2013.01); *G01S 17/325* (2013.01); *G01S 17/36* (2013.01); *G01S 17/89* (2013.01); *H01L 31/02* (2013.01)

(56) References Cited

U.S. PATENT DOCUMENTS

| | | | |
|---|---|---|---|
| 5,744,864 | A | 4/1998 | Cillessen et al. |
| 5,965,875 | A | 10/1999 | Merrill |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,747,638 | B2 | 6/2004 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,271,835 | B2 | 9/2007 | Iizuka et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,411,620 | B2 | 8/2008 | Taniguchi et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,525,523 | B2 | 4/2009 | Yamazaki et al. |
| 7,663,165 | B2 | 2/2010 | Mouli |
| 7,674,650 | B2 | 3/2010 | Akimoto et al. |
| 7,732,819 | B2 | 6/2010 | Akimoto et al. |
| 9,136,297 | B2 | 9/2015 | Kurokawa |
| 9,264,693 | B2 | 2/2016 | Kurokawa |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0209651 | A1 | 11/2003 | Iwasaki |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0157760 | A1 | 7/2006 | Hayashi et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1* | 11/2006 | Sugihara ............ H01L 29/66969 257/646 |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0018075 | A1 | 1/2007 | Cazaux et al. |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0054319 | A1 | 3/2008 | Mouli |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0101948 | A1 | 4/2009 | Park et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0236644 | A1* | 9/2009 | Adkisson ............ G06F 17/5063 257/292 |
| 2009/0278122 | A1 | 11/2009 | Hosono et al. |
| 2009/0280600 | A1 | 11/2009 | Hosono et al. |
| 2009/0295769 | A1 | 12/2009 | Yamazaki et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0117991 | A1 | 5/2010 | Koyama et al. |
| 2010/0182282 | A1 | 7/2010 | Kurokawa et al. |
| 2010/0328319 | A1 | 12/2010 | Ikenoue |
| 2011/0019063 | A1* | 1/2011 | Watanabe ............ H01L 27/14603 348/340 |
| 2011/0109591 | A1 | 5/2011 | Kurokawa et al. |
| 2011/0109592 | A1 | 5/2011 | Kurokawa et al. |
| 2012/0032193 | A1 | 2/2012 | Kurokawa et al. |
| 2012/0056861 | A1 | 3/2012 | Kurokawa et al. |
| 2012/0085890 | A1 | 4/2012 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| | | |
|---|---|---|
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Tanaka.K et al., "45.5: A System LCD with Optical Input Function using Infra-Red Backlight Subtraction Scheme,", SID Digest '10 : SID International Symposium Digest of Technical Papers, 2010, pp. 680-683.

Jeon.S et al., "180nm Gate Length Amorphous InGaZnO Thin Film Transistor for High Density Image Sensor Applications,", IEDM 10: Technical Digest of International Electron Devices Meeting, Dec. 6, 2010, pp. 504-507.

Kim.S et al., "A Three-Dimensional Time-of-Flight CMOS Image Sensor With Pinned-Photodiode Pixel Structure,", IEEE Electron Device Letters, Nov. 1, 2010, vol. 31, No. 11, pp. 1272-1274.

Kim.S et al., "A 640×480 Image Sensor with Unified Pixel Architecture for 2D/3D Imaging in 0.11μm CMOS,", 2011 Symposium on VLSI Technology : Digest of Technical Papers, Jun. 15, 2011, pp. 92-93.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350°C ,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of SOL-GEL-Derived Zinc Oxide Films by Irradiation With Ultraviolet Lamp,", Journal of SOL-GEL Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Emplying $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2003, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers,2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000°C ,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of AmorphousOxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

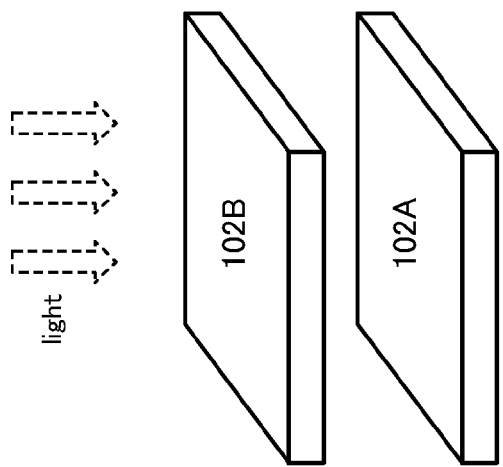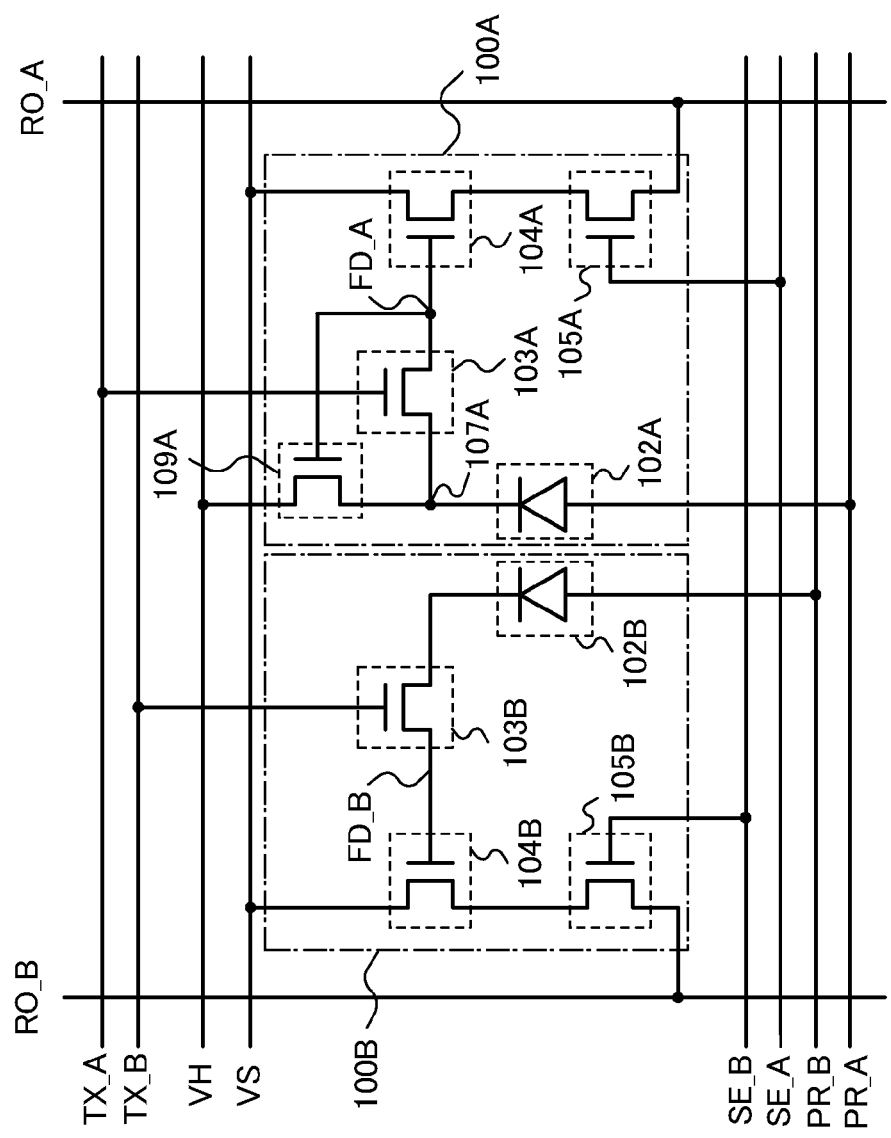
FIG. 8B
FIG. 8A

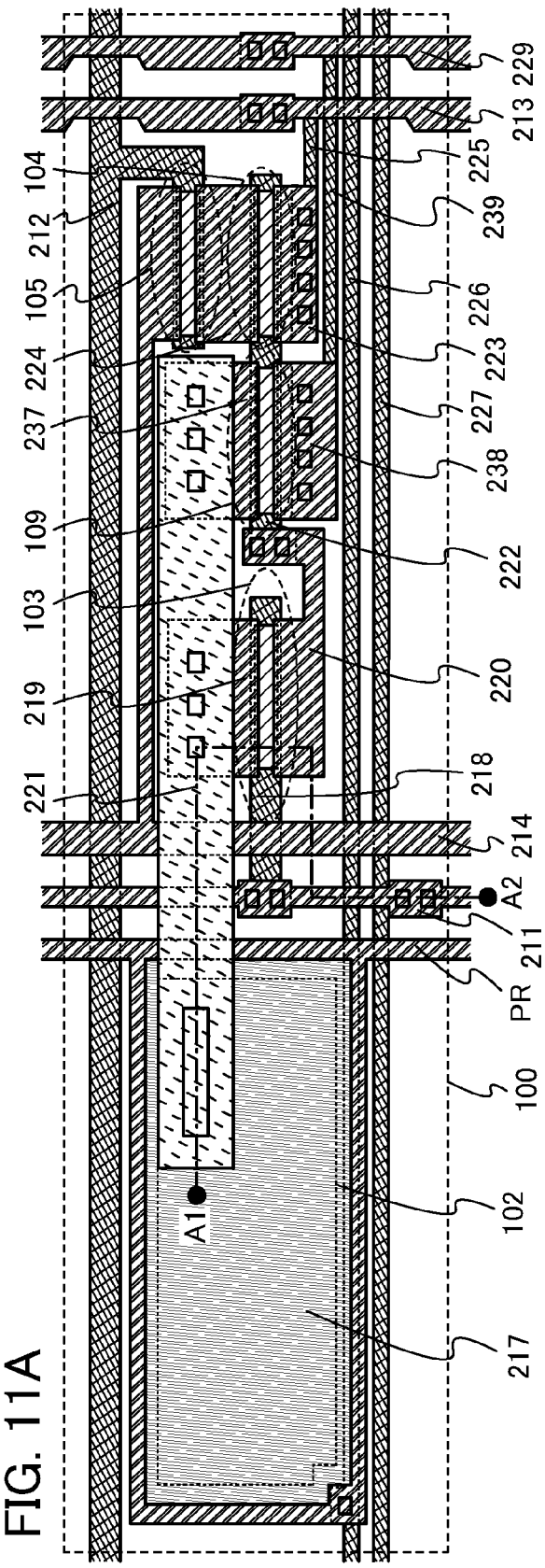
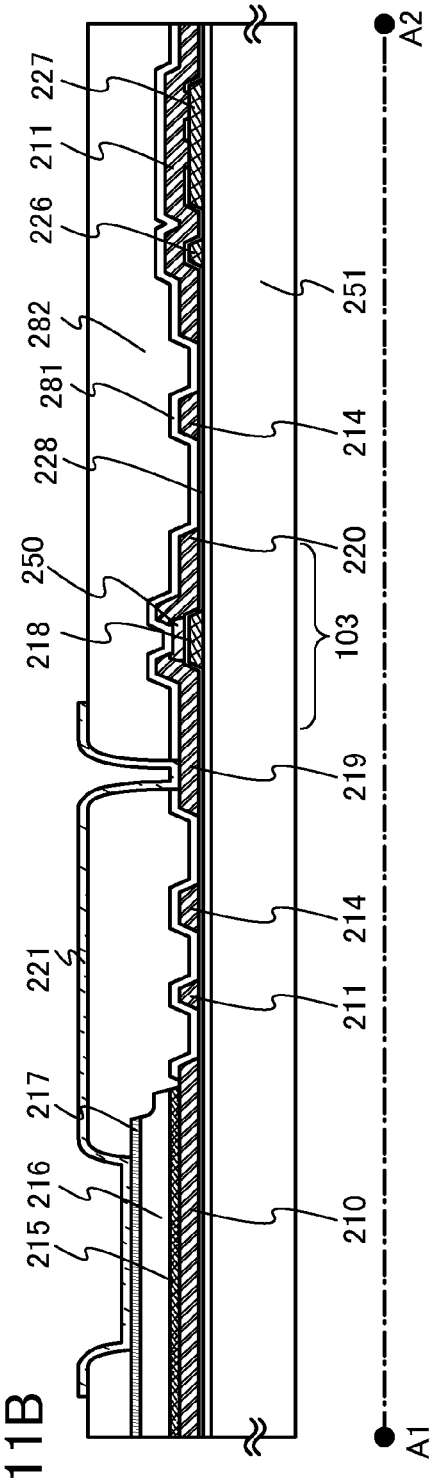
FIG. 11A
FIG. 11B

DISTANCE MEASUREMENT DEVICE AND DISTANCE MEASUREMENT SYSTEM

BACKGROUND OF THE INVENTION

1. Field of the Invention

The present invention relates to a distance measurement device and a distance measurement system each including a photosensor, and particularly to a distance measurement device and a distance measurement system each employing a time-of-flight (TOF) method.

2. Description of the Related Art

There has been increasing interest in three-dimensional distance measurement systems that can detect a distance from a light source to an object with a detection signal dependent on delay in light travel time. Three-dimensional distance measurement systems are expected to have a wide range of applications such as virtual keyboards, information input devices with a gesture recognition function and the like, visual sensors in various robots, security systems, sensors for smart air bags, and sensors for cars.

A TOF method is known as one of methods for measuring a distance. A distance measurement system employing a TOF method obtains a distance between a light source (the distance measurement system) and an object by calculation in such a manner that light is emitted from the light source to the object and, when light reflected by the object reaches a sensor, light travel time delay that occurs between the emitted light and the reflected light is detected. Specifically, a distance x from the light source to the object can be represented by the following formula using light speed c and delay time $\Delta t$.

$$x = \frac{c \times \Delta t}{2}$$

Non-Patent Document 1 discloses a three-dimensional image sensor that measures a distance in a three-dimensional space by performing three-dimensional imaging with a TOF method in such a manner that a period for detecting reflected infrared light is divided into two periods to obtain different detection signals.

In Non-Patent Document 2, two-dimensional imaging and three-dimensional imaging are alternately performed every frame period with the use of the configuration of the sensor in Non-Patent Document 1.

REFERENCE

Non-Patent Document 1: S. J. Kim et al, "A Three-Dimensional Time-of-Flight CMOS Image Sensor With Pinned-Photodiode Pixel Structure", IEEE Electron Device Letters, Vol. 31, No. 11, November 2010, pp. 1272-1274.

Non-Patent Document 2: S. J. Kim et al, "A 640×480 Image Sensor with Unified Pixel Architecture for 2D/3D Imaging in 0.11 µm CMOS", 2011 Symposium on VLSI Circuits Digest of Technical Papers, pp. 92-93.

SUMMARY OF THE INVENTION

An object of one embodiment of the present invention is to provide a distance measurement device with high detection accuracy. Another object of one embodiment of the present invention is to provide a distance measurement system with high detection accuracy.

A distance measurement device of one embodiment of the present invention includes a photosensor. The photosensor performs plural times of detection of reflected light (specifically, light generated when light emitted from a light source is reflected by an object) for plural periods during which the light source emits light to the object or plural periods after the plural times of light emission. By performing detection of reflected light plural times for such periods, distance measurement can be performed with high accuracy.

In the photosensor included in the distance measurement device of one embodiment of the present invention, reflected light is detected by a light-receiving element. The light-receiving element is irradiated with the reflected light in both a period during the light emission and a period after the light emission. The accuracy of detecting the reflected light is sometimes lowered when the potential of an electrode of the light-receiving element is changed by reflected light that is emitted for a period during which detection is not performed. In view of this, in one embodiment of the present invention, the photosensor includes a transistor that suppresses a change in the potential of the electrode of the light-receiving element in a period during which reflected light is not detected. Thus, the light detection accuracy of the distance measurement device or a distance measurement system including the distance measurement device can be prevented from decreasing.

One embodiment of the present invention is a distance measurement device that includes a photosensor including a light-receiving element, a first transistor, and a second transistor; a wiring; a signal line; and a power supply line. The wiring is electrically connected to one electrode of the light-receiving element. The signal line is electrically connected to a gate electrode of the first transistor. The power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other electrode of the light-receiving element and the other of the source electrode and the drain electrode of the second transistor.

Specifically, one embodiment of the present invention is a distance measurement device that includes a photosensor including a light-receiving element, a first transistor, and a second transistor; a wiring; a signal line; a power supply line; and a light source. The wiring is electrically connected to one of electrodes of the light-receiving element. The signal line is electrically connected to a gate electrode of the first transistor. The power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other of the electrodes of the light-receiving element and the other of the source electrode and the drain electrode of the second transistor. The light source performs light emission to an object for a given time T n times (as for "n times" in this specification, n is a natural number of 2 or more). The light-receiving element detects reflected light generated by reflection of light emitted from the light source by the object. The first transistor is on for the given time T or longer for each light emission and is turned off at the same time as end of the light emission. The photosensor outputs a signal corresponding to a distance x between the light source and the object.

Another embodiment of the present invention is a distance measurement system that includes the distance measurement device and a processing unit configured to calculate the distance x using Formula 1.

$$x = \frac{c}{2} \times \left(T - \frac{S1}{n \times k}\right) \quad (1)$$

Note that in Formula 1, S1 represents a voltage of a detection signal corresponding to the amount of change in a potential of the one of the source electrode and the drain electrode of the first transistor after the light emission for the given time T is performed the n times; n, a natural number of 2 or more; c, light speed; and k, a constant.

One embodiment of the present invention is a distance measurement device that includes a photosensor including a light-receiving element, a first transistor, and a second transistor; a wiring; a signal line; a power supply line; and a light source. The wiring is electrically connected to one of electrodes of the light-receiving element. The signal line is electrically connected to a gate electrode of the first transistor. The power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other of the electrodes of the light-receiving element and the other of the source electrode and the drain electrode of the second transistor. The light source performs light emission to an object for a given time n times. The light-receiving element detects reflected light generated by reflection of light emitted from the light source by the object. The first transistor is brought into an on state once for each light emission, and the on state starts at the same time as end of the light emission and terminates after end of detection of the reflected light by the light-receiving element. The photosensor outputs a signal corresponding to a distance x between the light source and the object.

Another embodiment of the present invention is a distance measurement system that includes the distance measurement device and a processing unit configured to calculate the distance x using Formula 2.

$$x = \frac{c \times S2}{2 \times n \times k} \quad (2)$$

Note that in Formula 2, S2 represents a voltage of a detection signal corresponding to the amount of change in a potential of the one of the source electrode and the drain electrode of the first transistor after the light emission for the given time is performed the n times; n, a natural number of 2 or more; c, light speed; and k, a constant.

One embodiment of the present invention is a distance measurement device that includes a first photosensor including a first light-receiving element, a first transistor, and a second transistor; a wiring; a signal line; a power supply line; and a light source. The wiring is electrically connected to one of electrodes of the first light-receiving element. The signal line is electrically connected to a gate electrode of the first transistor. The power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other of the electrodes of the first light-receiving element and the other of the source electrode and the drain electrode of the second transistor. The light source successively performs first light emission to an object for a given time T n times and successively performs second light emission to the object for the given time T the n times. The first light-receiving element detects reflected light generated by reflection of light emitted from the light source by the object. The first transistor is brought into a first on state for the given time T or longer for each first light emission, and the first on state terminates at the same time as end of the first light emission. The first transistor is brought into a second on state once for each second light emission, and the second on state starts at the same time as end of the second light emission and terminates after end of detection of the reflected light by the first light-receiving element. The photosensor outputs a signal corresponding to a distance x between the light source and the object.

Another embodiment of the present invention is a distance measurement system that includes the distance measurement device and a processing unit configured to calculate the distance x using Formula 3.

$$x = \frac{c \times T \times S2}{2 \times (S1 + S2)} \quad (3)$$

Note that in Formula 3, S1 represents a voltage of a detection signal corresponding to the amount of change in a potential of the one of the source electrode and the drain electrode of the first transistor after the first light emission for the given time T is performed the n times; S2, a voltage of a detection signal corresponding to the amount of change in the potential of the one of the source electrode and the drain electrode of the first transistor after the second light emission for the given time T is performed the n times; n, a natural number of 2 or more; and c, light speed.

In the distance measurement device (or the distance measurement system) that calculates the distance between the light source and the object using Formula 3, a second photosensor including a second light-receiving element is preferably provided so that the first photosensor and the second photosensor overlap each other. Providing a plurality of photosensors to overlap each other can reduce the area of the photosensors.

It is particularly preferable that the first light-receiving element and the second light-receiving element overlap each other, that the first light-receiving element absorb light in a first wavelength region and the second light-receiving element absorb light in a second wavelength region, and that one of the first light-receiving element and the second light-receiving element, which is closer to the object than the other is, transmit at least part of light in the wavelength region that the other light-receiving element absorbs.

For example, as one embodiment, the second light-receiving element is closer to the object than the first light-receiving element is, and the first light-receiving element detects (absorbs) infrared light in reflected light and the second light-receiving element detects (absorbs) visible light in the reflected light and transmits infrared light. In this embodiment, for example, the second photosensor can obtain two-dimensional information at the same time as the distance measurement by the first photosensor. The absorption of visible light by the second light-receiving element reduces light other than infrared light (i.e., light serving as noise) emitted to the first light-receiving element, so that the detection accuracy of the first photosensor can be enhanced.

In any of the distance measurement devices (or the distance measurement systems) mentioned above, the wiring is preferably a reset signal line.

Alternatively, in any of the distance measurement devices (or the distance measurement systems) mentioned above, it is preferable that a third transistor be provided so that a gate electrode is electrically connected to a reset signal line, one of a source electrode and a drain electrode is electrically connected to the one of the source electrode and the drain electrode of the first transistor and the gate electrode of the second transistor, and the other thereof is electrically connected to a reset power supply line; and that the wiring be a fixed power supply line.

In any of the distance measurement devices (or the distance measurement systems) mentioned above, a semiconductor layer of the first transistor preferably contains an oxide semiconductor. A semiconductor layer of the second transistor preferably contains an oxide semiconductor. A semiconductor layer of the third transistor preferably contains an oxide semiconductor.

One embodiment of the present invention is a distance measurement device that includes a first photosensor including a first light-receiving element, a first transistor, and a second transistor; a second photosensor that is adjacent to the first photosensor and includes a second light-receiving element, a third transistor, and a fourth transistor; a first wiring and a second wiring; a first signal line and a second signal line; a first power supply line and a second power supply line; and a light source. The first wiring is electrically connected to one of electrodes of the first light-receiving element. The first signal line is electrically connected to a gate electrode of the first transistor. The first power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other of the electrodes of the first light-receiving element and the other of the source electrode and the drain electrode of the second transistor. The second wiring is electrically connected to one of electrodes of the second light-receiving element. The second signal line is electrically connected to a gate electrode of the third transistor. The second power supply line is electrically connected to one of a source electrode and a drain electrode of the fourth transistor. One of a source electrode and a drain electrode of the third transistor is electrically connected to a gate electrode of the fourth transistor. The other of the source electrode and the drain electrode of the third transistor is electrically connected to the other of the electrodes of the second light-receiving element and the other of the source electrode and the drain electrode of the fourth transistor. The light source performs light emission to an object for a given time T n times. The first and second light-receiving elements detect reflected light generated by reflection of light emitted from the light source by the object. The first transistor is brought into an on state for the given time T or longer for each light emission, and the on state terminates at the same time as end of the light emission. The third transistor is brought into an on state once for each light emission, and the on state starts at the same time as end of the light emission and terminates after end of detection of the reflected light by the second light-receiving element. The photosensor outputs a signal corresponding to a distance x between the light source and the object.

Another embodiment of the present invention is a distance measurement system that includes the distance measurement device and a processing unit configured to calculate the distance x using Formula 3.

$$x = \frac{c \times T \times S2}{2 \times (S1 + S2)} \quad (3)$$

Note that in Formula 3, S1 represents a voltage of a detection signal corresponding to the amount of change in a potential of the one of the source electrode and the drain electrode of the first transistor after the light emission for the given time T is performed the n times; S2, a voltage of a detection signal corresponding to the amount of change in the potential of the one of the source electrode and the drain electrode of the third transistor after the light emission for the given time T is performed the n times; n, a natural number of 2 or more; and c, light speed.

In the above distance measurement device (or distance measurement system), the first wiring is preferably a first reset signal line, and the second wiring is preferably a second reset signal line.

Alternatively, the above distance measurement device (or distance measurement system) preferably includes a fifth transistor and a sixth transistor. A gate electrode of the fifth transistor is electrically connected to a first reset signal line. One of a source electrode and a drain electrode of the fifth transistor is electrically connected to the one of the source electrode and the drain electrode of the first transistor and the gate electrode of the second transistor. The other of the source electrode and the drain electrode of the fifth transistor is electrically connected to a first reset power supply line. A gate electrode of the sixth transistor is electrically connected to a second reset signal line. One of a source electrode and a drain electrode of the sixth transistor is electrically connected to the one of the source electrode and the drain electrode of the third transistor and the gate electrode of the fourth transistor. The other of the source electrode and the drain electrode of the sixth transistor is electrically connected to a second reset power supply line. Moreover, it is preferable that the first wiring be a first fixed power supply line and the second wiring be a second fixed power supply line.

In any of the distance measurement devices (or the distance measurement systems) mentioned above, a semiconductor layer of the first transistor preferably contains an oxide semiconductor. A semiconductor layer of the second transistor preferably contains an oxide semiconductor. A semiconductor layer of the third transistor preferably contains an oxide semiconductor. A semiconductor layer of the fourth transistor preferably contains an oxide semiconductor.

According to one embodiment of the present invention, a distance measurement device with high detection accuracy can be provided. Moreover, according to one embodiment of the present invention, a distance measurement system with high detection accuracy can be provided.

BRIEF DESCRIPTION OF THE DRAWINGS

In the accompanying drawings:

FIGS. 8A and 8B illustrate an example of a photosensor;

FIGS. 11A and 11B are a top view and a cross-sectional view of a photosensor;

DETAILED DESCRIPTION OF THE INVENTION

Figure 1A:
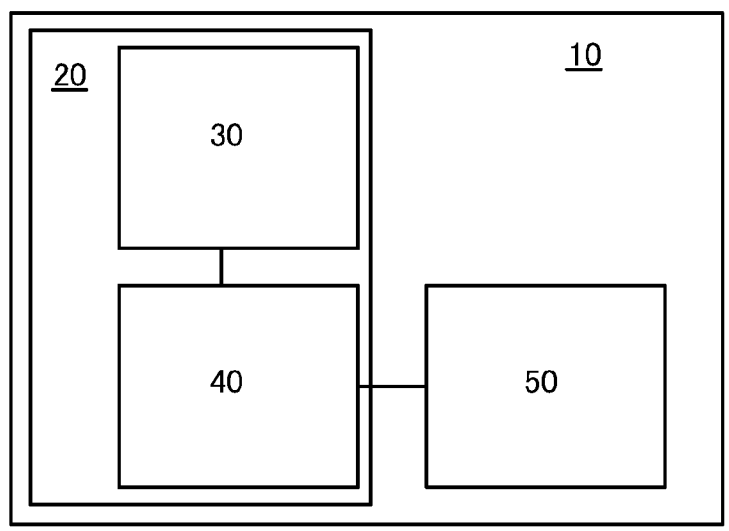
FIGS. 1A and 1B illustrate examples of a distance measurement system and a photosensor.

Embodiments will be described in detail with reference to the accompanying drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

First, FIG. 1A illustrates a distance measurement system in one embodiment of the present invention. A distance measurement system 10 illustrated in FIG. 1A includes a distance measurement device 20 that includes at least one photosensor 30 and at least one read circuit 40, and a processing unit 50. In the distance measurement system 10, a signal output from the photosensor 30 is input to the processing unit 50 through the read circuit 40. Based on the signal, the processing unit 50 calculates a distance between the photosensor 30 and an object.

The processing unit 50 includes processors that perform arithmetic operation, such as a central processing unit (CPU) and a digital signal processor (DSP), a memory that stores a program for arithmetic operation, and the like.

In this embodiment, a distance measurement device (or a distance measurement system) of one embodiment of the present invention and a distance measurement method using the distance measurement device (or the distance measurement system) will be described with reference to FIG. 1B, FIGS. 2A and 2B, FIG. 3, and FIG. 4. The distance measurement device (or the distance measurement system) of one embodiment of the present invention can measure distance with a TOF method.

The distance measurement device of one embodiment of the present invention includes a photosensor including a light-receiving element, a first transistor, and a second transistor; a wiring; a signal line; and a power supply line.

In the distance measurement device, the wiring is electrically connected to one electrode of the light-receiving element. The signal line is electrically connected to a gate electrode of the first transistor. The power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other electrode of the light-receiving element and the other of the source electrode and the drain electrode of the second transistor.

In one embodiment of the present invention, the light source emits light for a given time to an object plural times (n times, where n is a natural number of 2 or more), and the photosensor detects reflected light (specifically, light generated when light emitted from the light source is reflected by the object) in a period during or after the light emission, as many times as the light emission (n times). By performing light emission and reflected-light detection plural times, a detection signal based on the distance can be obtained with high accuracy, so that a more accurate distance can be calculated. Note that the light source may be included in the distance measurement device of one embodiment of the present invention or may be provided separately.

In the photosensor included in the distance measurement device of one embodiment of the present invention, reflected light is detected by the light-receiving element. The light-receiving element is irradiated with the reflected light for both a period during which the light source emits light and a period after the light emission. The accuracy of detecting reflected light is lowered in some cases when the potential of the other electrode of the light-receiving element is changed by irradiation with reflected light in a period during which detection is not performed. The photosensor, however, includes the second transistor that suppresses a change in the potential of the other electrode of the light-receiving element in a period during which reflected light is not detected. Thus, a distance measurement device that can measure distance with high accuracy (and also a distance measurement system that can measure distance with high accuracy) can be provided.

<Configuration of Photosensor>

Figure 1B:
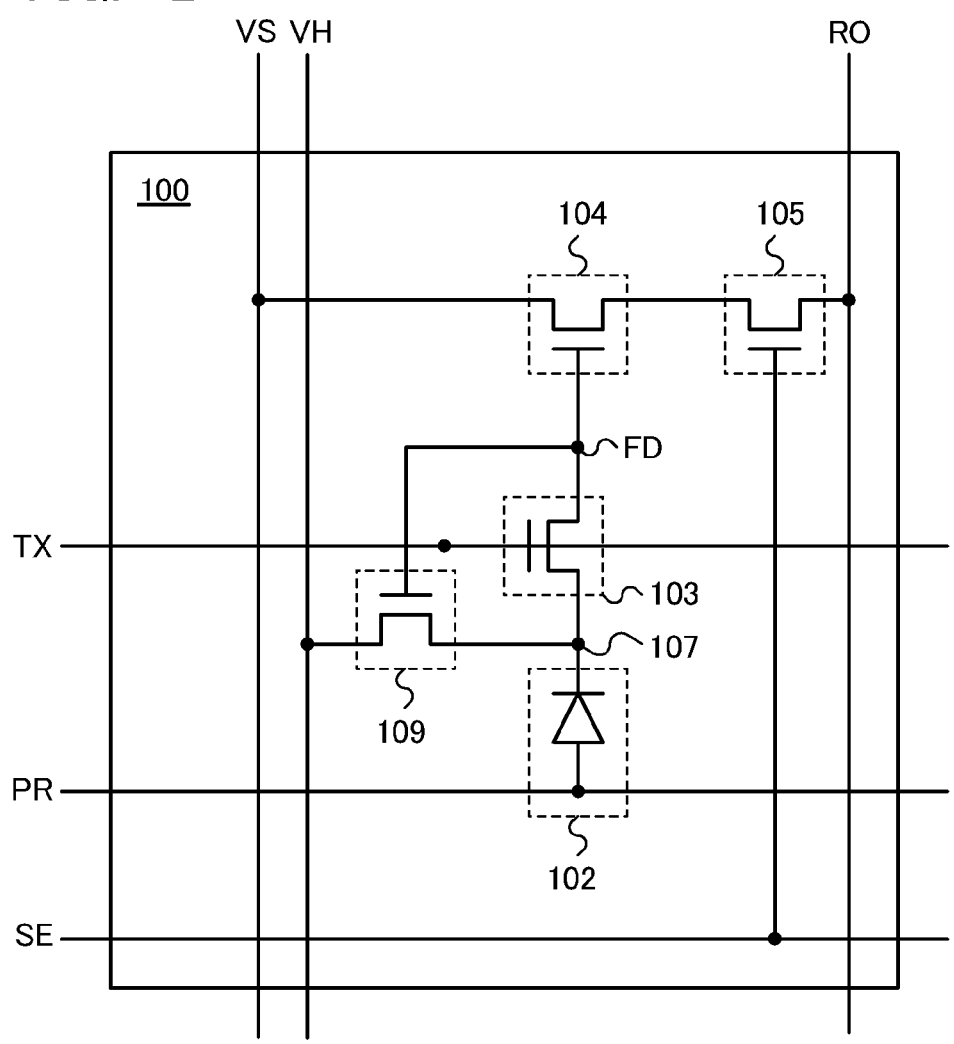

FIG. 1B is a circuit diagram of a photosensor 100 included in the distance measurement device of one embodiment of the present invention.

The photosensor 100 illustrated in FIG. 1B includes a photodiode 102, a transistor 103, a transistor 104, a transistor 105, and a transistor 109.

One electrode of the photodiode 102 is electrically connected to a reset signal line PR. The other electrode of the photodiode 102 is electrically connected to the other of a source electrode and a drain electrode of the transistor 103 and the other of a source electrode and a drain electrode of the transistor 109. In this specification and the like, a node to which the other electrode of the photodiode 102, the other of the source electrode and the drain electrode of the transistor 103, and the other of the source electrode and the drain electrode of the transistor 109 are connected is represented by a node 107.

A gate electrode of the transistor 103 is electrically connected to an accumulation signal line TX. One of the source electrode and the drain electrode of the transistor 103 is electrically connected to a gate electrode of the transistor 104 and a gate electrode of the transistor 109. In this specification and the like, a node to which one of the source electrode and the drain electrode of the transistor 103, the gate electrode of the transistor 104, and the gate electrode of the transistor 109 are connected is represented by a charge retention node FD.

One of a source electrode and a drain electrode of the transistor 104 is electrically connected to a photosensor reference signal line VS. The other of the source electrode and the drain electrode of the transistor 104 is electrically connected to one of a source electrode and a drain electrode of the transistor 105.

A gate electrode of the transistor 105 is electrically connected to a selection signal line SE. The other of the source electrode and the drain electrode of the transistor 105 is electrically connected to a photosensor output signal line RO.

One of the source electrode and the drain electrode of the transistor 109 is electrically connected to a power supply line VH.

Note that in FIG. 1B, an anode of the photodiode 102 is electrically connected to the reset signal line PR and a cathode thereof is electrically connected to the other of the source electrode and the drain electrode of the transistor 103; however, one embodiment of the present invention is not limited to this structure. The cathode of the photodiode 102 may be electrically connected to the reset signal line PR, and the anode thereof may be electrically connected to the other of the source electrode and the drain electrode of the transistor 103.

When a reverse bias is applied to the photodiode 102, which is a light-receiving element, i.e., when a potential higher than the potential of the anode is applied to the cathode of the photodiode 102, the photodiode 102 generates a current corresponding to the amount of received light. Thus, a photocurrent flows through the photodiode 102 when the photodiode 102 detects reflected light. There is no limitation on a photodiode used in the photosensor 100, and a PIN photodiode, a PN photodiode, or the like can be used.

The charge retention node FD holds charge that varies depending on a current that is generated by the photodiode 102 in accordance with the amount of received light. The charge retention node FD may be electrically connected to a storage capacitor in order to hold charge more reliably.

By the transistor 103 serving as a switching element, the operation is switched between accumulation of charge in the charge retention node FD by the photodiode 102 and retention of charge by the charge retention node FD.

The off-state current of the transistor 103 is preferably low in order for the charge retention node FD to achieve long-term retention of charge generated when light is emitted to the photodiode 102. For example, the off-state current of the transistor 103 can be low when amorphous silicon, microcrystalline silicon, an oxide semiconductor, or the like is used for a semiconductor layer of the transistor 103. The off-state current of the transistor 103 can be extremely low particularly when an oxide semiconductor is used for the semiconductor layer.

The mobility of the transistor 103 is preferably high in order for the charge retention node FD to accumulate the charge that is generated by light emitted to the photodiode 102, in a short time. The mobility of the transistor 103 can be high, for example, when an oxide semiconductor, polycrystalline silicon, single crystal silicon, or the like is used for the semiconductor layer.

From the above, it is particularly preferable to use an oxide semiconductor for the semiconductor layer of the transistor 103 because the transistor 103 can have both extremely low off-state current and high mobility.

The transistor 104 serving as an amplifier element converts a voltage of the charge retention node FD into a current between the photosensor reference signal line VS and the photosensor output signal line RO in accordance with the potential of the charge retention node FD. The transistor 104 preferably has high on-state current and high mobility; a semiconductor layer of the transistor 104 can be formed using an oxide semiconductor, a silicon material, or the like and, in particular, is preferably formed using a silicon material such as polycrystalline silicon or single crystal silicon. High on-state current or high mobility of the transistor 104 results in a high amplification factor, so that even a minute potential difference of the charge retention node FD, that is, even a minute difference in light emitted to the photodiode 102 can be detected.

The transistor 105 controls an output of the photosensor 100. The transistor 105 preferably has high on-state current and high mobility; a semiconductor layer of the transistor 105 can be formed using an oxide semiconductor, a silicon material, or the like and, in particular, is preferably formed using a silicon material such as polycrystalline silicon or single crystal silicon. High on-state current or high mobility of the transistor 105 results in high driving capability of the photosensor output signal line RO, so that the speed of reading an output of the photosensor can be increased.

When the transistor 103 is off, the transistor 109 keeps a potential difference between the gate electrode and the other of the source electrode and the drain electrode less than the threshold voltage. The potential of the gate electrode of the transistor 109 is equal to the potential of the charge retention node FD. The potential of the other of the source electrode and the drain electrode of the transistor 109 is equal to the potential of the node 107. By keeping the above potential difference less than the threshold voltage while the transistor 103 is off, the potential of the charge retention node FD and the potential of the node 107 are maintained at substantially equal values. Consequently, adverse effect of light except in a period for detecting reflected light can be suppressed when reflected-light detection described later is repeated plural times; thus, the distance from a light source (the distance measurement device or a distance measurement system) to an object can be measured without lowering the position detection accuracy. The off-state current of the transistor 109 is preferably low in order to prevent injection of unnecessary current between the power supply line VH and the node 107. For this reason, a semiconductor layer of the transistor 109 is preferably formed using amorphous silicon, microcrystalline silicon, an oxide semiconductor, or the like.

Note that the transistors 103 and 109, which preferably have low off-state current, are preferably formed using the same material. For example, the fabrication process can be simplified when an oxide semiconductor is used for the semiconductor layers of the transistors 103 and 109 and the transistors 103 and 109 are formed using the same material through the same steps. For a similar reason, the transistors 104 and 105, which preferably have high on-state current and high mobility, are preferably formed with the same structure using the same material.

The reset signal line PR is a signal line for controlling initialization of the potential of the charge retention node FD. The accumulation signal line TX is a signal line for controlling the transistor 103. The photosensor reference signal line VS is a power supply wiring. The selection signal line SE is a signal line for controlling the transistor 105. The power supply line VH is a power supply wiring. The photosensor output signal line RO is an output wiring for outputting a signal corresponding to the amount of charge accumulated in the photodiode 102.

Figure 2A:
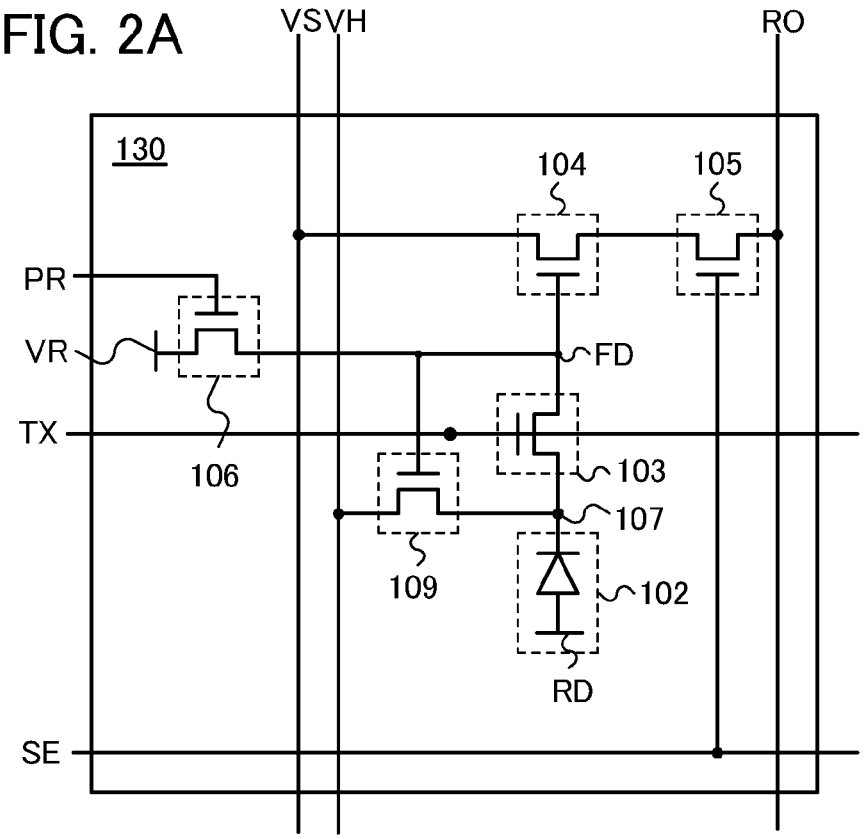
FIGS. 2A and 2B illustrate examples of a photosensor and a read circuit.

FIG. 2A is a circuit diagram of a photosensor 130 that can be used in one embodiment of the present invention.

The photosensor 130 illustrated in FIG. 2A includes the photodiode 102, the transistor 103, the transistor 104, the transistor 105, a transistor 106, and the transistor 109.

One electrode of the photodiode 102 is electrically connected to a fixed power supply line RD. The other electrode of the photodiode 102 is electrically connected to the other of the source electrode and the drain electrode of the transistor 103 and the other of the source electrode and the drain electrode of the transistor 109.

A gate electrode of the transistor 106 is electrically connected to the reset signal line PR. One of a source electrode and a drain electrode of the transistor 106 is electrically connected to one of the source electrode and the drain electrode of the transistor 103, the gate electrode of the transistor 104, and the gate electrode of the transistor 109. The other of the source electrode and the drain electrode of the transistor 106 is electrically connected to a reset power supply line VR. The transistor 106 controls initialization of the potential of the charge retention node FD. The off-state current of the transistor 106 is preferably low in order to prevent injection of unnecessary current from the reset power supply line VR to the charge retention node FD. For this reason, a semiconductor layer of the transistor 106 is preferably formed using amorphous silicon, microcrystalline silicon, an oxide semiconductor, or the like.

Note that in FIG. 2A, the anode of the photodiode 102 is electrically connected to the fixed power supply line RD and the cathode thereof is electrically connected to the other of the source electrode and the drain electrode of the transistor 103; however, one embodiment of the present invention is not limited to this structure. The cathode of the photodiode 102 may be electrically connected to the fixed power supply line RD, and the anode thereof may be electrically connected to the other of the source electrode and the drain electrode of the transistor 103.

<Configuration of Read Circuit>

Figure 2B:
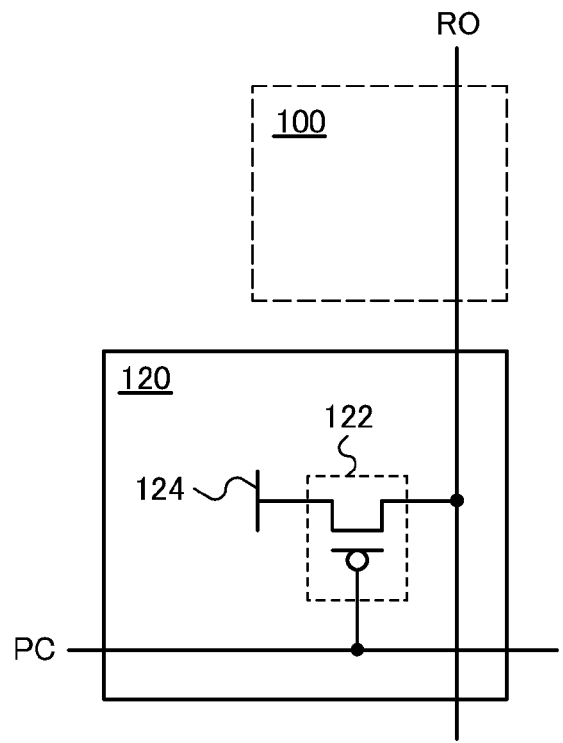

FIG. 2B illustrates a circuit diagram of a read circuit 120 included in the distance measurement device of one embodiment of the present invention. There is no particular limitation on the configuration of the read circuit included in the distance measurement device of one embodiment of the present invention. FIG. 2B illustrates an example where the read circuit includes one p-channel transistor.

Specifically, the read circuit 120 has a transistor 122. A gate electrode of the transistor 122 is electrically connected to a precharge signal line PC. One of a source electrode and a drain electrode of the transistor 122 is electrically connected to a power supply wiring 124, and the other thereof is electrically connected to the photosensor output signal line RO.

Note that one read circuit 120 can be provided, for example, for one photosensor 100 or for one photosensor output signal line RO (i.e., for a plurality of photosensors that shares one photosensor output signal line RO).

<Distance Measurement Method>

The description is made on a distance measurement method using the distance measurement device (or the distance measurement system) of one embodiment of the present invention. A distance measurement method using a distance measurement device (or a distance measurement system) including a light source and the photosensor 100 (see FIG. 1B) will be described below.

For easy understanding of the operation of the photosensor 100, it is assumed in timing charts that the reset signal line PR, the accumulation signal line TX, the selection signal line SE, and the photosensor output signal line RO are supplied with a high-level potential and a low-level potential. Specifically, the reset signal line PR is supplied with a high-level potential HPR and a low-level potential LPR. The accumulation signal line TX is supplied with a high-level potential HTX and a low-level potential LTX. The selection signal line SE is supplied with a high-level potential HSE and a low-level potential LSE. The photosensor output signal line RO is supplied with a high-level potential HRO and a low-level potential LRO.

A high-level pulse of emitted light 151 represents a pulse in a period during which light is emitted from a light source, and a low-level pulse of the emitted light 151 represents a pulse in a period during which light is not emitted. A high-level pulse of reflected light 152 represents a pulse in a period during which the photodiode 102 is irradiated with reflected light, and a low-level pulse of the reflected light 152 represents a pulse in a period during the photodiode 102 is not irradiated with reflected light. Note that the intensity of light emitted from the light source is constant.

[Distance Measurement Method 1]

Figure 3:
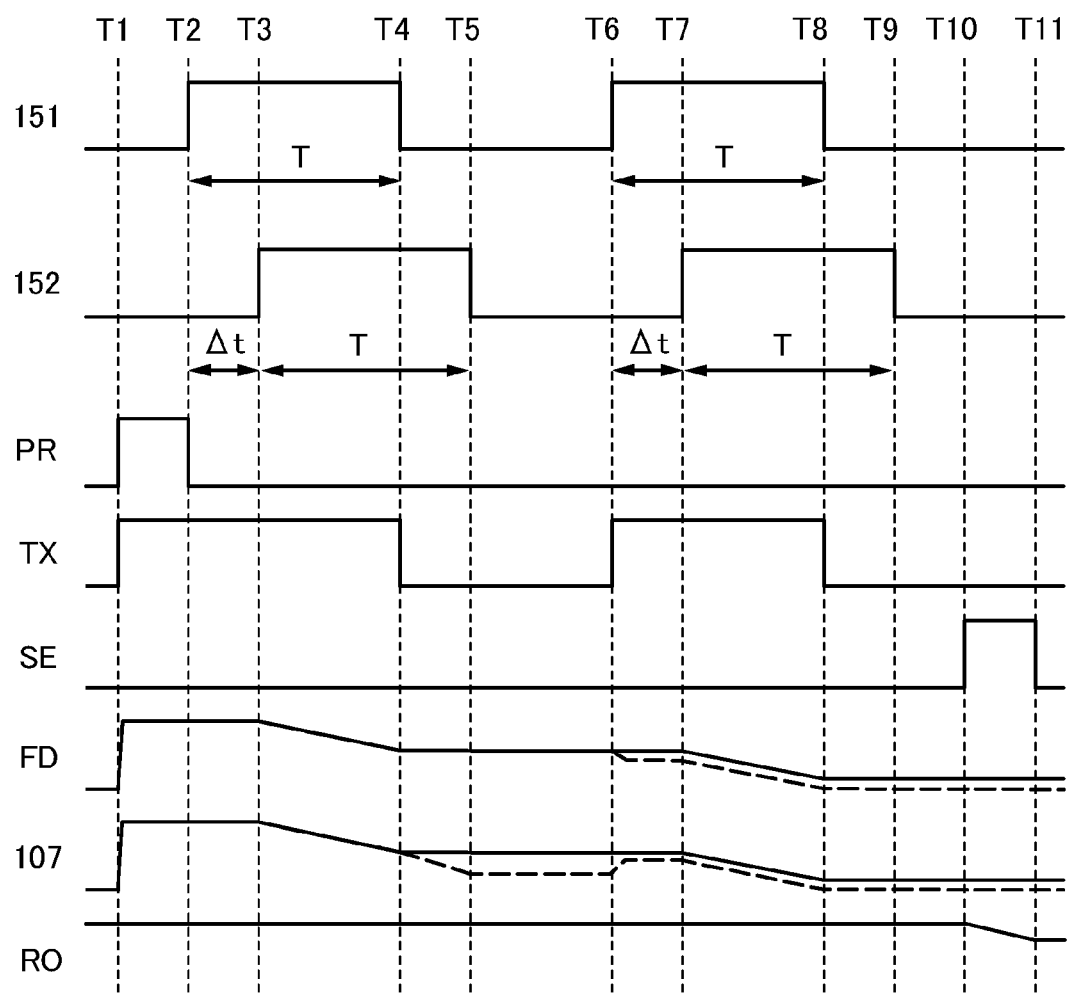
FIG. 3 illustrates an example of a timing chart of a photosensor.

FIG. 3 illustrates an example of a timing chart of the emitted light 151, which is emitted from the light source, the reflected light 152 that is generated by reflection of the emitted light 151 by an object, and the photosensor 100.

In the distance measurement method 1, the distance measurement device of one embodiment of the present invention performs light emission from the light source to the object for a given time T twice (n=2), detects reflected light for a period during which light is emitted, and obtains a voltage S1 of a detection signal that depends on the light delay time. Specifically, first light emission (A) and first reflected-light detection (A) are performed for a period between the time T2 and the time T4 (for the given time T); second light emission (A) and second reflected-light detection (A) are performed for a period between the time T6 and the time T8 (for the given time T); and the voltage S1 of a detection signal is obtained between the time T10 and the time T11. Note that the number of times of light emission (A) and reflected-light detection (A) is not limited to two and may be three or more.

Light emission periods of plural times of light emission (A) are the same in length (i.e., the length of each light emission period is the given time T). Moreover, the one light emission period of emitted light and one light emission period of reflected light are the same in length (i.e., the length of each of the periods is the given time T).

In plural times of light emission (A), the distance between the light source and the object is assumed not to change. That is, a period between the time T2 and the time T3 and a period between the time T6 and the time T7 are the same in length (denoted by a delay time Δt); each of these periods is a period between a time at which emitted light starts to be emitted from the light source and a time at which the light reflected by the object enters the photosensor.

Note that reflected-light detection (A) starts before the reflected light enters the photosensor, and ends at the same time as the end of light emission (A). The potentials of the reset signal line PR and the accumulation signal line TX are controlled so that the timing of reflected-light detection (A) is determined as above.

(Time T1 to Time T2: Reset Operation)

At the time T1, the potential of the reset signal line PR changes from the potential LPR to the potential HPR and the potential of the accumulation signal line TX changes from the potential LTX to the potential HTX, whereby the photodiode 102 and the transistor 103 are turned on. The potential HPR of the reset signal line PR is supplied to the charge retention node FD, so that charge held in the charge retention node FD is reset and charge for setting the charge retention node FD in an initial state is held. Note that at the time T1, the potential LSE is supplied to the selection signal line SE.

(Time T2 to Time T4: First Light Emission (A) and First Reflected-Light Detection (A))

At the time T2, light starts to be emitted to the object from the light source, and the potential of the reset signal line PR changes from the potential HPR to the potential LPR. Here, the potential of the accumulation signal line TX is kept at the potential HTX; thus, a reverse-bias voltage is applied to the photodiode 102 when the potential of the reset signal line PR becomes the potential LPR.

At the time T3, light emitted from the light source is reflected by the object, and the reflected light starts to enter the distance measurement device of one embodiment of the present invention. The photodiode 102 to which a reverse-bias voltage is being applied is irradiated with reflected light, whereby a current flows from the cathode to the anode of the photodiode 102, and the potential of the charge retention node FD decreases. In a given period of time, as the intensity of the reflected light is higher, the amount of charge flowing from the charge retention node FD becomes larger (the degree of decrease in the potential of the charge retention node FD becomes larger). In addition, with a given intensity, as the emission time of reflected light is longer, the amount of charge flowing from the charge retention node FD becomes larger (the degree of decrease in the potential of the charge retention node FD becomes larger).

At the time T4, light emission ends, and the potential of the accumulation signal line TX changes from the potential HTX to the potential LTX. Setting the potential of the accumulation signal line TX at the potential LTX turns off the transistor 103. Accordingly, the transfer of charge from the charge retention node FD to the photodiode 102 stops, so that the potential of the charge retention node FD is determined.

Note that when the potential of the accumulation signal line TX changes from the potential HTX to the potential LTX, the potential of the charge retention node FD is sometimes changed by parasitic capacitance between the accumulation signal line TX and the charge retention node FD. If the potential of the charge retention node FD is largely changed, the charge retention node FD cannot accurately hold a potential corresponding to a photocurrent generated in the photodiode 102. Accordingly, it is preferable to take measures to reduce adverse effect of parasitic capacitance (e.g., by reducing capacitance between the gate electrode and the source/drain electrode of the transistor 103 or by connecting a storage capacitor to the charge retention node FD). The photosensor 100 of one embodiment of the present invention takes such measures, so that a change in the potential of the charge retention node FD due to parasitic capacitance is negligible.

At the time T5, the reflected light stops entering the photodiode 102.

Here, between the time T4 and the time T5, the potential of the charge retention node FD is constant because the transistor 103 is off, whereas the potential of the node 107 decreases because the photodiode 102 is irradiated with the reflected light (see a dotted line representing a pulse at the node 107 in FIG. 3). When a potential difference is generated between the node 107 and the charge retention node FD, at the time T6 at which the transistor 103 is turned on next time, the potential of the charge retention node FD decreases and the potential of the node 107 increases so that the potentials of the node 107 and the charge retention node FD become equal to each other (see dotted lines representing pulses at the node 107 and the charge retention node FD in FIG. 3). If the potentials of the node 107 and the charge retention node FD are largely changed, the charge retention node FD cannot accurately hold a potential corresponding to a photocurrent generated in the photodiode 102 during the first reflected-light detection (A). As a result, it becomes difficult to measure distance accurately in the distance measurement device or a distance measurement system including the distance measurement device (i.e., the position detection accuracy is lowered).

Note that the distance measurement device of one embodiment of the present invention includes the transistor 109. When the transistor 103 is off, the transistor 109 keeps a potential difference between the gate electrode and the other of the source electrode and the drain electrode less than the threshold voltage. The potential of the gate electrode of the transistor 109 is equal to the potential of the charge retention node FD, and the potential of the other of the source electrode and the drain electrode of the transistor 109 is equal to the potential of the node 107, thereby suppressing a decrease in the potential of the node 107 and an increase in the potential difference between the node 107 and the charge retention node FD. Consequently, in the distance measurement device (or the distance measurement system) of one embodiment of the present invention, the decrease in the position detection accuracy can be suppressed, and distance measurement with high accuracy can be performed.

Note that a change in the potential of the node 107 between the time T4 and the time T5 is less than the threshold voltage of the transistor 109; therefore, the threshold voltage of the transistor 109 is preferably as close as 0 and is most preferably 0. Moreover, a change in the potential of the node 107 between the time T4 and the time T5 can be further suppressed as the subthreshold characteristics of the transistor 109 are more favorable. Note that acceptable threshold voltage and subthreshold characteristics of the transistor 109 are determined by the capacitance of the charge retention node FD, the intensity of reflected light, the detection accuracy of the photodiode 102, or the like, and thus can be determined by a practitioner as appropriate.

In this specification and the like, light emitted to the photodiode 102 substantially refers to reflected light generated when light emitted from a light source is reflected by an object. The intensity of the reflected light is much higher than that of external light, for example. Even if external light with intensity higher than or equal to that of the reflected light is temporarily emitted to the photodiode 102 between the period T4 and the period T6, a change in the potential of the node 107 due to adverse effect of the external light and a change in the potential of the charge retention node FD can be suppressed because the distance measurement device of one embodiment of the present invention includes the transistor 109.

(Time T6 to Time T8: Second Light Emission (A) and Second Reflected-Light Detection (A))

At the time T6, light starts to be emitted to the object from the light source, and the potential of the accumulation signal line TX changes from the potential LTX to the potential HTX.

At the time T7, light emitted from the light source is reflected by the object, and the reflected light starts to enter the distance measurement device of one embodiment of the present invention. The photodiode 102 is irradiated with reflected light, whereby a current flows from the cathode to the anode of the photodiode 102, and the potential of the charge retention node FD decreases.

At the time T8, light emission ends, and the potential of the accumulation signal line TX changes from the potential HTX to the potential LTX. Setting the potential of the accumulation signal line TX at the potential LTX turns off the transistor 103. Accordingly, the transfer of charge from the charge retention node FD to the photodiode 102 stops, so that the potential of the charge retention node FD is determined.

Note that the potential of the charge retention node FD is constant after the time T8. The potential of the charge retention node FD at the time T8 depends on a photocurrent generated in the photodiode 102 in the first reflected-light detection (A) and the second reflected-light detection (A) (which refer to a period between the time T2 and the time T4 and a period between the time T6 and the time T8 and are hereinafter collectively referred to as a reflected-light detection period (A)). Further, an output signal of the photosensor 100 is determined in accordance with the potential of the charge retention node FD at the time T8.

At the time T9, the reflected light stops entering the photodiode 102.

(Time T10 to Time T11: Read Operation)

At the time T10, the potential of the selection signal line SE changes from the potential LSE to the potential HSE, so that the transistor 105 is turned on. Thus, electrical continuity is established between the photosensor reference signal line VS and the photosensor output signal line RO through the transistor 104 and the transistor 105. Then, the potential of the photosensor output signal line RO becomes close to the potential of the photosensor reference signal line VS at a speed depending on the potential of the charge retention node FD. Note that before the time T10, the potential of the photosensor output signal line RO is set at the high-level potential HRO in advance.

At the time T11, the potential of the selection signal line SE changes from the potential HSE to the potential LSE, so that the transistor 105 is turned off and the potential of the photosensor output signal line RO is determined.

The potential of the photosensor output signal line RO at the time T11 depends on the speed of change in the potential of the photosensor output signal line RO between the time T10 and the time T11. The speed of change in the potential of the photosensor output signal line RO depends on a current between the source electrode and the drain electrode of the transistor 104, that is, the intensity and emission time of the reflected light emitted to the photodiode 102 in the reflected-light detection period (A). In a given period of time, as the intensity of the reflected light is higher, the speed of change in the potential of the photosensor output signal line RO becomes lower. In addition, with a given intensity, as the emission time of the reflected light is longer, the speed of change in the potential of the photosensor output signal line RO becomes lower. As the speed of change in the potential of the photosensor output signal line RO is lower, the potential of the photosensor output signal line RO at the time T11 becomes higher.

Here, the description is made on the relation between change in the potential of the charge retention node FD and change in the potential of the photosensor output signal line RO. In the reflected-light detection period (A), as the intensity of the reflected light emitted to the photodiode 102 is higher, the change in the potential of the charge retention node FD becomes larger (the potential of the charge retention node FD at the time T8 becomes lower). At this time, the channel resistance of the transistor 104 increases, so that the speed of change in the potential of the photosensor output signal line RO becomes low. Thus, the change in the potential of the photosensor output signal line RO is small (the potential of the photosensor output signal line RO at the time T11 is high).

By obtaining the potential of the photosensor output signal line RO at the time T11, the amount of the reflected light emitted to the photodiode 102 (the product of the intensity of the reflected light and time) in the reflected-light detection period (A) can be obtained as the voltage S1 of a detection signal. Here, as described above, the intensity of light emitted from the light source is constant and light emitted to the photodiode 102 during reflected-light detection all refers to reflected light generated by reflection of light emitted from the light source by an object; therefore, the potential of the photosensor output signal line RO at the time T11 is substantially proportional to the length of the reflected-light detection period (A).

Next, the description is made on a method for measuring distance with a TOF method in the distance measurement system of one embodiment of the present invention, and specifically a method for measuring a distance to an object from the distance measurement device (or the distance measurement system) of one embodiment of the present invention by using the voltage S1 of a detection signal that depends on the light delay time obtained in the reflected-light detection period (A).

The voltage S1 of a detection signal can be represented by Formula (1-1) by using the number of times n of performing light emission and reflected-light detection, a constant k, a given time T, and a delay time Δt. A distance x from the light source (the distance measurement device or the distance measurement system) to an object can be represented by Formula (1-2) by using the light speed c and the delay time Δt. From these two formulae, the distance x can be represented by Formula (1-3) using the voltage S1 of the detection signal.

$$S1 = n \times k \times (T - \Delta t) \quad (1\text{-}1)$$

$$x = \frac{c \times \Delta t}{2} \quad (1\text{-}2)$$

$$x = \frac{c}{2} \times \left(T - \frac{S1}{n \times k}\right) \quad (1\text{-}3)$$

Note that the number of times n of performing light emission and reflected-light detection is a natural number of 2 or more; as an example, n is 2 in this embodiment. The constant k includes information on the intensity and wavelength of light emitted from the light source, the sensitivity (photocurrent characteristics and spectral sensitivity) of the photodiode 102, the transmittance of the photosensor 100 (attenuation factor of light delivered to the photodiode 102 in the sensor), the amplification factor of the photosensor 100, the reflectance of the object, the attenuation factor of light in air, and the like. In this embodiment, the constant k is obtained in advance before the distance to the object is measured.

For example, the distance to the object is measured to obtain the voltage S1 of a detection signal while the distance between the object and the distance measurement device (or the distance measurement system) is found; thus, the constant k can be obtained by using Formula (1-3).

Alternatively, light detection may be performed by the photosensor 100 to obtain a voltage S0 of a detection signal in a period before the time T1 or after the time T11 during which light emission is not performed and reflected light is not emitted. When a voltage S1' of a detection signal that is obtained by subtracting the voltage S0 of the detection signal from the voltage S1 of the detection signal is used instead of the voltage S1 of the detection signal in Formula (1-3), adverse effect of external light is eliminated and thus distance measurement with high accuracy can be performed.

As described above, distance measurement with high accuracy can be performed by using the distance measurement device in one embodiment of the present invention. Moreover, a distance measurement system that performs distance measurement with high accuracy can be provided.

[Distance Measurement Method 2]

Figure 4:
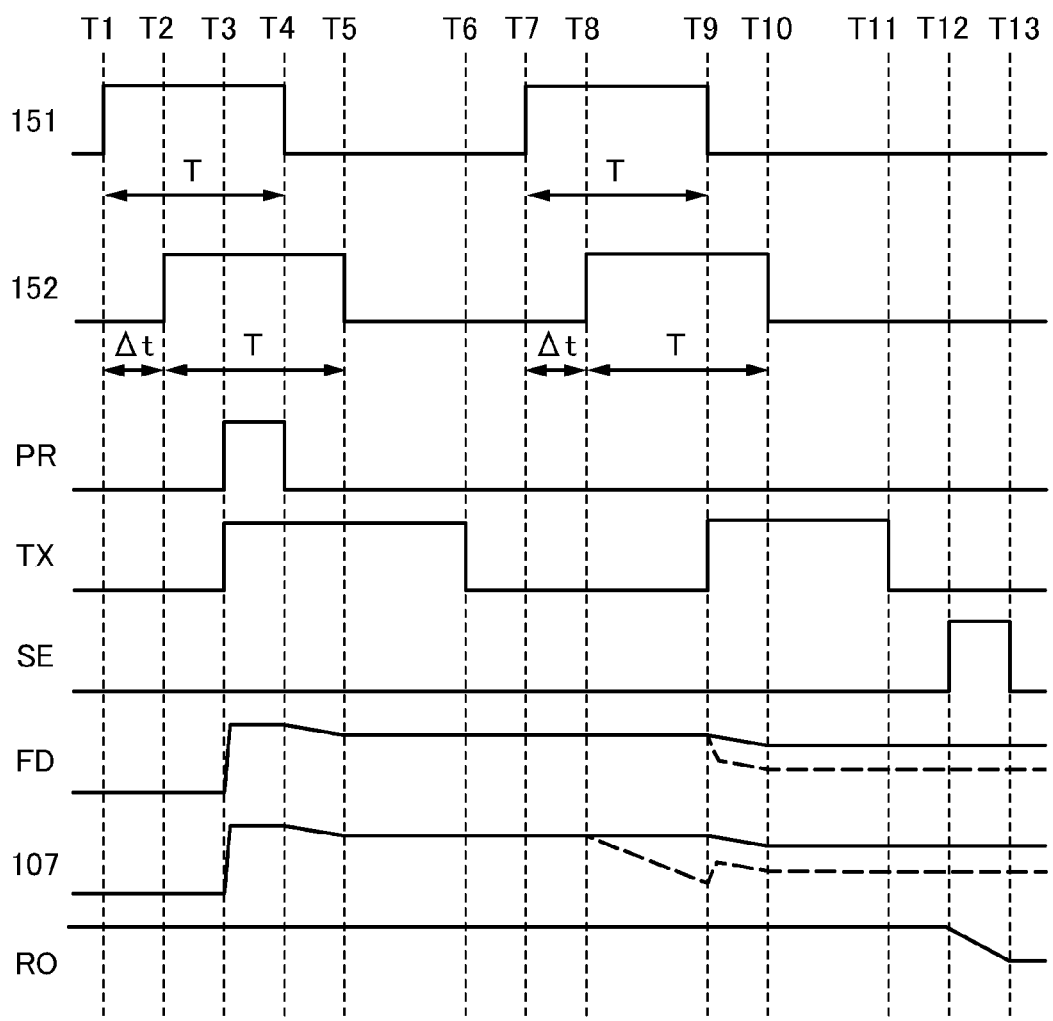
FIG. 4 illustrates an example of a timing chart of a photosensor.

FIG. 4 illustrates another example of a timing chart of the emitted light 151, the reflected light 152, and the photosensor 100.

In the distance measurement method 2, the distance measurement device of one embodiment of the present invention performs light emission (B) from the light source to the object for a given time T twice, detects reflected light for a period after the light emission (B), and obtains a voltage S2 of a detection signal that depends on the light delay time. Specifically, first light emission (B) is performed for a period between the time T1 and the time T4 (for the given time T); first reflected-light detection (B) is performed for a period between the time T4 and the time T6; second light emission (B) is performed for a period between the time T7 and the time T9 (for the given time T); second reflected-light detection (B) is performed for a period between the time T9 and the time T11; and the voltage S2 of a detection signal is obtained between the time T12 and the time T13. Note that the number of times of light emission (B) and reflected-light detection (B) is not limited to two and may be three or more.

Light emission periods of plural times of light emission (B) are the same in length (i.e., the length of each light emission period is the given time T). Moreover, one light emission period of emitted light and one light emission period of reflected light are the same in length (i.e., the length of each of the periods is the given time T).

In plural times of light emission (B), the distance between the light source and the object is assumed not to change. That is, a period between the time T1 and the time T2 and a period between the time T7 and the time T8 are the same in length (denoted by a delay time Δt); each of these periods is a period between a time at which emitted light starts to be emitted from the light source and a time at which the light reflected by the object enters the photosensor.

Note that reflected-light detection (B) starts at the same time as the end of light emission (B), and ends after the end of emission of reflected light to the photosensor. The potentials of the reset signal line PR and the accumulation signal line TX are controlled so that the timing of reflected-light detection (B) is determined as above.

(Time T1 to Time T4: First Light Emission (B))

At the time T1, light emission from the light source to the object starts. Here, the reset signal line PR is supplied with the potential LPR, the accumulation signal line TX is supplied with the potential LTX, and the selection signal line SE is supplied with the potential LSE.

At the time T2, light emitted from the light source is reflected by the object, and the reflected light starts to enter the distance measurement device of one embodiment of the present invention.

(Time T3 to Time T4: Reset Operation)

At the time T3, the potential of the reset signal line PR changes from the potential LPR to the potential HPR and the potential of the accumulation signal line TX changes from the potential LTX to the potential HTX, whereby the photodiode 102 and the transistor 103 are turned on. The potential HPR of the reset signal line PR is supplied to the charge retention node FD, so that charge held in the charge retention node FD is reset and charge for setting the charge retention node FD in an initial state is held.

(Time T4 to Time T6: First Reflected-Light Detection (B))

At the time T4, light emission ends, and the potential of the reset signal line PR changes from the potential HPR to the potential LPR. Here, the potential of the accumulation signal line TX is kept at the potential HTX; thus, a reverse-bias voltage is applied to the photodiode 102 when the potential of the reset signal line PR becomes the potential LPR. The photodiode 102 to which a reverse-bias voltage is being applied is irradiated with reflected light, whereby a current flows from the cathode to the anode of the photodiode 102, and the potential of the charge retention node FD decreases.

At the time T5, reflected light stops entering the photodiode 102, so that the transfer of charge from the charge retention node FD to the photodiode 102 stops, and the potential of the charge retention node FD is determined.

At the time T6, the potential of the accumulation signal line TX changes from the potential HTX to the potential LTX. Setting the potential of the accumulation signal line TX at the potential LTX turns off the transistor 103.

(Time T7 to Time T9: Second Light Emission (B))

At the time T7, light emission from the light source to the object starts.

At the time T8, light emitted from the light source is reflected by the object, and the reflected light starts to enter the distance measurement device of one embodiment of the present invention.

Here, between the time T8 and the time T9, the potential of the charge retention node FD is constant because the transistor 103 is off, whereas the potential of the node 107 decreases because the photodiode 102 is irradiated with the reflected light (see a dotted line representing a pulse at the node 107 in FIG. 4). When a potential difference is generated between the node 107 and the charge retention node FD, at the time T9 at which the transistor 103 is turned on next time, the potential of the charge retention node FD decreases and the potential of the node 107 increases so that the potentials of the node 107 and the charge retention node FD become equal to each other (see dotted lines representing pulses at the node 107 and the charge retention node FD in FIG. 4). If the potentials of the node 107 and the charge retention node FD are largely changed, the charge retention node FD cannot accurately hold a potential corresponding to a photocurrent generated in the photodiode 102 during the first reflected-light detection (B). As a result, it becomes difficult to measure distance accurately in the distance measurement device or a distance measurement system including the distance measurement device (i.e., the position detection accuracy is lowered).

Note that the distance measurement device of one embodiment of the present invention includes the transistor 109. When the transistor 103 is off, the transistor 109 keeps a potential difference between the gate electrode and the other of the source electrode and the drain electrode less than the threshold voltage. The potential of the gate electrode of the transistor 109 is equal to the potential of the charge retention node FD, and the potential of the other of the source electrode and the drain electrode of the transistor 109 is equal to the potential of the node 107, thereby suppressing a decrease in the potential of the node 107 and an increase in the potential difference between the node 107 and the charge retention node FD. Consequently, adverse effect of light except in a period during which reflected light is detected can be eliminated in the distance measurement device of one embodiment of the present invention, so that the decrease in the position detection accuracy can be suppressed and distance measurement with high accuracy can be performed.

Note that a change in the potential of the node 107 between the time T8 and the time T9 is less than the threshold voltage of the transistor 109; therefore, the threshold voltage of the transistor 109 is preferably as close as 0 and is most preferably 0. Moreover, a change in the potential of the node 107 between the time T8 and the time T9 can be further suppressed as the subthreshold characteristics of the transistor 109 are more favorable. Note that acceptable threshold voltage and subthreshold characteristics of the transistor 109 are determined by the capacitance of the charge retention node FD, the intensity of reflected light, the detection accuracy of the photodiode 102, or the like, and thus can be determined by a practitioner as appropriate.

As described, in this specification and the like, light emitted to the photodiode 102 substantially refers to reflected light generated when light emitted from the light source is reflected by the object. Even if external light with intensity higher than or equal to that of the reflected light is temporarily emitted to the photodiode 102 between the period T6 and the period T9, a change in the potential of the node 107 due to adverse effect of the external light and a change in the potential of the charge retention node FD can be suppressed because the distance measurement device of one embodiment of the present invention includes the transistor 109.

(Time T9 to Time T11: Second Reflected-Light Detection (B))

At the time T9, light emission ends, and the potential of the accumulation signal line TX changes from the potential LTX to the potential HTX. The photodiode 102 to which a reverse-bias voltage is being applied is irradiated with reflected light, whereby a current flows from the cathode to the anode of the photodiode 102, and the potential of the charge retention node FD decreases.

At the time T10, reflected light stops entering the photodiode 102, so that the transfer of charge from the charge retention node FD to the photodiode 102 stops, and the potential of the charge retention node FD is determined.

At the time T11, the potential of the accumulation signal line TX changes from the potential HTX to the potential LTX. Setting the potential of the accumulation signal line TX at the potential LTX turns off the transistor 103.

Note that the potential of the charge retention node FD is constant after the time T11. The potential of the charge retention node FD at the time T11 depends on a photocurrent generated in the photodiode 102 in the first reflected-light detection (B) and the second reflected-light detection (B) (which refer to a period between the time T4 and the time T6 and a period between the time T9 and the time T11 and are hereinafter collectively referred to as a reflected-light detection period (B)). Further, an output signal of the photosensor 100 is determined in accordance with the potential of the charge retention node FD at the time T11. Note that it can be said in this embodiment that the potential of the charge retention node FD is constant after the time T10 because the reflected light stops entering the photodiode 102 at the time T10.

(Time T12 to Time T13: Read Operation)

At the time T12, the potential of the selection signal line SE changes from the potential LSE to the potential HSE, so that the transistor 105 is turned on. Thus, electrical continuity is established between the photosensor reference signal line VS and the photosensor output signal line RO through the transistor 104 and the transistor 105. Then, a signal is output to the photosensor output signal line RO from the photosensor reference signal line VS in accordance with the potential of the charge retention node FD. Note that before the time T12, the potential of the photosensor output signal line RO is set at the high-level potential HRO in advance.

At the time T13, the potential of the selection signal line SE changes from the potential HSE to the potential LSE; thus, the transistor 105 is turned off, the transfer of charge from the photosensor reference signal line VS to the photosensor output signal line RO stops, and the potential of the photosensor output signal line RO is determined.

The potential of the photosensor output signal line RO at the time T13 depends on the speed of change in the potential of the photosensor output signal line RO between the time T12 and the time T13. The speed of change in the potential of the photosensor output signal line RO depends on a current between the source electrode and the drain electrode of the transistor 104, that is, the intensity and emission time of the reflected light emitted to the photodiode 102 in the reflected-light detection period (B).

Therefore, by obtaining the potential of the photosensor output signal line RO at the time T13, the amount of the reflected light emitted to the photodiode 102 (the product of the intensity of the reflected light and time) in the reflected-light detection period (B) can be obtained as the voltage S2 of a detection signal. Here, as described above, the intensity of light emitted from the light source is constant and light emitted to the photodiode 102 during reflected-light detection all refers to reflected light generated by reflection of light emitted from the light source by an object; therefore, the potential of the photosensor output signal line RO at the time T13 is substantially proportional to the length of the reflected-light detection period (B).

Next, the description is made on a method for measuring distance with a TOF method in the distance measurement system of one embodiment of the present invention, and specifically a method for measuring a distance to an object from the distance measurement device (or the distance measurement system) of one embodiment of the present invention by using the voltage S2 of a detection signal that depends on the light delay time obtained in the reflected-light detection period (B).

The voltage S2 of a detection signal can be represented by Formula (2-1) by using the number of times n of performing light emission and reflected-light detection, a constant k, and a delay time $\Delta t$. A distance x from the light source (the distance measurement device or the distance measurement system) to an object can be represented by Formula (2-2) by using the light speed c and the delay time $\Delta t$. From these two formulae, the distance x can be represented by Formula (2-3) using the voltage S2 of the detection signal.

$$S2 = n \times k \times \Delta t \quad (2\text{-}1)$$

$$x = \frac{c \times \Delta t}{2} \quad (2\text{-}2)$$

$$x = \frac{c \times S2}{2 \times n \times k} \quad (2\text{-}3)$$

Note that the number of times n of performing light emission and reflected-light detection is a natural number of 2 or more; as an example, n is 2 in this embodiment. The constant k includes information similar to that described above for Formula (1-1) and, in this embodiment, is obtained in advance before the distance to the object is measured.

Alternatively, light detection may be performed by the photosensor 100 to obtain the voltage S0 of a detection signal in a period before the time T1 or after the time T13 during which light emission is not performed and reflected light is not emitted. When a voltage S2' of a detection signal that is obtained by subtracting the voltage S0 of the detection signal from the voltage S2 of the detection signal is used instead of the voltage S2 of the detection signal in Formula (2-3), adverse effect of external light is eliminated and thus distance measurement with high accuracy can be performed.

As described above, distance measurement with high accuracy can be performed by using the distance measurement device in one embodiment of the present invention. In addition, a distance measurement system that performs distance measurement with high accuracy can be provided.

The structure described in this embodiment can be used in appropriate combination with the structure described in any of the other embodiments.

Embodiment 2

In this embodiment, a distance measurement method using the distance measurement system of one embodiment of the present invention will be described with reference to FIG. 5. A distance measurement method using the distance measurement device including a light source and the photosensor 100 (see FIG. 1B) will be described below.

The constant k needs to be obtained in advance in order to find the distance from the light source (the distance measurement device or the distance measurement system) to an object by using the distance measurement method described in Embodiment 1. On the other hand, the distance measurement method in this embodiment allows a distance to be obtained even if the constant k is unknown.

[Distance Measurement Method 3]

Figure 5:
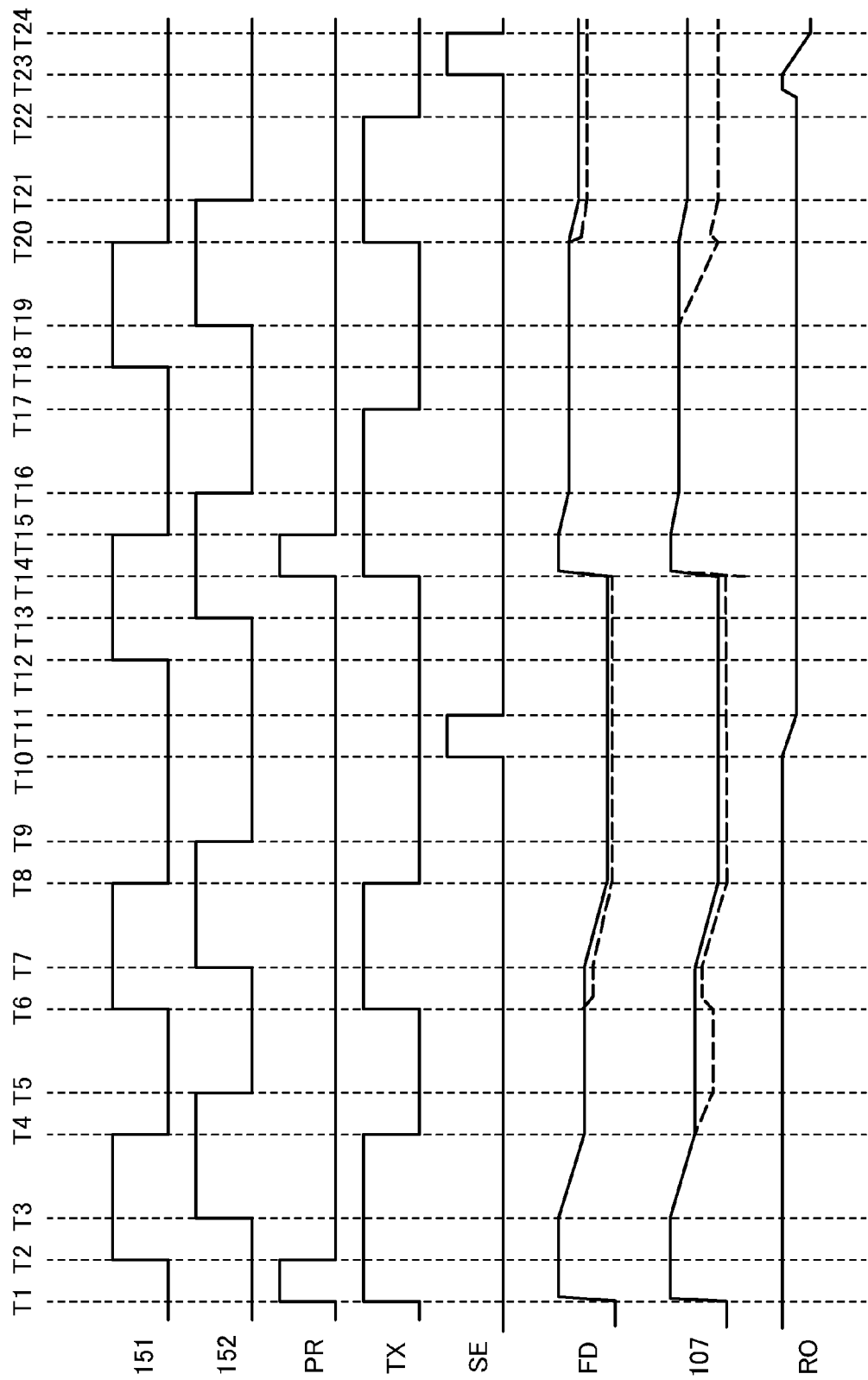
FIG. 5 illustrates an example of a timing chart of a photosensor.

FIG. 5 illustrates an example of a timing chart of the emitted light 151, the reflected light 152, and the photosensor 100.

In the distance measurement method 3, the distance measurement device of one embodiment of the present invention performs light emission (A) from the light source to the object for a given time T twice, detects reflected light for a period during which light emission (A) is performed, and obtains the voltage S1 of a detection signal that depends on the light delay time. Then, the distance measurement device performs light emission (B) from the light source to the object for the given time T twice, detects reflected light for a period after light emission (B), and obtains the voltage S2 of the detection signal that depends on the light delay time.

Specifically, first light emission (A) and first reflected-light detection (A) are performed for a period between the time T2 and the time T4 (for the given time T). Second light emission (A) and second reflected-light detection (A) are performed for a period between the time T6 and the time T8 (for the given time T). The voltage S1 of a detection signal is obtained between the time T10 and the time T11. First light emission (B) is performed for a period between the time T12 and the time T15 (for the given time T). First reflected-light detection (B) is performed for a period between the time T15 and the time T17. Second light emission (B) is performed for a period between the time T18 and the time T20 (for the given time T). Second reflected-light detection (B) is performed for a period between the time T20 and the time T22. The voltage S2 of the detection signal is obtained between the time T23 and the time T24. Note that the number of times of light emission (A) and (B) and reflected-light detection (A) and (B) is not limited to two and may be three or more.

Light emission periods of plural times of light emission (A) and light emission (B) are the same in length (i.e., the length of each light emission period is the given time T). Moreover, one light emission period of emitted light and one light emission period of reflected light are the same in length (i.e., the length of each of the periods is the given time T).

In plural times of light emission (A) and light emission (B), the distance between the light source and the object is assumed not to change. That is, a period between the time T2 and the time T3, a period between the time T6 and the time T7, a period between the time T12 and the time T13, and a period between the time T18 and the time T19 are the same in length (denoted by a delay time Δt); each of these periods is a period between a time at which emitted light starts to be emitted from the light source and a time at which the light reflected by the object enters the photosensor.

Note that reflected-light detection (A) starts before the reflected light enters the photosensor, and ends at the same time as the end of light emission (A). Further, reflected-light detection (B) starts at the same time as the end of light emission (B), and ends after emission of reflected light to the photodiode 102 ends. The potentials of the reset signal line PR and the accumulation signal line TX are controlled so that the timings of reflected-light detection (A) and reflected-light detection (B) are determined as above.

(Time T1 to Time T11: Obtainment of Voltage S1 of Detection Signal)

Between the time T1 and the time T11, the voltage S1 of a detection signal is obtained by a method similar to the distance measurement method 1 (the time T1 to the time T11) of Embodiment 1. Embodiment 1 can be referred to for the details.

(Time T12 to Time T24: Obtainment of Voltage S2 of Detection Signal)

Between the time T12 and the time T24, the voltage S2 of the detection signal is obtained by a method similar to the distance measurement method 2 (the time T1 to the time T13) of Embodiment 1. Embodiment 1 can be referred to for the details.

Here, there is no limitation on the order of obtaining the voltage S1 of the detection signal and the voltage S2 of the detection signal in the distance measurement method 3. For example, it is possible that the voltage S2 of the detection signal is obtained between the time T1 and the time T13 by a method similar to the distance measurement method 2, and then the voltage S1 of the detection signal is obtained between the time T14 and the time T24 by a method similar to the distance measurement method 1.

Note that this embodiment shows an example where a period during which reflected light is emitted to the photodiode 102 after light emission (B) (a period between the time T15 and the time T16 and a period between the time T20 and the time T21, i.e., time Δt) is shorter than a period during which light emission (A) is performed and reflected light is emitted to the photodiode 102 (a period between the time T3 and the time T4 and a period between the time T7 and the time T8, i.e., time (T−Δt)). Thus, a potential change of the charge retention node FD in the time Δt is smaller than that in the time (T−Δt). Moreover, the potential of the photosensor output signal line RO at the time T24 is lower than that at the time T11.

Next, the description is made on a method for measuring distance with a TOF method in the distance measurement system of one embodiment of the present invention, and specifically a method for measuring a distance to an object from the distance measurement device (or the distance measurement system) of one embodiment of the present invention by using the voltage S1 and the voltage S2 of detection signals that depend on the light delay times obtained in the reflected-light detection periods (A) and (B).

As shown in Embodiment 1, the voltage S1 of the detection signal can be represented by Formula (3-1) by using the number of times n of performing light emission and reflected-light detection, a constant k, a given time T, and a delay time Δt, and the voltage S2 of the detection signal can be represented by Formula (3-2) by using the number of times n of performing light emission and reflected-light detection, a constant k, and a delay time Δt. A distance x from the light source (the distance measurement device or the distance measurement system) to an object can be represented by Formula (3-3) by using the light speed c and the delay time Δt. From these three formulae, the distance x can be represented by Formula (3-4) using the voltage S1 and the voltage S2 of the detection signals.

$$S1 = n \times k \times (T - \Delta t) \quad (3\text{-}1)$$

$$S2 = n \times k \times \Delta t \quad (3\text{-}2)$$

$$x = \frac{c \times \Delta t}{2} \quad (3\text{-}3)$$

$$x = \frac{c \times T \times S2}{2 \times (S1 + S2)} \quad (3\text{-}4)$$

Note that the number of times n of performing light emission and reflected-light detection is a natural number of 2 or more; as an example, n is 2 in this embodiment. The constant k includes information similar to that described above for Formula (1-1). As shown by Formula (3-4), the distance measurement method in this embodiment allows the distance x to be obtained even when the constant k is unknown.

Alternatively, light detection may be performed by the photosensor 100 to obtain the voltage S0 of a detection signal in a period before the time T1 or after the time T24 during which light emission is not performed and reflected light is not emitted. When the voltage S1' and the voltage S2' of a detection signal that is obtained by subtracting the voltage S0 of the detection signal from the voltage S1 and the voltage S2, respectively, of the detection signals is used instead of the voltage S1 and the voltage S2 of the detection signals, adverse effect of external light is eliminated and thus distance measurement with high accuracy can be performed.

As described above, distance measurement with high accuracy can be performed by using the distance measurement device in one embodiment of the present invention. Moreover, a distance measurement system that performs distance measurement with high accuracy can be provided.

Embodiment 3

In this embodiment, a distance measurement device (or a distance measurement system) of one embodiment of the present invention and a distance measurement method using the distance measurement device (or the distance measurement system) will be described with reference to FIG. 6 and FIG. 7. The distance measurement device (or the distance measurement system) of one embodiment of the present invention can measure distance with a TOF method.

The distance measurement device of one embodiment of the present invention includes a first photosensor including a first light-receiving element, a first transistor, and a second transistor; a second photosensor that is adjacent to the first photosensor and includes a second light-receiving element, a third transistor, and a fourth transistor; a first wiring and a second wiring; a first signal line and a second signal line; and a first power supply line and a second power supply line. It is particularly preferable that the first light-receiving element and the second light-receiving element be adjacent to each other.

The first wiring is electrically connected to one electrode of the first light-receiving element. The first signal line is electrically connected to a gate electrode of the first transistor. The first power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other electrode of the first light-receiving element and the other of the source electrode and the drain electrode of the second transistor. The second wiring is electrically connected to one electrode of the second light-receiving element. The second signal line is electrically connected to a gate electrode of the third transistor. The second power supply line is electrically connected to one of a source electrode and a drain electrode of the fourth transistor. One of a source electrode and a drain electrode of the third transistor is electrically connected to a gate electrode of the fourth transistor. The other of the source electrode and the drain electrode of the third transistor is electrically connected to the other electrode of the second light-receiving element and the other of the source electrode and the drain electrode of the fourth transistor.

In one embodiment of the present invention, a light source emits light to an object for a given time plural times (n times, where n is a natural number of 2 or more); the first photosensor detects reflected light (specifically, light generated when light emitted from the light source is reflected by the object) for a period during the light emission, as many times as the light emission (n times); and the second photosensor adjacent to the first photosensor detects reflected light for a period after the light emission, as many times as the light emission (n times). In this case, the first photosensor and the second photosensor detect light reflected by substantially the same point of the object. By performing light emission and reflected-light detection plural times, a detection signal based on the distance can be obtained with high accuracy, so that a more accurate distance can be calculated.

The constant k needs to be obtained in advance in order to find the distance from the light source (the distance measurement device or the distance measurement system) to an object by using the distance measurement method described in Embodiment 1. On the other hand, the distance measurement method in this embodiment allows a distance to be obtained even if the constant k is unknown.

In the distance measurement method described in Embodiment 2, by using one light emission, reflected light is detected in one of a period during the light emission and a period after the light emission. In addition, it is necessary that the distance between the light source and the object does not change in light emission (A) and light emission (B). On the other hand, two adjacent photosensors are used in the distance measurement method in this embodiment; thus, by using one light emission, reflected light can be detected in both a period during the light emission and a period after the light emission. Therefore, by the distance measurement method in this embodiment, the distance to the object can be measured in a shorter time than by the distance measurement method in Embodiment 2. As a result, the decrease in the position detection accuracy can be suppressed even when the object is a moving object, for example.

In the photosensor included in the distance measurement device of one embodiment of the present invention, reflected light is detected by the light-receiving element. The light-receiving element is irradiated with the reflected light for both a period during which the light source emits light and a period after the light emission. The accuracy of detecting reflected light is lowered in some cases when the potential of the other electrode of the light-receiving element is changed by irradiation with reflected light in a period during which detection is not performed. The photosensor, however, includes the transistor that suppresses a change in the potential of the other electrode of the light-receiving element in a period during which reflected light is not detected. Thus, a distance measurement device (or a distance measurement system) that can measure distance with high accuracy can be provided.

<Configuration of Photosensors>

Figure 6:
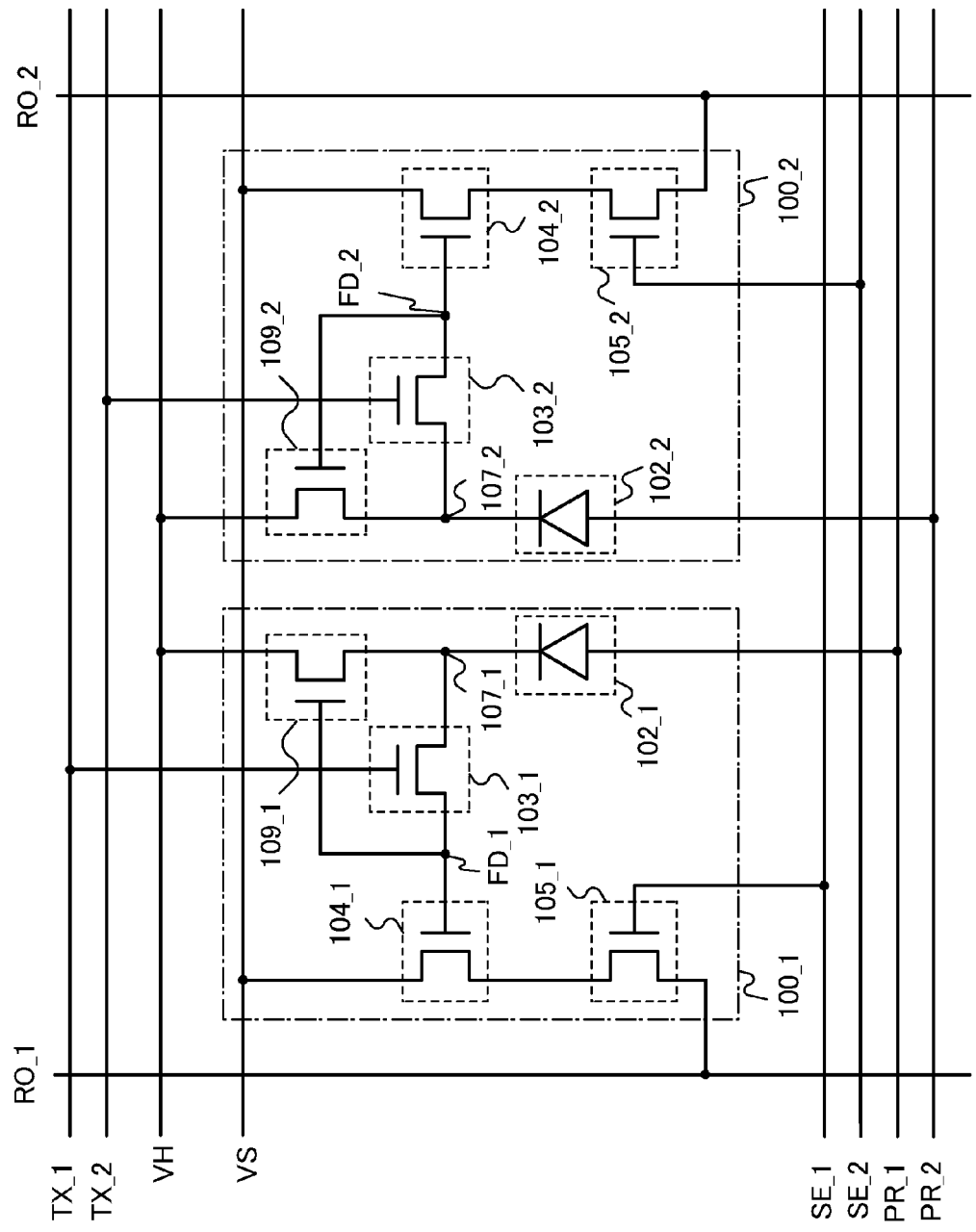
FIG. 6 illustrates an example of a photosensor.

FIG. 6 is a circuit diagram of a first photosensor 100_1 and a second photosensor 100_2 included in the distance measurement device of one embodiment of the present invention.

The first photosensor 100_1 illustrated in FIG. 6 includes a photodiode 102_1, a transistor 103_1, a transistor 104_1, a transistor 105_1, and a transistor 109_1.

One electrode of the photodiode 102_1 is electrically connected to a reset signal line PR_1. The other electrode of the photodiode 102_1 is electrically connected to the other of a source electrode and a drain electrode of the transistor 103_1 and the other of a source electrode and a drain electrode of the transistor 109_1. In this specification and the like, a node to which the other electrode of the photodiode 102_1, the other of the source electrode and the drain electrode of the transistor 103_1, and the other of the source electrode and the drain electrode of the transistor 109_1 are connected is represented by a node 107_1.

A gate electrode of the transistor 103_1 is electrically connected to an accumulation signal line TX_1. One of the source electrode and the drain electrode of the transistor 103_1 is electrically connected to a gate electrode of the transistor 104_1 and a gate electrode of the transistor 109_1. In this specification and the like, a node to which one of the source electrode and the drain electrode of the transistor 103_1, the gate electrode of the transistor 104_1, and the gate electrode of the transistor 109_1 are connected is represented by a charge retention node FD_1.

One of a source electrode and a drain electrode of the transistor 104_1 is electrically connected to the photosensor reference signal line VS. The other of the source electrode and the drain electrode of the transistor 104_1 is electrically connected to one of a source electrode and a drain electrode of the transistor 105_1.

A gate electrode of the transistor 105_1 is electrically connected to a selection signal line SE_1. The other of the source electrode and the drain electrode of the transistor 105_1 is electrically connected to a photosensor output signal line RO_1.

One of the source electrode and the drain electrode of the transistor 109_1 is electrically connected to the power supply line VH.

The second photosensor 100_2 illustrated in FIG. 6 includes a photodiode 102_2, a transistor 103_2, a transistor 104_2, a transistor 105_2, and a transistor 109_2.

One electrode of the photodiode 102_2 is electrically connected to a reset signal line PR_2. The other electrode of the photodiode 102_2 is electrically connected to the other of a source electrode and a drain electrode of the transistor 103_2 and the other of a source electrode and a drain electrode of the transistor 109_2. In this specification and the like, a node to which the other electrode of the photodiode 102_2, the other of the source electrode and the drain electrode of the transistor 103_2, and the other of the source electrode and the drain electrode of the transistor 109_2 are connected is represented by a node 107_2.

A gate electrode of the transistor 103_2 is electrically connected to an accumulation signal line TX_2. One of the source electrode and the drain electrode of the transistor 103_2 is electrically connected to a gate electrode of the transistor 104_2 and a gate electrode of the transistor 109_2. In this specification and the like, a node to which one of the source electrode and the drain electrode of the transistor 103_2, the gate electrode of the transistor 104_2, and the gate electrode of the transistor 109_2 are connected is represented by a charge retention node FD_2.

One of a source electrode and a drain electrode of the transistor 104_2 is electrically connected to the photosensor reference signal line VS. The other of the source electrode and the drain electrode of the transistor 104_2 is electrically connected to one of a source electrode and a drain electrode of the transistor 105_2.

A gate electrode of the transistor 105_2 is electrically connected to a selection signal line SE_2. The other of the source electrode and the drain electrode of the transistor 105_2 is electrically connected to a photosensor output signal line RO_2.

One of the source electrode and the drain electrode of the transistor 109_2 is electrically connected to the power supply line VH.

Note that the first photosensor 100_1 and the second photosensor 100_2 illustrated in FIG. 6 each have a configuration similar to that of the photosensor 100 illustrated in FIG. 1B; however, their configurations are not limited to this, and the first photosensor 100_1 and the second photosensor 100_2 can each have a configuration similar to that of the photosensor 130 illustrated in FIG. 2A, for example.

<Distance Measurement Method>

Next, the description is made on a distance measurement method using the distance measurement system of one embodiment of the present invention, and specifically a distance measurement method using a distance measurement device including the adjacent first photosensor 100_1 and second photosensor 100_2 (see FIG. 6) and a light source.

[Distance Measurement Method 4]

Figure 7:
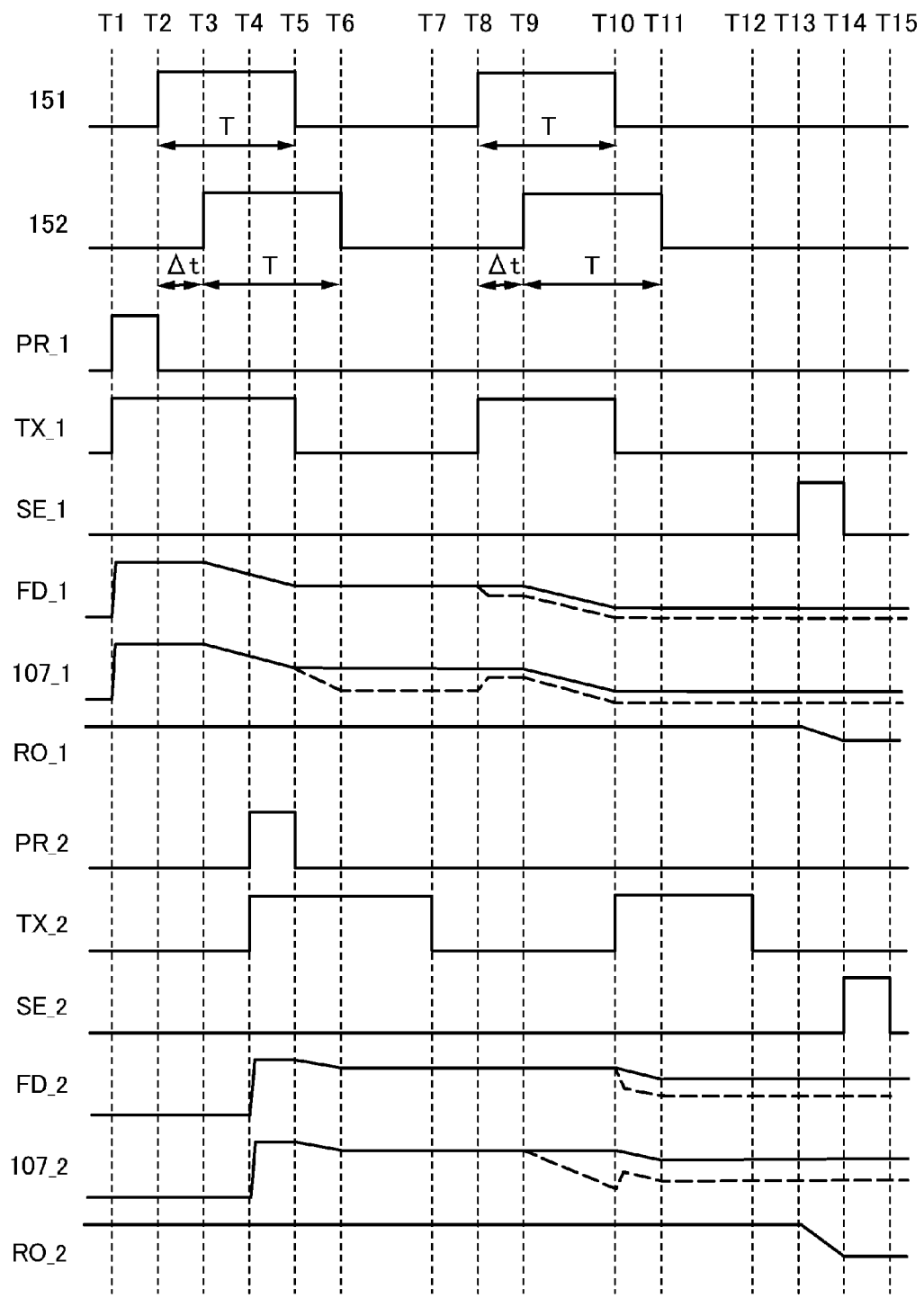
FIG. 7 illustrates an example of a timing chart of a photosensor.

FIG. 7 illustrates an example of a timing chart of the emitted light 151, the reflected light 152, the first photosensor 100_1, and the second photosensor 100_2.

With the distance measurement method 4, in the distance measurement device of one embodiment of the present invention, light emission from the light source to the object is performed for a given time T twice; the first photosensor 100_1 detects reflected light for a period during the light emission, and obtains the voltage S1 of a detection signal that depends on the light delay time; and the second photosensor 100_2 detects reflected light in a period after the light emission, and obtains the voltage S2 of the detection signal that depends on the light delay time.

Specifically, first light emission and first reflected-light detection (A) by the first photosensor 100_1 are performed for a period between the time T2 and the time T5 (for the given time T). First reflected-light detection (B) by the second photosensor 100_2 is performed for a period between the time T5 and the time T7. Second light emission and second reflected-light detection (A) by the first photosensor 100_1 are performed for a period between the time T8 and the time T10 (for the given time T). Second reflected-light detection (B) by the second photosensor 100_2 is performed for a period between the time T10 and the time T12. The voltage S1 of the detection signal is obtained between the time T13 and the time T14. The voltage S2 of the detection signal is obtained between the time T14 and the time T15. Note that the number of times of light emission and reflected-light detection (A) and (B) is not limited to two and may be three or more.

Light emission periods of plural times of light emission (B) are the same in length (i.e., the length of each light emission period is the given time T). Moreover, one light emission period of emitted light and one light emission period of reflected light are the same in length (i.e., the length of each of the periods is the given time T).

In this embodiment, in plural times of light emission, the distance between the light source and the object is assumed not to change. That is, a period between the time T2 and the time T3 and a period between the time T8 and the time T9 are the same in length (denoted by a delay time Δt); each of these periods is a period between a time at which emitted light starts to be emitted from the light source and a time at which the light reflected by the object enters the photosensor. Note that the distance measurement device of one embodiment of the present invention can measure the distance to the object in a short time by using the distance measurement method 4, so that the decrease in the position detection accuracy can be suppressed even when the distance between the light source and the object changes (e.g., when the object is a moving object) during plural times of light emission.

Note that reflected-light detection (A) starts at least before reflected light enters the photosensor, and ends at the same time as the end of light emission. Further, reflected-light detection (B) starts at the same time as the end of light emission, and ends after emission of reflected light to the photosensors ends. The potentials of the reset signal lines PR_1 and PR_2 and the accumulation signal lines TX_1 and TX_2 are controlled so that the timings of reflected-light detection (A) and reflected-light detection (B) are determined as above.

(Time T1 to Time T2: Reset Operation of First Photosensor 100_1)

At the time T1, the potential of the reset signal line PR_1 changes from the potential LPR to the potential HPR and the potential of the accumulation signal line TX_1 changes from the potential LTX to the potential HTX, whereby the photodiode 102_1 and the transistor 103_1 are turned on. The potential HPR of the reset signal line PR_1 is supplied to the charge retention node FD_1, so that charge held in the charge retention node FD_1 is reset and charge for setting the charge retention node FD_1 in an initial state is held. Note that at the time T1, the selection signal line SE_1 is supplied with the potential LSE; the reset signal line PR_2, the potential LPR; the accumulation signal line TX_2, the potential LTX; and the selection signal line SE_2, the potential LSE.

(Time T2 to Time T5: First Light Emission and First Reflected-Light Detection (A))

At the time T2, light starts to be emitted to the object from the light source, and the potential of the reset signal line PR_1 changes from the potential HPR to the potential LPR. Here, the potential of the accumulation signal line TX_1 is kept at the potential HTX; thus, a reverse-bias voltage is applied to the photodiode 102_1 when the potential of the reset signal line PR_1 becomes the potential LPR.

At the time T3, light emitted from the light source is reflected by the object, and the reflected light starts to enter the distance measurement device of one embodiment of the present invention. The photodiode 102_1 to which a reverse-bias voltage is being applied is irradiated with reflected light, whereby a current flows from the cathode to the anode of the photodiode 102_1, and the potential of the charge retention node FD_1 decreases.

(Time T4 to Time T5: Reset Operation of Second Photosensor 100_2)

At the time T4, the potential of the reset signal line PR_2 changes from the potential LPR to the potential HPR and the potential of the accumulation signal line TX_2 changes from the potential LTX to the potential HTX, whereby the photodiode 102_2 and the transistor 103_2 are turned on. The potential HPR of the reset signal line PR_2 is supplied to the charge retention node FD_2, so that charge held in the charge retention node FD_2 is reset and charge for setting the charge retention node FD_2 in an initial state is held.

(Time T5 to Time T7: First Reflected-Light Detection (B))

At the time T5, light emission ends. In the first photosensor 100_1, the potential of the accumulation signal line TX_1 changes from the potential HTX to the potential LTX. Setting the potential of the accumulation signal line TX_1 at the potential LTX turns off the transistor 103_1. Accordingly, the transfer of charge from the charge retention node FD_1 to the photodiode 102_1 stops, so that the potential of the charge retention node FD_1 is determined. Further, in the second photosensor 100_2, the potential of the reset signal line PR_2 changes from the potential HPR to the potential LPR. Here, the potential of the accumulation signal line TX_2 is kept at the potential HTX; thus, a reverse-bias voltage is applied to the photodiode 102_2 when the potential of the reset signal line PR_2 becomes the potential LPR. The photodiode 102_2 to which a reverse-bias voltage is being applied is irradiated with reflected light, whereby a current flows from the cathode to the anode of the photodiode 102_2, and the potential of the charge retention node FD_2 decreases.

At the time T6, reflected light stops entering the photodiode 102_2, so that the transfer of charge from the charge retention node FD_2 to the photodiode 102_2 stops, and the potential of the charge retention node FD_2 is determined.

Here, between the time T5 and the time T6, the potential of the charge retention node FD_1 is constant because the transistor 103_1 is off, whereas the potential of the node 107_1 decreases because the photodiode 102_1 is irradiated with the reflected light (see a dotted line representing a pulse at the node 107_1 in FIG. 7). When a potential difference is generated between the node 107_1 and the charge retention node FD_1, at the time T8 at which the transistor 103_1 is turned on next time, the potential of the charge retention node FD_1 decreases and the potential of the node 107_1 increases so that the potentials of the node 107_1 and the charge retention node FD_1 become equal to each other (see dotted lines representing pulses at the node 107_1 and the charge retention node FD_1 in FIG. 7). If the potentials of the node 107_1 and the charge retention node FD_1 are largely changed, the charge retention node FD_1 cannot accurately hold a potential corresponding to a photocurrent generated in the photodiode 102_1 during the first reflected-light detection (A). As a result, it becomes difficult to measure distance accurately in the distance measurement device or a distance measurement system including the distance measurement device (i.e., the position detection accuracy is lowered).

Note that the distance measurement device of one embodiment of the present invention includes the transistor 109_1. When the transistor 103_1 is off, the transistor 109_1 keeps a potential difference between the gate electrode and the other of the source electrode and the drain electrode less than the threshold voltage. The potential of the gate electrode of the transistor 109_1 is equal to the potential of the charge retention node FD_1, and the potential of the other of the source electrode and the drain electrode of the transistor 109_1 is equal to the potential of the node 107_1, thereby suppressing a decrease in the potential of the node 107_1 and an increase in the potential difference between the node 107_1 and the charge retention node FD_1. Consequently, in the distance measurement device of one embodiment of the present invention, the decrease in the position detection accuracy can be suppressed, and distance measurement with high accuracy can be performed.

At the time T7, the potential of the accumulation signal line TX_2 changes from the potential HTX to the potential LTX. Setting the potential of the accumulation signal line TX_2 at the potential LTX turns off the transistor 103_2.

(Time T8 to Time T10: Second Light Emission and Second Reflected-Light Detection (A))

At the time T8, light starts to be emitted to the object from the light source, and the potential of the accumulation signal line TX_1 changes from the potential LTX to the potential HTX.

At the time T9, light emitted from the light source is reflected by the object, and the reflected light starts to enter the distance measurement device of one embodiment of the present invention. The reflected light is emitted to the photodiode 102_1, whereby a current flows from the cathode to the anode of the photodiode 102_1, and the potential of the charge retention node FD_1 decreases.

Here, between the time T9 and the time T10, the potential of the charge retention node FD_2 is constant because the transistor 103_2 is off, whereas the potential of the node 107_2 decreases because the photodiode 102_2 is irradiated with the reflected light (see a dotted line representing a pulse at the node 107_2 in FIG. 7). When a potential difference is generated between the node 107_2 and the charge retention node FD_2, at the time T10 at which the transistor 103_2 is turned on next time, the potential of the charge retention node FD_2 decreases and the potential of the node 107_2 increases so that the potentials of the node 107_2 and the charge retention node FD_2 become equal to each other (see dotted lines representing pulses at the node 107_2 and the charge retention node FD_2 in FIG. 7). If the potentials of the node 107_2 and the charge retention node FD_2 are largely changed, the charge retention node FD_2 cannot accurately hold a potential corresponding to a photocurrent generated in the photodiode 102_2 during the first reflected-light detection (B). As a result, it becomes difficult to measure distance accurately in the distance measurement device or a distance measurement system including the distance measurement device (i.e., the position detection accuracy is lowered).

Note that the distance measurement device of one embodiment of the present invention includes the transistor 109_2. When the transistor 103_2 is off, the transistor 109_2 keeps a potential difference between the gate electrode and the other of the source electrode and the drain electrode less than the threshold voltage. The potential of the gate electrode of the transistor 109_2 is equal to the potential of the charge retention node FD_2, and the potential of the other of the source electrode and the drain electrode of the transistor 109_2 is equal to the potential of the node 107_2, thereby suppressing a decrease in the potential of the node 107_2 and an increase in the potential difference between the node 107_2 and the charge retention node FD_2. Consequently, adverse effect of light except in a period during which reflected light is detected can be eliminated in the distance measurement device of one embodiment of the present invention, so that the decrease in the position detection accuracy can be suppressed and distance measurement with high accuracy can be performed.

(Time T10 to Time T12: Second Reflected-Light Detection (B))

At the time T10, light emission ends. In the first photosensor 100_1, the potential of the accumulation signal line TX_1 changes from the potential HTX to the potential LTX. Setting the potential of the accumulation signal line TX_1 at the potential LTX turns off the transistor 103_1. Accordingly, the transfer of charge from the charge retention node FD_1 to the photodiode 102_1 stops, so that the potential of the charge retention node FD_1 is determined. In the second photosensor 100_2, the potential of the accumulation signal line TX_2 changes from the potential LTX to the potential HTX. The photodiode 102_2 to which a reverse-bias voltage is being applied is irradiated with reflected light, whereby a current flows from the cathode to the anode of the photodiode 102_2, and the potential of the charge retention node FD_2 decreases.

Note that the potential of the charge retention node FD_1 is constant after the time T10. The potential of the charge retention node FD_1 at the time T10 depends on a photocurrent generated in the photodiode 102_1 in the first reflected-light detection (A) and the second reflected-light detection (A) (which refer to a period between the time T2 and the time T5 and a period between the time T8 and the time T10 and are hereinafter referred to as the reflected-light detection period (A)). Further, an output signal of the first photosensor 100_1 is determined in accordance with the potential of the charge retention node FD_1 at the time T10.

At the time T11, reflected light stops entering the photodiode 102_2, so that the transfer of charge from the charge retention node FD_2 to the photodiode 102_2 stops, and the potential of the charge retention node FD_2 is determined.

At the time T12, the potential of the accumulation signal line TX_2 changes from the potential HTX to the potential LTX. Setting the potential of the accumulation signal line TX_2 at the potential LTX turns off the transistor 103_2.

Note that the potential of the charge retention node FD_2 is constant after the time T12. The potential of the charge retention node FD_2 at the time T12 depends on a photocurrent generated in the photodiode 102_2 in the first reflected-light detection (B) and the second reflected-light detection (B) (which refer to a period between the time T5 and the time T7 and a period between the time T10 and the time T12 and are hereinafter referred to as the reflected-light detection period (B)). Further, an output signal of the second photosensor 100_2 is determined in accordance with the potential of the charge retention node FD_2 at the time T12.

(Time T13 to Time T14: Read Operation in First Photosensor 100_1)

At the time T13, the potential of the selection signal line SE_1 changes from the potential LSE to the potential HSE, so that the transistor 105_1 is turned on. Thus, electrical continuity is established between the photosensor reference signal line VS and the photosensor output signal line RO_1 through the transistor 104_1 and the transistor 105_1. Then, the potential of the photosensor output signal line RO_1 becomes close to the potential of the photosensor reference signal line VS at a speed depending on the potential of the charge retention node FD_1. Note that before the time T13, the potential of the photosensor output signal line RO_1 is set at the high-level potential HRO in advance.

At the time T14, the potential of the selection signal line SE_1 changes from the potential HSE to the potential LSE, so that the transistor 105_1 is turned off and the potential of the photosensor output signal line RO_1 is determined.

The potential of the photosensor output signal line RO_1 at the time T14 depends on the speed of change in the potential of the photosensor output signal line RO_1 between the time T13 and the time T14. The speed of change in the potential of the photosensor output signal line RO_1 depends on a current between the source electrode and the drain electrode of the transistor 104_1, that is, the intensity and emission time of the reflected light emitted to the photodiode 102_1 in the reflected-light detection period (A).

Therefore, by obtaining the potential of the photosensor output signal line RO_1 at the time T14, the amount of the reflected light emitted to the photodiode 102_1 (the product of the intensity of the reflected light and time) in the reflected-light detection period (A) can be obtained as the voltage S1 of a detection signal.

(Time T14 to Time T15: Read Operation in Second Photosensor 100_2)

At the time T14, the potential of the selection signal line SE_2 changes from the potential LSE to the potential HSE, so that the transistor 105_2 is turned on. Thus, electrical continuity is established between the photosensor reference signal line VS and the photosensor output signal line RO_2 through the transistor 104_2 and the transistor 105_2. Then, a signal is output to the photosensor output signal line RO_2 from the photosensor reference signal line VS in accordance with the potential of the charge retention node FD_2. Note that before the time T14, the potential of the photosensor output signal line RO_2 is set at the high-level potential HRO in advance.

At the time T15, the potential of the selection signal line SE_2 changes from the potential HSE to the potential LSE; thus, the transistor 105_2 is turned off, the transfer of charge from the photosensor reference signal line VS to the photosensor output signal line RO_2 stops, and the potential of the photosensor output signal line RO_2 is determined.

The potential of the photosensor output signal line RO_2 at the time T15 depends on the speed of change in the potential of the photosensor output signal line RO_2 between the time T14 and the time T15. The speed of change in the potential of the photosensor output signal line RO_2 depends on a current between the source electrode and the drain electrode of the transistor 104_2, that is, the intensity and emission time of the reflected light emitted to the photodiode 102_2 in the reflected-light detection period (B).

Consequently, by obtaining the potential of the photosensor output signal line RO_2 at the time T15, the amount of the reflected light emitted to the photodiode 102_2 (the product of the intensity of the reflected light and time) in the reflected-light detection period (B) can be obtained as the voltage S2 of a detection signal.

Note that this embodiment shows an example where a period during which reflected light is emitted to the photodiode 102_2 after light emission (a period between the time T5 and the time T6 and a period between the time T10 and the time T11, i.e., time Δt) is shorter than a period during which light emission is performed and reflected light is emitted to the photodiode 102_1 (a period between the time T3 and the time T5 and a period between the time T9 and the time T10, i.e., time (T−Δt)). Thus, a potential change of the charge retention node FD_2 in the time Δt is smaller than that of the charge retention node FD_1 in the time (T−Δt). Moreover, the potential of the photosensor output signal line RO_2 at the time T15 is lower than that of the photosensor output signal line RO_1 at the time T14.

Then, the distance to the object from the distance measurement device (or the distance measurement system) of one embodiment of the present invention is obtained by using the voltage S1 and the voltage S2 of the detection signals dependent on the light delay times obtained in the reflected-light detection periods (A) and (B). A method for obtaining the distance can be similar to that in Embodiment 2.

As described above, distance measurement with high accuracy can be performed by using the distance measurement device in one embodiment of the present invention. In addition, a distance measurement system that performs distance measurement with high accuracy can be provided.

Embodiment 4

In this embodiment, a distance measurement device (or a distance measurement system) of one embodiment of the present invention and a distance measurement method using the distance measurement device (or the distance measurement system) will be described with reference to FIGS. 8A and 8B and FIG. 9. The distance measurement device (or the distance measurement system) of one embodiment of the present invention can measure distance with a TOF method.

One embodiment of the present invention is a distance measurement device that includes the photosensor shown in Embodiment 1 (also referred to as a first photosensor including a first light-receiving element) and a photosensor including a light-receiving element (also referred to as a second photosensor including a second light-receiving element) stacked over the first photosensor. Providing two or more photosensors to overlap each other can reduce the area occupied by the photosensors.

It is particularly preferable that the first light-receiving element and the second light-receiving element overlap each other, that the first light-receiving element absorb light in a first wavelength region and the second light-receiving element absorb light in a second wavelength region, and that one of the first light-receiving element and the second light-receiving element, which is closer to an object, transmit at least part of light in the wavelength region that the other light-receiving element absorbs.

For example, as one embodiment, the second light-receiving element is closer to the object than the first light-receiving element is, and the first light-receiving element detects (absorbs) infrared light in reflected light and the second light-receiving element detects (absorbs) visible light in the reflected light and transmits infrared light. The absorption of visible light by the second light-receiving element reduces light other than infrared light (i.e., light serving as noise) emitted to the first light-receiving element, so that the detection accuracy of the first photosensor can be enhanced.

In this embodiment, the description is made on an example of a distance measurement device including a first photosensor that includes a first transistor, a second transistor, and a first light-receiving element including a semiconductor layer that absorbs light in a first wavelength region; a second photosensor that includes a third transistor and a second light-receiving element including a semiconductor layer that absorbs light in a second wavelength region; a first wiring and a second wiring; a first signal line and a second signal line; and a power supply line.

In the distance measurement device of this embodiment, at least the first photosensor and the second photosensor are provided to overlap each other. In this embodiment, the first light-receiving element and the second light-receiving element are provided to overlap each other. For example, the first light-receiving element including a semiconductor layer that transmits visible light and absorbs light in a specific wavelength region may be positioned between the object and the second light-receiving element including a semiconductor layer that absorbs visible light. Alternatively, the second light-receiving element including a semiconductor layer that transmits light in a specific wavelength region and absorbs visible light may be positioned between the object and the first light-receiving element that absorbs light in the specific wavelength region. With such a structure, the first light-receiving element detects light in the specific wavelength region included in reflected light (light generated by reflection of light emitted from a light source by the object), and at the same time, the second light-receiving element detects light included in the reflected light except light in the specific wavelength region. The first photosensor is used for one of distance measurement and obtainment of two-dimensional information and the second photosensor is used for the other thereof, whereby the distance measurement device of one embodiment of the present invention can measure a distance to the object and obtain two-dimensional information at the same time.

The first wiring is electrically connected to one electrode of the first light-receiving element. The second wiring is electrically connected to one electrode of the second light-receiving element. The first signal line is electrically connected to a gate electrode of the first transistor. The second signal line is electrically connected to a gate electrode of the third transistor. The power supply line is electrically connected to one of a source electrode and a drain electrode of the second transistor. One of a source electrode and a drain electrode of the first transistor is electrically connected to a gate electrode of the second transistor. The other of the source electrode and the drain electrode of the first transistor is electrically connected to the other electrode of the first light-receiving element and the other of the source electrode and the drain electrode of the second transistor. One of a source electrode and a drain electrode of the third transistor is electrically connected to the other electrode of the second light-receiving element.

In one embodiment of the present invention, a light source performs light emission (A) to the object for a given time T plural times (n times, where n is a natural number of 2 or more) and performs light emission (B) for the given time T as many times as the light emission (A) (n times). The first photosensor obtains the voltage S1 of a detection signal dependent on the light delay time by detecting reflected light in a period during the light emission (A), and obtains the voltage S2 of the detection signal dependent on the light delay time by detecting reflected light in a period after the light emission (B). By performing light emission and reflected-light detection plural times, a detection signal based on the distance can be obtained with high accuracy, so that a more accurate distance can be calculated.

In the distance measurement device of one embodiment of the present invention, the second photosensor detects at least part of, preferably all of the reflected light in a period after the start of light emission (A) and a period after the start of light emission (B), thereby obtaining a voltage S3 of the detection signal corresponding to two-dimensional information such as the brightness or color of the object.

In the first photosensor included in the distance measurement device of one embodiment of the present invention, reflected light is detected by the first light-receiving element. The first light-receiving element is irradiated with the reflected light for both a period during which the light source emits light and a period after the light emission. When the potential of the other electrode of the first light-receiving element is changed by reflected light emitted in a period during which detection is not performed, the accuracy of detecting reflected light is lowered in some cases. The first photosensor, however, includes the second transistor that suppresses a change in the potential of the other electrode of the first light-receiving element in a period during which reflected light is not detected; thus, a distance measurement device that can measure distance with high accuracy can be provided.

<Configuration of Photosensors>

FIG. 8A is a circuit diagram of a first photosensor 100A and a second photosensor 100B included in the distance measurement device of one embodiment of the present invention. The first photosensor 100A and the second photosensor 100B are provided to overlap each other at least partly.

As illustrated in FIG. 8B, a photodiode 102A and a photodiode 102B are provided to overlap each other. Specifically, the photodiode 102B is placed between an object and the photodiode 102A so that reflected light first enters the photodiode 102B. Providing the two photodiodes to overlap each other can reduce the area occupied by the photodiodes in the device; thus, the device and a pixel can be reduced in size, for example.

The photodiode 102A in this embodiment has a property of absorbing infrared light. For example, a semiconductor layer of the photodiode 102A can be formed using polycrystalline silicon, single crystal silicon, or the like. In other words, the first photosensor 100A obtains a detection signal corresponding to a distance to the object by using infrared light in the reflected light.

The photodiode 102B has properties of transmitting infrared light and absorbing visible light. For example, a semiconductor layer of the photodiode 102B can be formed using amorphous silicon, microcrystalline silicon, or the like. In other words, the second photosensor 100B obtains a detection signal corresponding to two-dimensional information of the object by using visible light in the reflected light.

Note that the properties of the two photodiodes are not limited to the above combination. Any combination is possible as long as, when two photodiodes are provided to overlap each other, one photodiode absorbs light in a first wavelength region included in the reflected light and the other photodiode absorbs light in a specific wavelength region except light in the first wavelength region included in the reflected light.

The first photosensor 100A illustrated in FIG. 8A includes a photodiode 102A, a transistor 103A, a transistor 104A, a transistor 105A, and a transistor 109A.

One electrode of the photodiode 102A is electrically connected to a reset signal line PR_A. The other electrode of the photodiode 102A is electrically connected to the other of a source electrode and a drain electrode of the transistor 103A and the other of a source electrode and a drain electrode of the transistor 109A. In this specification and the like, a node to which the other electrode of the photodiode 102A, the other of the source electrode and the drain electrode of the transistor 103A, and the other of the source electrode and the drain electrode of the transistor 109A are connected is represented by a node 107A.

A gate electrode of the transistor 103A is electrically connected to an accumulation signal line TX_A. One of the source electrode and the drain electrode of the transistor 103A is electrically connected to a gate electrode of the transistor 104A and a gate electrode of the transistor 109A. In this specification and the like, a node to which one of the source electrode and the drain electrode of the transistor 103A, the gate electrode of the transistor 104A, and the gate electrode of the transistor 109A are connected is represented by a charge retention node FD_A.

One of a source electrode and a drain electrode of the transistor 104A is electrically connected to the photosensor reference signal line VS. The other of the source electrode and the drain electrode of the transistor 104A is electrically connected to one of a source electrode and a drain electrode of the transistor 105A.

A gate electrode of the transistor 105A is electrically connected to a selection signal line SE_A. The other of the source electrode and the drain electrode of the transistor 105A is electrically connected to a photosensor output signal line RO_A.

One of the source electrode and the drain electrode of the transistor 109A is electrically connected to the power supply line VH.

The second photosensor 100B illustrated in FIG. 8A includes a photodiode 102B, a transistor 103B, a transistor 104B, and a transistor 105B.

One electrode of the photodiode 102B is electrically connected to a reset signal line PR_B. The other electrode of the photodiode 102B is electrically connected to the other of a source electrode and a drain electrode of the transistor 103B.

A gate electrode of the transistor 103B is electrically connected to an accumulation signal line TX_B. One of the source electrode and the drain electrode of the transistor 103B is electrically connected to a gate electrode of the transistor 104B.

One of a source electrode and a drain electrode of the transistor 104B is electrically connected to the photosensor reference signal line VS. The other of the source electrode and the drain electrode of the transistor 104B is electrically connected to one of a source electrode and a drain electrode of the transistor 105B.

A gate electrode of the transistor 105B is electrically connected to a selection signal line SE_B. The other of the source electrode and the drain electrode of the transistor 105B is electrically connected to a photosensor output signal line RO_B.

Note that the first photosensor 100A illustrated in FIG. 8A has a configuration similar to that of the photosensor 100 illustrated in FIG. 1B; however, its configuration is not limited to this, and the first photosensor 100A can have a configuration similar to that of the photosensor 130 illustrated in FIG. 2A, for example. In addition, the configuration of the second photosensor 100B is not limited to that illustrated in FIG. 8A and can be a configuration of a known photosensor that can obtain two-dimensional information.

<Distance Measurement Method>

Next, the description is made on a distance measurement method using the distance measurement system of one embodiment of the present invention, and specifically a method for measuring distance concurrently with obtainment of two-dimensional information with the use of a distance measurement device including the first photosensor 100A and the second photosensor 100B (see FIGS. 8A and 8B) and a light source.

[Distance Measurement Method 5: Method for Performing Distance Measurement Concurrently with Obtainment of Two-Dimensional Information]

Figure 9:
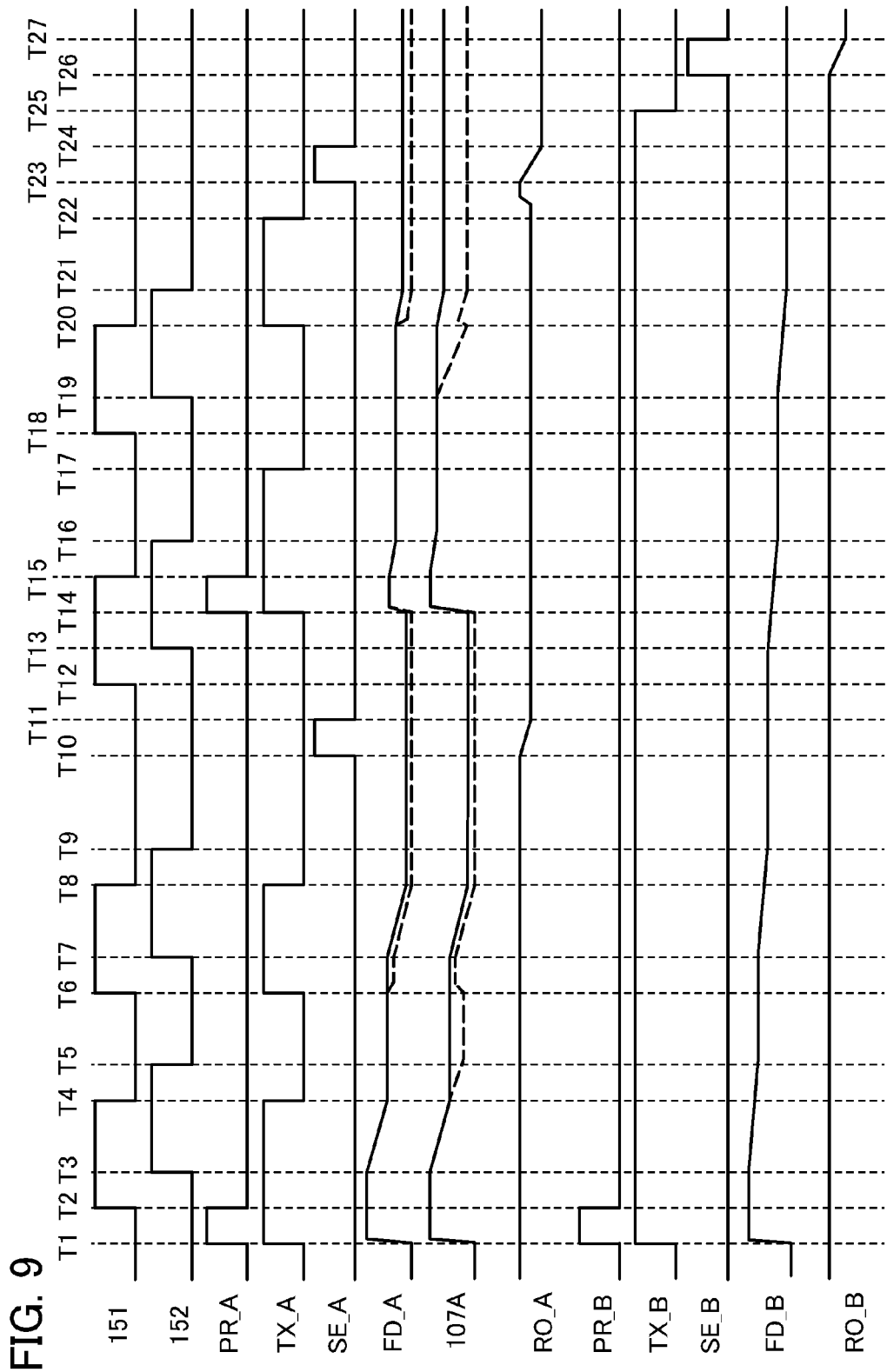
FIG. 9 illustrates an example of a timing chart of a photosensor.

FIG. 9 illustrates an example of a timing chart of the emitted light 151, the reflected light 152, the first photosensor 100A, and the second photosensor 100B.

The timing chart of the emitted light 151, the reflected light 152, and the first photosensor 100A is the same as that used in the distance measurement method 3 (see FIG. 5). Specifically, pulses of the emitted light 151, the reflected light 152, the reset signal line PR_A, the accumulation signal line TX_A, the selection signal line SE_A, the charge retention node FD_A, the node 107A, and the photosensor output signal line RO_A are the same as those of the emitted light 151, the reflected light 152, the reset signal line PR, the accumulation signal line TX, the selection signal line SE, the charge retention node FD, the node 107, and the photosensor output signal line RO shown in FIG. 5. In other words, the distance measurement method 3 described in Embodiment 2 can be referred to for the distance measurement method for the first photosensor 100A shown in this embodiment.

A method of obtaining two-dimensional information by the second photosensor 100B will be mainly described below; as for the method of distance measurement by the first photosensor 100A, which is performed concurrently, the explanation of portions for which Embodiment 2 can be referred to is omitted here.

(Time T1 to Time T2: Reset Operation of Second Photosensor 100B)

At the time T1, the potential of the reset signal line PR_B changes from the potential LPR to the potential HPR and the potential of the accumulation signal line TX_B changes from the potential LTX to the potential HTX, whereby the photodiode 102B and the transistor 103B are turned on. The potential HPR of the reset signal line PR_B is supplied to the charge retention node FD_B, so that charge held in the charge retention node FD_B is reset and charge for setting the charge retention node FD_B in an initial state is held. Note that at the time T1, the potential LSE is supplied to the selection signal line SE_B.

(Time T2 to Time T25: Reflected-Light Detection (C))

At the time T2, the potential of the reset signal line PR_B changes from the potential HPR to the potential LPR. Here, the potential of the accumulation signal line TX_B is kept at the potential HTX; thus, a reverse-bias voltage is applied to the second photodiode 102B when the potential of the reset signal line PR_B becomes the potential LPR.

Moreover, at the time T2, light emission (A) to the object from the light source starts, and at the time T3, light emitted from the light source is reflected by the object and the reflected light starts to enter the distance measurement device of one embodiment of the present invention. The second photodiode 102B to which a reverse-bias voltage is being applied is irradiated with the reflected light, whereby a current flows from the cathode to the anode of the second photodiode 102B, and the potential of the charge retention node FD_B decreases.

First light emission (A) is performed until the time T4. Then, second light emission (A) is performed for a period between the time T6 and the time T8, first light emission (B) is performed for a period between the time T12 and the time T14, and second light emission (B) is performed for a period between the time T18 and the time T20. Accordingly, the reflected light enters the second photodiode 102B for periods between the time T3 and the time T5, between the time T7 and the time T9, between the time T13 and the time T16, and between the time T19 and the time T21 (such periods are hereinafter collectively referred to as a reflected-light detection period (C)).

At the time T25, the potential of the accumulation signal line TX_B changes from the potential HTX to the potential LTX. Setting the potential of the accumulation signal line TX_B at the potential LTX turns off the transistor 103B. Accordingly, the transfer of charge from the charge retention node FD_B to the second photodiode 102B stops, so that the potential of the charge retention node FD_B is determined.

Note that the potential of the charge retention node FD_B is constant after the time T25. The potential of the charge retention node FD_B at the time T25 depends on a photocurrent generated in the second photodiode 102B in the reflected-light detection period (C). Further, an output signal of the second photosensor 100B is determined in accordance with the potential of the charge retention node FD_B at the time T25. Note that it can be said in this embodiment that the potential of the charge retention node FD_B is constant after the time T21 because the reflected light stops entering the second photodiode 102B at the time T21.

(Time T26 to Time T27: Read Operation)

At the time T26, the potential of the selection signal line SE_B changes from the potential LSE to the potential HSE, so that the transistor 105B is turned on. Thus, electrical continuity is established between the photosensor reference signal line VS and the photosensor output signal line RO_B through the transistor 104B and the transistor 105B. Then, a signal is output to the photosensor output signal line RO_B from the photosensor reference signal line VS in accordance with the potential of the charge retention node FD_B. Note that before the time T26, the potential of the photosensor output signal line RO_B is set at the high-level potential HRO in advance.

At the time T27, the potential of the selection signal line SE_B changes from the potential HSE to the potential LSE; thus, the transistor 105B is turned off, the transfer of charge from the photosensor reference signal line VS to the photosensor output signal line RO_B stops, and the potential of the photosensor output signal line RO_B is determined.

By obtaining the potential of the photosensor output signal line RO_B at the time T27, the amount of the reflected light emitted to the second photodiode 102B (the product of the intensity of the reflected light and time) in the reflected-light detection period (C) can be obtained as the voltage S3 of a detection signal.

Note that in this embodiment, reflected-light detection (C) is performed between the time T2 and the time T25 to detect all of the reflected light generated in light emission (A) and light emission (B) each of which is performed twice; however, one embodiment of the present invention is not limited to this. In reflected-light detection (C), only part of the reflected light generated while the first photosensor 100A measures distance needs to be detected, and for example, the reflected light may be detected only between the time T3 and the time T5. Note that by detecting all of the reflected light generated in light emission (A) and light emission (B), each of which is performed twice, in reflected-light detection (C), the first photosensor can detect the rest of the reflected light from which visible light is absorbed by the second photosensor, that is, infrared light. Thus, it is possible to enhance the accuracy of measurement detection (it is possible to suppress a reduction in the infrared light detection accuracy by preventing visible light or the like serving as noise from being emitted to the first photosensor).

As described above, obtainment of two-dimensional information of the object and measurement of a distance to the object can be performed at the same time with the distance measurement device of one embodiment of the present invention. In addition, providing two photodiodes to overlap each other can reduce the area of the photodiodes in the device; thus, the device and a pixel can be reduced in size, for example.

In this embodiment, the distance is measured with the distance measurement method 3; however, the distance measurement method is not limited to this. For example, in the case where the distance measurement device shown in this embodiment includes the first photosensor and a photosensor adjacent to the first photosensor, it can measure distance by the distance measurement method 4 described in Embodiment 3.

The structure described in this embodiment can be used in appropriate combination with the structure described in any of the other embodiments.

Embodiment 5

In this embodiment, a distance measurement device of one embodiment of the present invention will be described with reference to FIGS. 10A and 10B and FIGS. 11A and 11B. Specifically, a distance measurement device in which the photosensors 100 shown in Embodiment 1 are arranged in a matrix of a rows and b columns (each of a and b is a natural number of 2 or more) will be described. Embodiments 1 and 2 can be referred to for the configuration and a driving method of the photosensor.

Configuration Example 1

Figure 10A:
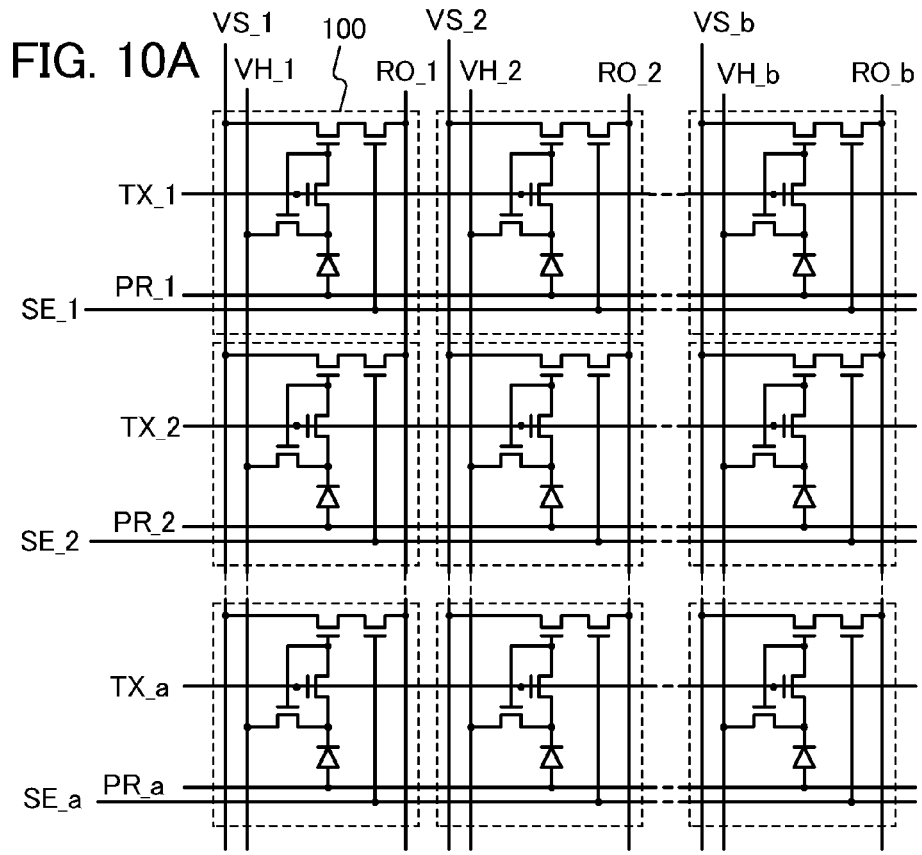
FIGS. 10A and 10B illustrate examples of a photosensor.

In the distance measurement device illustrated in FIG. 10A, a plurality of photosensors 100 are arranged in a matrix of a rows and b columns. The photosensors 100 in the i-th row are electrically connected to a reset signal line PR_i, an accumulation signal line TX_i, and a selection signal line SE_i (i is a natural number of 1 to a). The photosensors 100 in the j-th column are electrically connected to a photosensor output signal line RO_j, a power supply line VH_j, and a photosensor reference signal line VS_j (j is a natural number of 1 to b).

In the distance measurement device illustrated in FIG. 10A, the photosensors 100 in the i-th row share the reset signal line PR_i, the accumulation signal line TX_i, and the selection signal line SE_i, and the photosensors 100 in the j-th column share the photosensor output signal line RO_j, the power supply line VH_j, and the photosensor reference signal line VS_j. The present invention is not limited to this structure, and a plurality of reset signal lines, accumulation signal lines, and selection signal lines may be provided for the i-th row, and a plurality of photosensor output signal lines, power supply lines, and photosensor reference signal lines may be provided for the j-th column.

Configuration Example 2

Figure 10B:
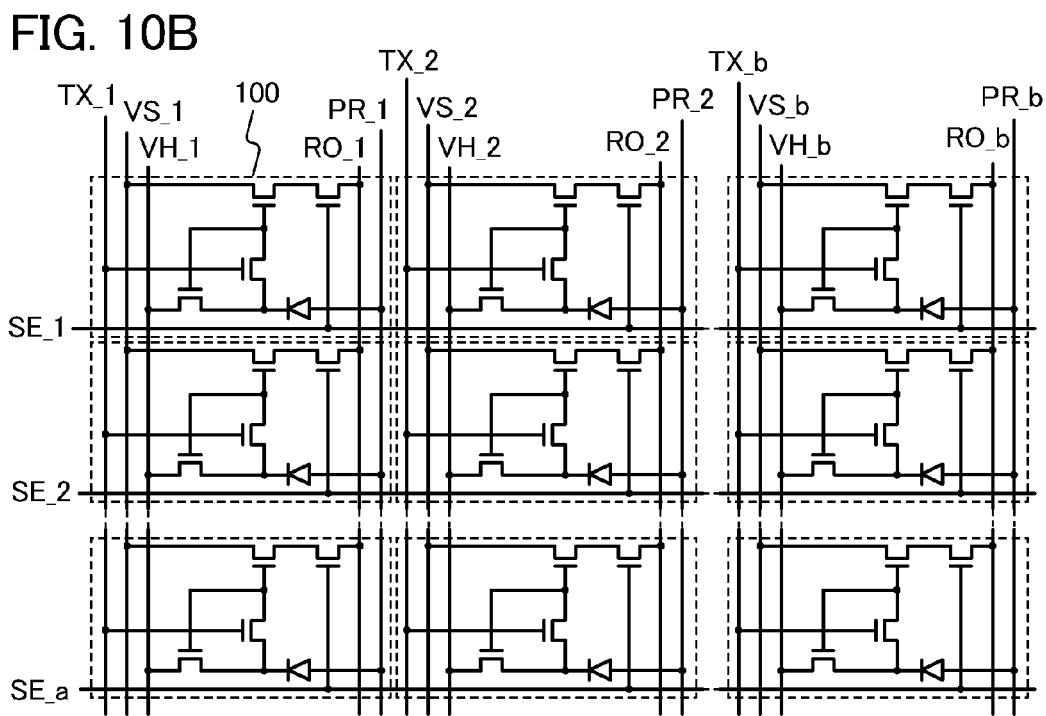

In the distance measurement device illustrated in FIG. 10B, a plurality of photosensors 100 are arranged in a matrix of a rows and b columns. The photosensors 100 in the i-th row are electrically connected to the selection signal line SE_i. The photosensors 100 in the j-th column are electrically connected to a reset signal line PR_j, an accumulation signal line TX_j, the photosensor output signal line RO_j, the power supply line VH_j, and the photosensor reference signal line VS_j.

In the distance measurement device illustrated in FIG. 10B, the photosensors 100 in the i-th row share the selection signal line SE_i, and the photosensors 100 in the j-th column share the reset signal line PR_j, the accumulation signal line TX_j, the photosensor output signal line RO_j, the power supply line VH_j, and the photosensor reference signal line VS_j. However, the present invention is not limited to this structure.

In the configuration examples 1 and 2, among the photosensors arranged in a matrix of a rows and b columns, a plurality of photosensors that perform reset operation and reflected-light detection at the same time as each other can share an accumulation signal line and a reset signal line. When a plurality of photosensors share a wiring, the number of wirings can be reduced and the configuration of a driver circuit can be simplified as a result.

FIG. 11A shows an example of a top view of the photosensor 100 and FIG. 11B illustrates a cross-sectional view along the dashed line A1-A2 in FIG. 11A.

The photosensor 100 includes a conductive film 210 functioning as the reset signal line PR, a conductive film 211 functioning as the accumulation signal line TX, a conductive film 212 functioning as the selection signal line SE, a conductive film 213 functioning as the photosensor reference signal line VS, a conductive film 214 functioning as the photosensor output signal line RO, and a conductive film 229 functioning as the power supply line VH.

The photodiode 102 includes a p-type semiconductor film 215, an i-type semiconductor film 216, and an n-type semiconductor film 217 that are sequentially stacked. The conductive film 210 is electrically connected to the p-type semiconductor film 215 functioning as the anode of the photodiode 102.

A conductive film 218 functions as the gate electrode of the transistor 103 and is electrically connected to the conductive film 211. A conductive film 219 functions as one of the source electrode and the drain electrode of the transistor 103. A conductive film 220 functions as the other of the source electrode and the drain electrode of the transistor 103.

A conductive film 221 is electrically connected to the n-type semiconductor film 217 and the conductive film 219.

A conductive film 222 functions as the gate electrodes of the transistor 104 and the transistor 109 and is electrically connected to the conductive film 220. A conductive film 223 functions as one of the source electrode and the drain electrode of the transistor 104. A conductive film 224 functions as the other of the source electrode and the drain electrode of the transistor 104 and one of the source electrode and the drain electrode of the transistor 105. The conductive film 214 functions as the other of the source electrode and the drain electrode of the transistor 105. The conductive film 212 functions as the gate electrode of the transistor 105. A conductive film 225 is electrically connected to the conductive film 223 and the conductive film 213. A conductive film 237 functions as one of the source electrode and the drain electrode of the transistor 109. A conductive film 238 functions as the other of the source electrode and the drain electrode of the transistor 109. A conductive film 239 is electrically connected to the conductive film 229 and the conductive film 238. A conductive film 226 is electrically connected to the conductive film 210. A conductive film 227 is electrically connected to the conductive film 211.

The conductive films 212, 218, 222, 225, 226, 227, and 239 can be formed by processing one conductive film formed over an insulating surface into desired shapes. A gate insulating film 228 is formed over the conductive films 212, 218, 222, 225, 226, 227, and 239.

The conductive films 210, 211, 213, 214, 219, 220, 223, 224, 229, 237, and 238 can be formed by processing one conductive film formed over the gate insulating film 228 into desired shapes. An insulating film 281 and an insulating film 282 are formed over the conductive films 210, 211, 213, 214, 219, 220, 223, 224, 229, 237, and 238. The conductive film 221 is formed over the insulating films 281 and 282.

An active layer 250 in the transistor 103 is preferably formed using an oxide semiconductor. In order to hold charge generated by light emission from the substrate 251 side for a long time, the transistor 103 electrically connected to the photodiode 102 needs to be a transistor with extremely low off-state current. For this reason, the use of an oxide semiconductor for the active layer 250 can increase the performance of the photosensor 100.

Note that in the case where the transistor 103 is a bottom-gate transistor, the active layer 250 is preferably provided to completely overlap the conductive film 218 serving as the gate electrode as illustrated in FIGS. 11A and 11B. This structure can suppress deterioration of the oxide semiconductor in the active layer 250 due to light entering from the substrate 251 side. Consequently, deterioration of characteristics of the transistor 103, such as shift in the threshold voltage, can be suppressed. Note that similar effects are obtained when the transistors 104, 105, and 109 have the above structure.

Here, in the configuration in which the accumulation signal line TX is extended in the row direction as illustrated in FIG. 10A, there is the selection signal line SE that is also extended in the row direction and is parallel to the accumulation signal line TX. Since the selection signal line SE is electrically connected to the gate electrode of the transistor 105, part of the selection signal line SE can be used as the gate electrode of the transistor 105. In this case, the accumulation signal line TX parallel to the selection signal line SE can be formed using the same material in the same step as the gate electrode of the transistor 105. Note that the resistance of the accumulation signal line TX is high in some cases because the material used for the gate electrode of the transistor often has higher resistance than the material used for the source and drain electrodes.

In contrast, in the configuration illustrated in FIG. 10B, the accumulation signal line TX is extended in the column direction. Thus, the accumulation signal line TX can be formed using a conductive film that is formed in a layer different from a layer where the selection signal line SE extended in the row direction is formed. For example, as illustrated in FIG. 11A, the accumulation signal line TX can be formed using the conductive film 211, which is formed in a layer different from a layer where the conductive films (the conductive films 212, 218, and 222) forming the gate electrodes of the transistors (e.g., the transistors 103, 104, 105, and 109) included in the photosensor 100. The conductive film 211 can be formed using the same material in the same step as the source and drain electrodes of the transistors included in the photosensor 100, such as the conductive films 214, 219, 220, 224, 237, and 238. As a result, an increase in the resistance of the accumulation signal line TX can be suppressed as compared to the configuration illustrated in FIG. 10A.

This embodiment can be freely combined with any of the other embodiments in this specification.

Embodiment 6

In this embodiment, a distance measurement device of one embodiment of the present invention will be described with reference to FIG. 12. Specifically, the description is made on a distance measurement device in which the first photosensors 100A and the second photosensors 100B shown in Embodiment 4 (collectively referred to as photosensors 1001) are arranged in a matrix of a rows and b columns (each of a and b is a natural number of 2 or more). Embodiment 4 can be referred to for the configuration and a driving method of the photosensor.

Figure 12:
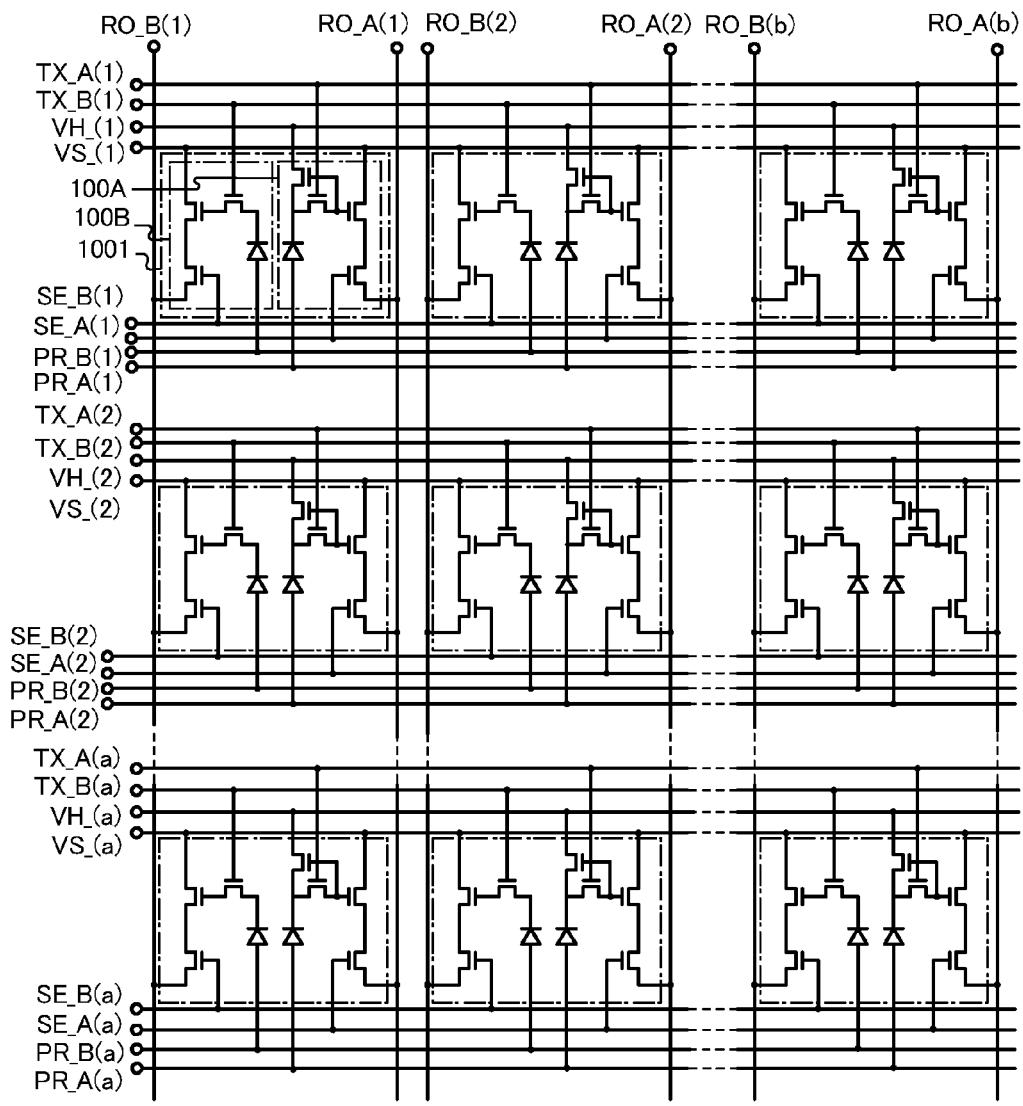
FIG. 12 illustrates an example of a photosensor.

In the distance measurement device illustrated in FIG. 12, a plurality of photosensors 1001 are arranged in a matrix of a rows and b columns. The photosensors 1001 in the i-th row are electrically connected to a reset signal line PR_A(i), a reset signal line PR_B(i), an accumulation signal line TX_A (i), an accumulation signal line TX_B(i), a selection signal line SE_A(i), a selection signal line SE_B(i), a power supply line VH(i), and a photosensor reference signal line VS(i) (i is a natural number of 1 to a). The photosensors 1001 in the j-th column are electrically connected to a photosensor output signal line RO_A(j) and a photosensor output signal line RO_B(j) (j is a natural number of 1 to b).

In the distance measurement device illustrated in FIG. 12, the photosensors 1001 in the i-th row share the reset signal line PR_A(i), the reset signal line PR_B(i), the accumulation signal line TX_A(i), the accumulation signal line TX_B(i), the selection signal line SE_A(i), the selection signal line SE_B(i), the power supply line VH(i), and the photosensor reference signal line VS(i). The photosensors 1001 in the j-th column share the photosensor output signal line RO_A(j) and the photosensor output signal line RO_B(j). The present invention is not limited to this structure, and a plurality of two kinds of reset signal lines, a plurality of two kinds of accumulation signal lines, and a plurality of two kinds of selection signal lines may be provided for the i-th row, and a plurality of two kinds of photosensor output signal lines, a plurality of power supply lines, and a plurality of photosensor reference signal lines may be provided for the j-th column.

In the distance measurement device illustrated in FIG. 12, the photosensor reference signal line is shared with the photosensors 1001 in one row; alternatively, the photosensor reference signal line may be shared with the photosensors 1001 in one column.

In the photosensor 1001 in each row and each column of the distance measurement device illustrated in FIG. 12, the photodiode 102A and the photodiode 102B are provided to overlap each other. Reflected light (light generated by reflection of light emitted from a light source by an object) first enters the photodiode 102B and then enters the photodiode 102A (see FIG. 8B).

In this embodiment, the photodiode 102A absorbs infrared light, and the photodiode 102B absorbs visible light and transmits infrared light; thus, visible light in the reflected light emitted to the photosensor 1001 is absorbed by the photodiode 102B and infrared light therein is absorbed by the photodiode 102A. Accordingly, the second photosensor 100B can be used for two-dimensional imaging with visible light and the first photosensor 100A can be used for distance measurement with infrared light.

As described above, in the configuration of this embodiment, the first photosensor 100A serving as an infrared light sensor and the second photosensor 100B serving as a visible light sensor are provided to overlap each other; thus, the area of the photosensors 1001 in the distance measurement device can be reduced. As a result, two-dimensional imaging and distance measurement with a TOF method can be concurrently performed and the pixel size can be reduced.

This embodiment can be freely combined with any of the other embodiments in this specification.

Embodiment 7

Figure 13:
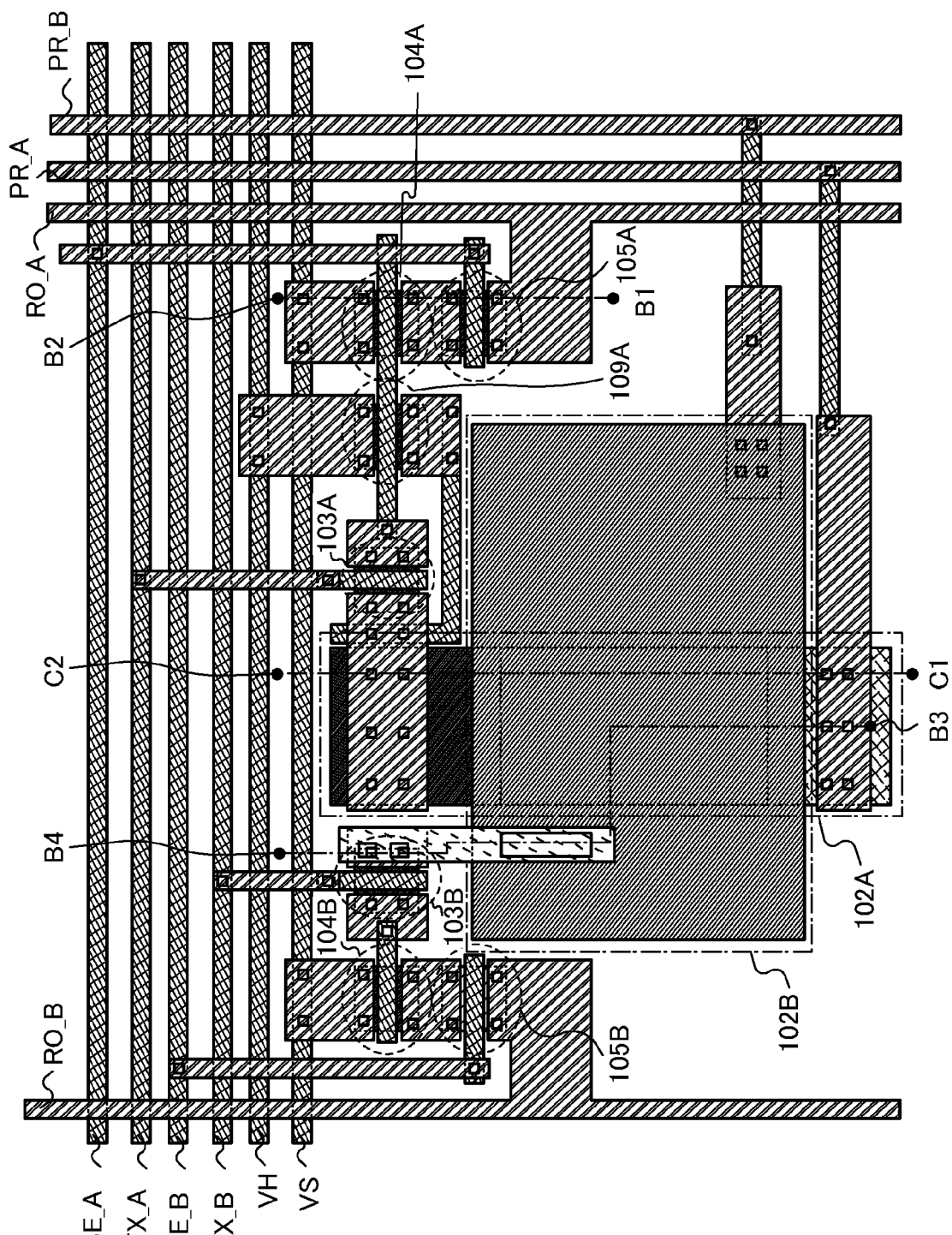
FIG. 13 is a top view of a photosensor.
Figure 14A:
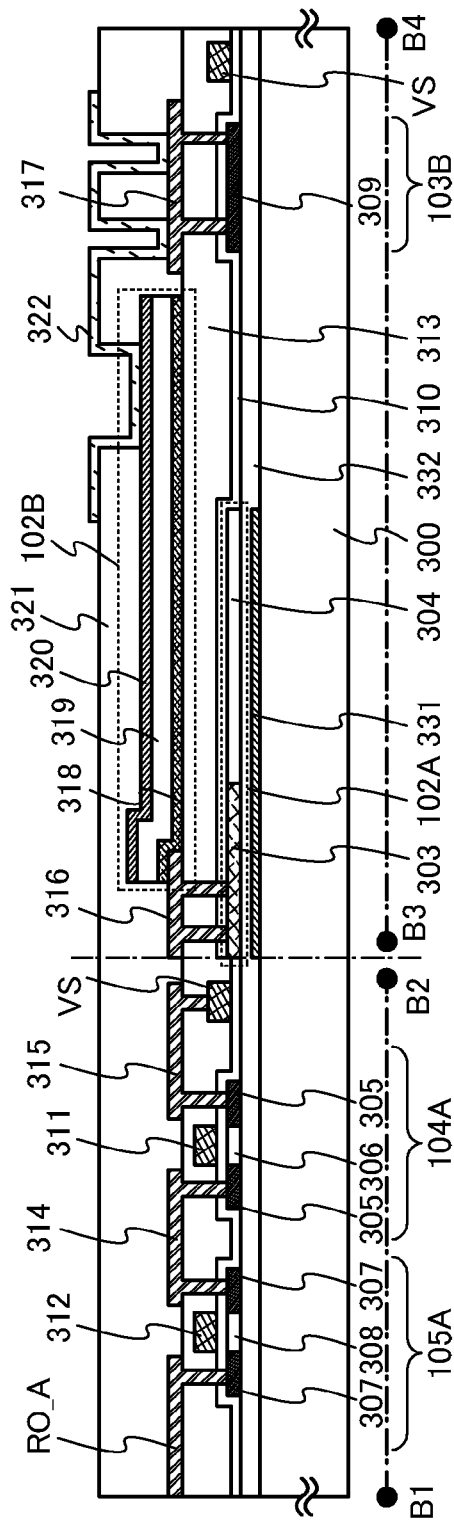
FIGS. 14A and 14B are cross-sectional views of a photosensor.
Figure 14B:
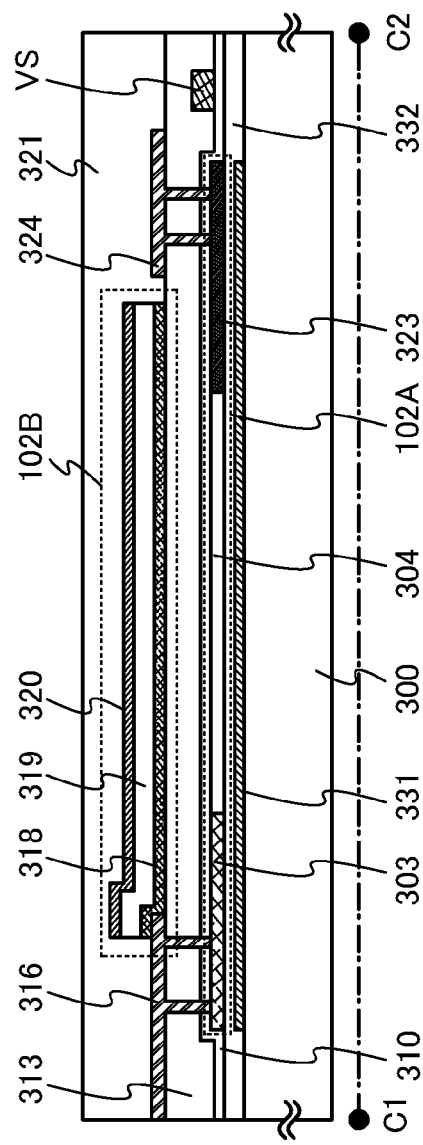

In this embodiment, a distance measurement device of one embodiment of the present invention will be described with reference to FIG. 13 and FIGS. 14A and 14B. FIG. 13 is a top view of a photosensor with a configuration similar to that of the photosensor 1001 in the circuit diagram of FIG. 12. FIG. 14A is a cross-sectional view along the chain lines B1-B2 and B3-B4 in FIG. 13. FIG. 14B is a cross-sectional view along the chain line C1-C2 in FIG. 13

In FIGS. 14A and 14B, a light-blocking layer 331 and a base film 332 are provided over a light-transmitting substrate 300.

The light-transmitting substrate 300 preferably has a property of transmitting visible light and infrared light. For example, a plastic substrate that transmits visible light and infrared light or a glass substrate that transmits visible light and infrared light can be used.

The light-blocking layer 331 prevents infrared light and visible light from a backlight from entering the photodiode 102A and the photodiode 102B. The light-blocking layer 331 can be formed in such a manner that a film of a metal material such as aluminum or chromium, which can block infrared light and visible light, is deposited by sputtering, CVD, coating, or the like and then is processed by photolithography, etching, or the like. Note that the light-blocking layer 331 is preferably provided in regions over which semiconductor layers of the transistors are stacked, in addition to regions over which the photodiodes are provided. The semiconductor layers of the transistors are shielded from light by the light-blocking layer, thereby suppressing deterioration in characteristics, such as shift in the threshold voltage of the transistors, due to entry of infrared light and visible light from the backlight.

As the backlight, a light source that can emit infrared light and visible light from the light-transmitting substrate 300 side is used. Specifically, for example, a light-emitting diode that emits infrared light and a light-emitting diode that emits visible light may be arranged next to each other. Note that a light source that emits infrared light may be separately provided on a counter substrate side.

The base film 332 can suppress diffusion of an alkali metal such as Na or an alkaline earth metal included in the light-transmitting substrate 300 into the photodiode 102A to prevent adverse effect on the characteristics. The base film 332 can be formed with a single-layer structure or a stacked structure using a light-transmitting insulating film such as a silicon oxide film, a silicon nitride film, a silicon oxynitride film, and/or a silicon nitride oxide film by CVD, sputtering, or the like. The flatness of a surface of the base film 332 is preferably high in order to reduce defects in forming the semiconductor layer of the photodiode 102A.

In FIGS. 14A and 14B, a p-type semiconductor region 303, an i-type semiconductor region 304, and an n-type semiconductor region 323 in the photodiode 102A are provided over the light-blocking layer 331 with the base film 332 placed therebetween. In FIG. 14A, an n-type semiconductor region 305 and an i-type semiconductor region 306 included in a semiconductor layer of the transistor 104A, an n-type semiconductor region 307 and an i-type semiconductor region 308 included in a semiconductor layer of the transistor 105A, and an n-type semiconductor region 309 included in a semiconductor layer of the transistor 103B are provided in the same layer as the semiconductor layer including the p-type semiconductor region 303, the i-type semiconductor region 304, and the n-type semiconductor region 323.

The semiconductor layer of the photodiode 102A (and the semiconductor regions of the transistors, formed in the same layer as the semiconductor layer of the photodiode 102A) can be formed using crystalline silicon such as polycrystalline silicon. The photodiode 102A including the semiconductor layer formed using crystalline silicon is positioned so that the p-type semiconductor region 303, the i-type semiconductor region 304, and the n-type semiconductor region 323 are horizontal to the light-transmitting substrate 300. For example, a p-type or n-type impurity region may be formed in the following manner: deposited crystalline silicon is processed by photolithography, etching, or the like and then an impurity is added by ion implantation or ion doping with the use of a mask formed by photolithography.

Alternatively, the semiconductor layer of the photodiode 102A (and the semiconductor regions of the transistors, formed in the same layer as the semiconductor layer of the photodiode 102A) can be formed using crystalline silicon such as single silicon obtained by bonding and separation. First, hydrogen ions ($H^+$, $H_2^+$, $H_3^+$, or the like), or hydrogen ions and helium ions are added to a semiconductor wafer such as a silicon wafer to form a fragile layer in the semiconductor wafer. The semiconductor wafer is bonded onto the base film 332 and separated along the fragile layer by heat treatment, so that a semiconductor layer is formed on the base film 332. The depth from the surface of the semiconductor wafer to the fragile layer corresponds to the thickness of the semiconductor layer; therefore, the thickness of the semiconductor layer can be adjusted by controlling the conditions of the addition of hydrogen ions or the like.

In FIGS. 14A and 14B, an insulating layer 310 is provided over the semiconductor layer of the photodiode 102A and the semiconductor layers of the transistors 104A, 105A, and 103B. The photosensor reference signal line VS is provided over the insulating layer 310. In FIG. 14A, in the same layer as the photosensor reference signal line VS, a gate electrode 311 and a gate electrode 312 are formed over the i-type semiconductor region 306 and the i-type semiconductor region 308, respectively, with the insulating layer 310 placed therebetween.

Further, in FIGS. 14A and 14B, an insulating layer 313 is provided over the insulating layer 310, the gate electrodes 311 and 312, and the photosensor reference signal line VS. A conductive layer 316 is provided over the p-type semiconductor region 303 with the insulating layers 310 and 313 placed therebetween. In the same layer as the conductive layer 316, a conductive layer 314 is formed between the n-type semiconductor region 305 and the n-type semiconductor region 307; the photosensor output signal line RO_A is formed over the n-type semiconductor region 307; a conductive layer 315 is formed between the n-type semiconductor region 305 and the photosensor reference signal line VS; a conductive layer 317 is formed over the n-type semiconductor region 309; and a conductive layer 324 is formed over the n-type semiconductor region 323, with the insulating layers 310 and 313 placed therebetween.

The insulating layer 310 can suppress diffusion of an alkali metal such as Na or an alkaline earth metal from the outside into the photodiode 102A to prevent adverse effect on the characteristics. The insulating layer 310 can be formed with a single-layer structure or a stacked structure using a light-transmitting insulating film such as a silicon oxide film, a silicon oxynitride film, a silicon nitride oxide film, and/or an organic resin film by plasma CVD, sputtering, or the like.

As the wirings formed in the same layer as the gate electrodes 311 and 312, a single layer or a stack of a conductive metal material film is formed by sputtering, vacuum evaporation, or the like. Examples of the conductive metal material film are a metal film of molybdenum, titanium, chromium, tantalum, tungsten, aluminum, copper, neodymium, scandium, or the like and an alloy material film containing any of these metals as its main component.

The insulating layer 313 is formed with a single-layer structure or a stacked structure using a light-transmitting insulating film such as a silicon oxide film, a silicon oxynitride film, a silicon nitride oxide film, and/or an organic resin film by plasma CVD, sputtering, or the like.

The conductive layers 314, 315, 316, and 317 are formed by sputtering, vacuum evaporation, or the like to have a single-layer structure or a stacked structure using any of the following films: a metal film of molybdenum, titanium, chromium, tantalum, tungsten, aluminum, copper, yttrium, or the like; an alloy material film containing any of these metals as its main component; a conductive metal oxide film of indium oxide or the like; and the like.

In addition, in FIGS. 14A and 14B, a p-type semiconductor region 318, an i-type semiconductor region 319, and an n-type semiconductor region 320 of the photodiode 102B are provided over the insulating layer 313 and the conductive layer 316. The p-type semiconductor region 318 is placed so that its end portion overlaps the conductive layer 316.

The semiconductor layer of the photodiode 102B can be formed using amorphous silicon. The photodiode 102B including the semiconductor layer formed using amorphous silicon is provided so that the p-type semiconductor region 318, the i-type semiconductor region 319, and the n-type semiconductor region 320 are stacked perpendicularly to the light-transmitting substrate 300.

The p-type semiconductor region 318 is formed using amorphous silicon containing an impurity element imparting p-type conductivity. The p-type semiconductor region 318 is formed by plasma CVD with the use of a semiconductor source gas including an impurity element that belongs to Group 13 of the periodic table (e.g., boron (B)). Examples of the semiconductor source gas are silane ($SiH_4$), $Si_2H_6$, $SiH_2Cl_2$, $SiHCl_3$, $SiCl_4$, and $SiF_4$. The p-type semiconductor region 318 is preferably formed to a thickness of 10 nm to 50 nm.

The i-type semiconductor region 319 is formed using amorphous silicon. For the i-type semiconductor region 319, amorphous silicon is formed by plasma CVD with the use of a semiconductor source gas. Examples of the semiconductor source gas are silane, $Si_2H_6$, $SiH_2Cl_2$, $SiHCl_3$, $SiCl_4$, and $SiF_4$. The i-type semiconductor region 319 is preferably formed to a thickness of 300 nm to 1000 nm.

The n-type semiconductor region 320 is formed using amorphous silicon containing an impurity element imparting n-type conductivity. The n-type semiconductor region 320 is formed by plasma CVD with the use of a semiconductor source gas including an impurity element belonging to Group 15 of the periodic table (e.g., phosphorus (P)). Examples of the semiconductor source gas are silane, $Si_2H_6$, $SiH_2Cl_2$, $SiHCl_3$, $SiCl_4$, and $SiF_4$. The n-type semiconductor region 320 is preferably formed to a thickness of 20 nm to 300 nm.

Moreover, in FIGS. 14A and 14B, an insulating layer 321 is provided over the photodiode 102B, the photosensor output signal line RO_A, and the conductive layers 314 to 317. A conductive layer 322 is provided to connect the n-type semiconductor region 320 and the conductive layer 317, with the insulating layer 321 placed between the conductive layer 322 and the n-type semiconductor region 320 or the conductive layer 317.

The insulating layer 321 is formed with a single-layer structure or a stacked structure using a light-transmitting insulating film such as a silicon oxide film, a silicon oxynitride film, a silicon nitride oxide film, and/or an organic resin film by plasma CVD, sputtering, or the like. The insulating layer 321 preferably has a flat surface.

The conductive layer 322 is a light-transmitting conductive layer and can be formed using indium tin oxide (ITO), indium tin oxide containing silicon oxide (ITSO), or indium zinc oxide, for example.

This embodiment can be freely combined with any of the other embodiments in this specification.

Embodiment 8

In this embodiment, a method for forming a photosensor including a transistor whose channel is formed in a semiconductor film of single crystal silicon or the like and a transistor whose channel is formed in an oxide semiconductor layer will be described with reference to FIGS. 15A to 15C.

A photodiode 704 described in this embodiment can be used as the photodiode 102 illustrated in FIG. 1B and the like; an n-channel transistor 705 can be used as the transistor 104 or the transistor 105 illustrated in FIG. 1B and the like; and a transistor 724 can be used as the transistor 103, the transistor 106, or the transistor 109 illustrated in FIG. 1B and the like. Alternatively, the transistor 724 may be used as the transistors 104 and 105 illustrated in FIG. 1B and the like.

Figure 15A:
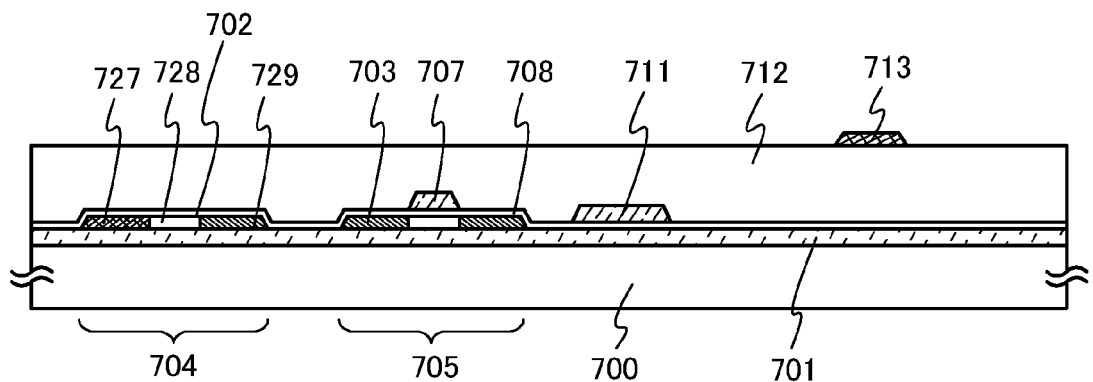
FIGS. 15A to 15C illustrate an example of a method for fabricating a photosensor.

First, the photodiode 704 and the n-channel transistor 705 are formed over an insulating surface of a substrate 700 by a known CMOS fabrication method (FIG. 15A). In this embodiment, as an example, the photodiode 704 and the n-channel transistor 705 are formed with a single crystal semiconductor film that is separated from a single crystal semiconductor substrate. As the single crystal semiconductor substrate, a silicon substrate can be used, for example.

A specific example of a method for forming the single crystal semiconductor film will be briefly described. First, an ion beam including ions that are accelerated by an electric field enters the single crystal semiconductor substrate, and a fragile layer which is weakened by local disorder of the crystal structure is formed in a region at a certain depth from the surface of the semiconductor substrate. The depth at which the fragile layer is formed can be adjusted by the acceleration energy of the ion beam and the angle at which the ion beam enters. Then, the semiconductor substrate and the substrate 700 over which an insulating film 701 is formed are attached to each other so that the insulating film 701 is placed therebetween. After the semiconductor substrate and the substrate 700 overlap each other, a pressure of about 1 $N/cm^2$ to 500 $N/cm^2$, preferably about 11 $N/cm^2$ to 20 $N/cm^2$ is applied to part of the semiconductor substrate and the substrate 700 to attach the substrates. When the pressure is applied, bonding between the semiconductor substrate and the insulating film 701 starts from the portion to which the pressure is applied, which results in bonding of the entire surface where the semiconductor substrate and the insulating film 701 are in close contact with each other. Next, heat treatment is performed, whereby very small voids that exist in the fragile layer are combined, so that the very small voids increase in volume. As a result, the single crystal semiconductor film which is part of the semiconductor substrate is separated from the semiconductor substrate along the fragile layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The photodiode 704 is formed using the island-shaped semiconductor film 702 over the insulating film 701. The n-channel transistor 705 is formed using the island-shaped semiconductor film 703 over the insulating film 701. The photodiode 704 is a lateral junction type photodiode in which a region 727 having p-type conductivity, a region 728 having i-type conductivity, and a region 729 having n-type conductivity are formed in the island-shaped semiconductor film 702. The n-channel transistor 705 includes a gate electrode 707. The n-channel transistor 705 also includes a pair of regions in the island-shaped semiconductor film 703; the pair of regions has n-type conductivity and is placed so that a region over which the gate electrode 707 is provided is sandwiched therebetween. In addition, the n-channel transistor 705 includes an insulating film 708 between the island-shaped semiconductor film 703 and the gate electrode 707. In the n-channel transistor 705, the insulating film 708 functions as a gate insulating film.

Note that the region 728 having i-type conductivity refers to a region of the semiconductor film which contains an impurity imparting p-type or n-type conductivity at a concentration of $1 \times 10^{20}$ $cm^{-3}$ or less and has photoconductivity 100 or more times as high as dark conductivity. The region 728 having i-type conductivity includes, in its category, a region that contains an impurity element belonging to Group 13 or Group 15 of the periodic table. An i-type semiconductor has weak n-type electrical conductivity when an impurity element for controlling valence electrons is not added intentionally. Therefore, the region 728 having i-type conductivity includes, in its category, a region to which an impurity element imparting p-type conductivity is added intentionally or unintentionally at the same time as the film formation or after the film formation.

Although there is no particular limitation on a material used for the substrate 700, the material needs to have heat resistance at least high enough to withstand heat treatment performed later. For example, a glass substrate manufactured by a fusion method or a float method, a quartz substrate, or a ceramic substrate can be used as the substrate 700. As the glass substrate, in the case where the temperature of heat treatment to be performed later is high, a glass substrate having a strain point of 730° C. or higher is preferably used. Although a substrate formed of a flexible synthetic resin such as plastic generally has a lower resistance temperature than the aforementioned substrates, the substrate can be used as long as it can be resistant to a processing temperature during formation steps.

Note that the case where the photodiode 704 and the n-channel transistor 705 are formed using the single crystal semiconductor film is described as an example in this embodiment; however, the present invention is not limited to this structure. For example, a polycrystalline or microcrystalline semiconductor film that is formed over the insulating film 701 by vapor deposition may be used. Alternatively, the above semiconductor film may be crystallized with a known technique. Examples of the known technique of crystallization are a laser crystallization method using a laser beam and a crystallization method using a catalytic element. Alternatively, it is possible to use a combination of a crystallization method using a catalytic element and a laser crystallization method. In the case where a heat-resistant substrate such as a quartz substrate is used, it is possible to combine any of the following crystallization methods: a thermal crystallization method using an electrically heated oven, a lamp annealing crystallization method using infrared light, a crystallization method using a catalytic element, and a high-temperature annealing method at approximately 950° C.

In FIG. 15A, after a conductive film is formed over the insulating film 708, the conductive film is processed into a desired shape by etching or the like, whereby a wiring 711 is formed together with the gate electrode 707.

Next, an insulating film 712 is formed so as to cover the photodiode 704, the n-channel transistor 705, and the wiring 711.

The insulating film 712 may have a single-layer structure or a stacked structure. A surface of the insulating film 712 may be planarized by CMP or the like. The insulating film 712 is formed using a material that can withstand a temperature of heat treatment in a later formation step. Specifically, it is preferable to use silicon oxide, silicon nitride, silicon nitride oxide, silicon oxynitride, aluminum nitride, aluminum oxide, or the like for the insulating film 712.

Note that in this specification, oxynitride refers to a material containing a higher quantity of oxygen than that of nitrogen, and nitride oxide refers to a material containing a higher quantity of nitrogen than that of oxygen.

Next, a gate electrode 713 is formed over the insulating film 712. The gate electrode 713 may have a single-layer structure or a stacked structure.

The gate electrode 713 can be formed using a metal material containing an element selected from molybdenum, titanium, tantalum, tungsten, aluminum, copper, chromium, neodymium, and scandium; metal nitride containing any of the above elements as its component (e.g., titanium nitride, molybdenum nitride, or tungsten nitride); or the like.

The gate electrode 713 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, the gate electrode 713 can have a stacked structure of the above conductive material and the above metal material.

As one layer of the gate electrode 713, which is in contact with the gate insulating film 714, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Since each of these films has a work function of 5 eV (electron volts) or higher, preferably 5.5 eV or higher, the use of such a film as the gate electrode makes the threshold voltage of the transistor positive; thus, a normally-off switching element can be achieved.

Figure 15B:
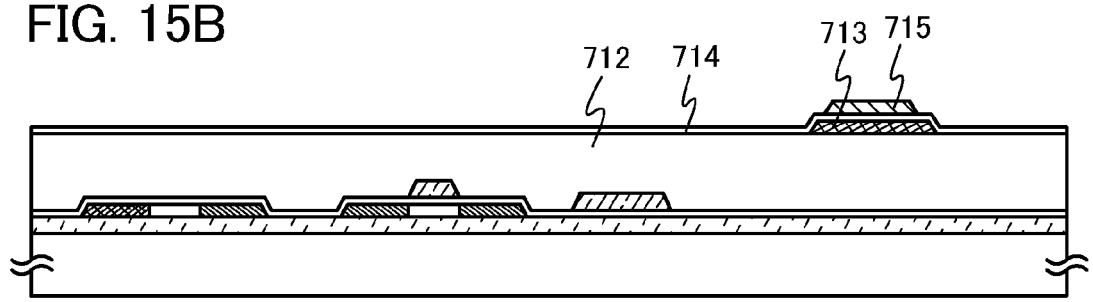

Next, a gate insulating film 714 is formed over the gate electrode 713, and after that, an oxide semiconductor layer 715 is formed over the gate insulating film 714 to overlap the gate electrode 713 (FIG. 15B).

The gate insulating film 714 has a thickness of 1 nm to 20 nm and can be formed by sputtering, MBE, CVD, pulsed laser deposition, ALD, or the like as appropriate. The gate insulating film 714 may be formed with a sputtering apparatus that performs film deposition with surfaces of a plurality of substrates set substantially perpendicular to a surface of a sputtering target.

The gate insulating film 714 can be formed using silicon oxide, gallium oxide, aluminum oxide, silicon nitride, silicon oxynitride, aluminum oxynitride, silicon nitride oxide, or the like. The gate insulating film 714 preferably includes oxygen in a portion that is in contact with the oxide semiconductor layer 715. In particular, the insulating film 714 preferably includes a large amount of oxygen which exceeds at least the stoichiometric ratio in the layer (the bulk). For example, when a silicon oxide film is used as the gate insulating film 714, the composition formula thereof is preferably $SiO_{2+\alpha}$ ($\alpha>0$). In this embodiment, a silicon oxide film of $SiO_{2+\alpha}$ ($\alpha>0$) is used as the gate insulating film 714. By using the silicon oxide film as the gate insulating film 714, oxygen can be supplied to the oxide semiconductor layer 715, so that favorable characteristics can be obtained. Further, the gate insulating film 714 is preferably formed in consideration of the size of a transistor to be formed and the step coverage with the gate insulating film 714.

The gate insulating film 714 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. The gate insulating film 714 may have a single-layer structure or a stacked structure.

The oxide semiconductor layer 715 may have a single-layer structure or a stacked structure. Further, the oxide semiconductor layer 715 may have an amorphous structure or be a crystalline oxide semiconductor. In the case where the oxide semiconductor layer 715 has an amorphous structure, heat treatment may be performed on the oxide semiconductor layer in a later formation step so that the oxide semiconductor layer has crystallinity. The heat treatment for crystallizing the amorphous oxide semiconductor layer is performed at a temperature of 250° C. to 700° C., preferably 400° C. or higher, more preferably 500° C. or higher, still more preferably 550° C. or higher. Note that the heat treatment can also serve as another heat treatment in the fabrication process.

The oxide semiconductor is in a single crystal state, a polycrystalline (polycrystal) state, an amorphous state, or the like.

An amorphous oxide semiconductor can have a flat surface with relative ease; therefore, in a transistor including the amorphous oxide semiconductor, interface scattering of carriers (electrons) during the operation can be reduced, and relatively high field-effect mobility can be obtained with relative ease.

In a crystalline oxide semiconductor, defects in the bulk can be further reduced. A transistor including the crystalline oxide semiconductor with improved surface flatness can have higher field-effect mobility than a transistor including an amorphous oxide semiconductor. In order to improve the surface flatness, the oxide semiconductor is preferably formed over a flat surface.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

An oxide semiconductor film may include CAAC-OS, for example. In the CAAC-OS, for example, c-axes are aligned, and a-axes and/or b-axes are not macroscopically aligned.

An oxide semiconductor film may include microcrystal, for example. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

An oxide semiconductor film may include an amorphous part, for example. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, the c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

The oxide semiconductor layer 715 is preferably a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, the c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is sometimes higher than that in the vicinity of the surface where the oxide semiconductor film is formed. Further, when an impurity is added to the CAAC-OS film, the crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With use of the CAAC-OS film, change in electric characteristics of the transistor due to irradiation with visible light or ultraviolet light can be reduced, so that the transistor can have high reliability.

The oxide semiconductor layer 715 can be formed by sputtering, molecular beam epitaxy (MBE), CVD, pulse laser deposition, atomic layer deposition (ALD), or the like as appropriate. Alternatively, the oxide semiconductor layer 715 may be formed using a sputtering apparatus that performs film deposition with surfaces of a plurality of substrates set substantially perpendicular to a surface of a sputtering target.

In the formation of the oxide semiconductor layer 715, the concentration of hydrogen contained in the oxide semiconductor layer 715 is preferably reduced as much as possible. In order to reduce the hydrogen concentration, for example, in the case where the oxide semiconductor layer 715 is deposited by sputtering, a high-purity rare gas (typically, argon) from which impurities such as hydrogen, water, a hydroxyl group, and hydride have been removed; oxygen; or a mixed gas of oxygen and a rare gas is used as appropriate as an atmosphere gas supplied to a deposition chamber of a sputtering apparatus.

The oxide semiconductor layer 715 is formed in such a manner that a sputtering gas from which hydrogen and moisture are removed is introduced into a deposition chamber while moisture remaining in the deposition chamber is removed, whereby the concentration of hydrogen in the oxide semiconductor layer 715 can be reduced. In order to remove moisture remaining in the deposition chamber, an entrapment vacuum pump such as a cryopump, an ion pump, or a titanium sublimation pump is preferably used. A turbo molecular pump provided with a cold trap may be used. Since a cryopump is highly capable of evacuating a hydrogen molecule, a compound containing a hydrogen atom, such as water ($H_2O$) (preferably, also a compound containing a carbon atom), and the like; thus, the concentration of impurities contained in the oxide semiconductor layer 715 that is deposited in the deposition chamber evacuated with the cryopump can be reduced.

Further, in the case where the oxide semiconductor layer 715 is formed by sputtering, the relative density (the filling rate) of a metal oxide target used for forming the oxide semiconductor layer 715 ranges from 90% to 100%, preferably from 95% to 99.9%. With the use of a metal oxide target with a high relative density, a dense oxide semiconductor layer can be deposited.

Forming the oxide semiconductor layer 715 while the substrate 700 is kept at high temperature is also effective in reducing the impurity concentration in the oxide semiconductor layer 715. The heating temperature of the substrate 700 ranges from 150° C. to 450° C., and the substrate temperature preferably ranges from 200° C. to 350° C. The crystalline oxide semiconductor layer can be formed by heating the substrate at a high temperature during the film formation.

An oxide semiconductor used for the oxide semiconductor layer 715 preferably contains at least indium (In) or zinc (Zn). In particular, an oxide semiconductor preferably contains In and Zn. In addition, as a stabilizer for reducing variations in electric characteristics of transistors using the oxide semiconductor, the oxide semiconductor preferably contains gallium (Ga), tin (Sn), hafnium (Hf), aluminum (Al), and/or zirconium (Zr).

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For example, for the oxide semiconductor, it is possible to use any of the following oxides: indium oxide, tin oxide, and zinc oxide; In—Zn-based oxide, Sn—Zn-based oxide, Al—Zn-based oxide, Zn—Mg-based oxide, Sn—Mg-based oxide, In—Mg-based oxide, and In—Ga-based oxide which are oxides of two metal elements; In—Ga—Zn-based oxide, In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide which are oxides of three metal elements; and In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide which are oxides of four metal elements.

Note that the oxide semiconductor layer 715 is preferably deposited under a condition such that much oxygen is contained (e.g., by sputtering in an atmosphere where the proportion of oxygen is 100%) so as to be a film containing much oxygen (preferably including a region containing oxygen in excess of the stoichiometric composition of a crystalline oxide semiconductor).

A high-purity gas from which impurities such as hydrogen, water, a hydroxyl group, or hydride are removed is preferably used as a sputtering gas used for forming the oxide semiconductor layer 715.

There are three methods for obtaining a CAAC-OS film when the CAAC-OS film is used as the oxide semiconductor layer 715. In the first method, an oxide semiconductor layer is formed at a film formation temperature of 200° C. to 450° C., thereby obtaining c-axis alignment substantially perpendicular to a surface. In the second method, a thin oxide semiconductor film is formed and then heat treatment is performed at a temperature of 200° C. to 700° C., thereby obtaining c-axis alignment substantially perpendicular to a surface. In the third method, a first oxide semiconductor layer is formed to have a small thickness, heat treatment is performed at a temperature of 200° C. to 700° C., and then a second oxide semiconductor layer is formed, thereby obtaining c-axis alignment substantially perpendicular to a surface.

The formed oxide semiconductor film is processed into the island-shaped oxide semiconductor layer 715 by a photolithography process. A resist mask used for processing the oxide semiconductor film into the island-shaped oxide semiconductor layer 715 may be formed by an ink-jet method. Formation of the resist mask by an ink-jet method needs no photomask; thus, the fabrication cost can be reduced.

Further, the oxide semiconductor layer 715 is preferably subjected to heat treatment for removing excess hydrogen (including water and a hydroxyl group) contained in the oxide semiconductor layer 715 (i.e., heat treatment for dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor layer 715 after the dehydration or dehydrogenation treatment can be lower than or equal to $5 \times 10^{19}/cm^3$, preferably lower than or equal to $5 \times 10^{18}/cm^3$.

Note that the heat treatment for dehydration or dehydrogenation may be performed at any timing in the process of fabricating the transistor 724 as long as the heat treatment is performed after the formation of the oxide semiconductor layer. The heat treatment for dehydration or dehydrogenation may be performed plural times, and may double as another heat treatment.

Note also that the heat treatment for dehydration or dehydrogenation is preferably performed before the oxide semiconductor layer 715 is processed into an island shape, in which case release of oxygen contained in the gate insulating film 714 by the heat treatment can be prevented.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is preferably 6N (99.9999%) or higher, further preferably 7N (99.99999%) or higher (i.e., the impurity concentration is preferably 1 ppm or lower, further preferably 0.1 ppm or lower).

In addition, after the oxide semiconductor layer 715 is heated by the heat treatment, a high-purity oxygen gas, a high-purity nitrous oxide gas, or ultra dry air (with a moisture content of 20 ppm (−55° C. by conversion into a dew point) or less, preferably 1 ppm or less, further preferably 10 ppb or less, in the case where measurement is performed by a dew point meter of a cavity ring down laser spectroscopy (CRDS) method) may be introduced into the same furnace while the heating temperature is maintained or slow cooling is performed to lower the temperature from the heating temperature. It is preferable that the oxygen gas or the nitrous oxide gas do not contain water, hydrogen, and the like. Alternatively, the purity of an oxygen gas or a nitrous oxide gas which is introduced into the heat treatment apparatus is preferably 6N or higher, more preferably 7N or higher (i.e., the impurity concentration of the oxygen gas or the nitrous oxide gas is 1 ppm or lower, preferably 0.1 ppm or lower). The oxygen gas or the nitrous oxide acts to supply oxygen, which is a main component of the oxide semiconductor and has been reduced by the step of removing impurities for dehydration or dehydrogenation; thus, the oxide semiconductor layer 715 can have high purity and be an i-type (intrinsic) oxide semiconductor layer.

Further or alternatively, oxygen (which includes at least one of an oxygen radical, an oxygen atom, and an oxygen ion) may be introduced into the oxide semiconductor layer 715 that has been subjected to the dehydration or dehydrogenation treatment in order to supply oxygen to the oxide semiconductor layer 715. Through this step, the oxide semiconductor layer 715 can be highly purified and made to be an i-type (intrinsic) oxide semiconductor layer. Variation in electric characteristics of a transistor including the highly-purified and i-type (intrinsic) oxide semiconductor layer 715 is suppressed, and the transistor is electrically stable.

Oxygen may be introduced into the oxide semiconductor layer 715 directly or through another film such as an insulating film 722 formed later. Ion implantation, ion doping, plasma immersion ion implantation, or the like can be employed to introduce oxygen through another film, whereas plasma treatment or the like can be employed in addition to the above methods to introduce oxygen directly into the exposed oxide semiconductor layer 715.

The addition of oxygen into the oxide semiconductor layer 715 can be performed anytime after dehydration or dehydrogenation treatment is performed thereon. Further, oxygen may be added plural times to the oxide semiconductor layer 715 after the dehydration or dehydrogenation treatment is performed.

Next, the insulating film 708, the insulating film 712, and the gate insulating film 714 are partly etched, whereby contact holes reaching the island-shaped semiconductor film 702, the island-shaped semiconductor film 703, and the wiring 711 are formed. Then, a conductive film is formed so as to cover the oxide semiconductor layer 715 by sputtering or vacuum evaporation. After that, the conductive film is patterned by etching or the like, so that conductive films 716, 717, 718, 719, 720, and 721 each of which functions as a source electrode, a drain electrode, or a wiring are formed (FIG. 15C).

Note that the conductive films 716 and 717 are in contact with the island-shaped semiconductor film 702. The conductive films 718 and 719 are in contact with the island-shaped semiconductor film 703. The conductive film 720 is in contact with the wiring 711 and the oxide semiconductor layer 715. The conductive film 721 is in contact with the oxide semiconductor layer 715.

Examples of a material of the conductive film for forming the conductive films 716 to 721 are an element selected from aluminum, chromium, copper, tantalum, titanium, molybdenum, and tungsten; an alloy containing any of these elements; and an alloy containing the above elements in combination. Alternatively, the conductive film may have a structure in which a film of a refractory metal such as chromium, tantalum, titanium, molybdenum, or tungsten is stacked over or under a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

The conductive films 716 to 721 may have a single-layer structure or a stacked structure including two or more layers. For example, the conductive films 716 to 721 can have a single-layer structure of an aluminum film containing silicon; a two-layer structure of an aluminum film and a titanium film stacked thereover; or a three-layer structure in which a titanium film, an aluminum film, and a titanium film are stacked in this order.

The conductive film for forming the conductive films 716 to 721 may be formed using a conductive metal oxide. As the conductive metal oxide, indium oxide, tin oxide, zinc oxide, indium tin oxide, indium zinc oxide, or the metal oxide material containing silicon or silicon oxide can be used.

In the case where heat treatment is performed after formation of the conductive film, the conductive film preferably has heat resistance high enough to withstand the heat treatment.

Note that the materials and etching conditions are adjusted as appropriate so that the oxide semiconductor layer 715 is not removed as much as possible in etching of the conductive film. Depending on etching conditions, an exposed portion of the island-shaped oxide semiconductor layer 715 is partly etched and thus a groove (a recessed portion) is formed in some cases.

In order to reduce the number of photomasks and steps in a photolithography process, etching may be performed with the use of a resist mask formed using a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Consequently, a resist mask corresponding to at least two kinds of different patterns can be formed by one multi-tone mask. Thus, the number of light-exposure masks can be reduced and the number of corresponding photolithography processes can also be reduced, whereby the process can be simplified.

Then, plasma treatment using a gas such as $N_2O$, $N_2$, or Ar is preferably conducted. Through this plasma treatment, water or the like adsorbed on an exposed surface of the oxide semiconductor layer 715 is removed. Plasma treatment may be performed using a mixture gas of oxygen and argon.

Figure 15C:
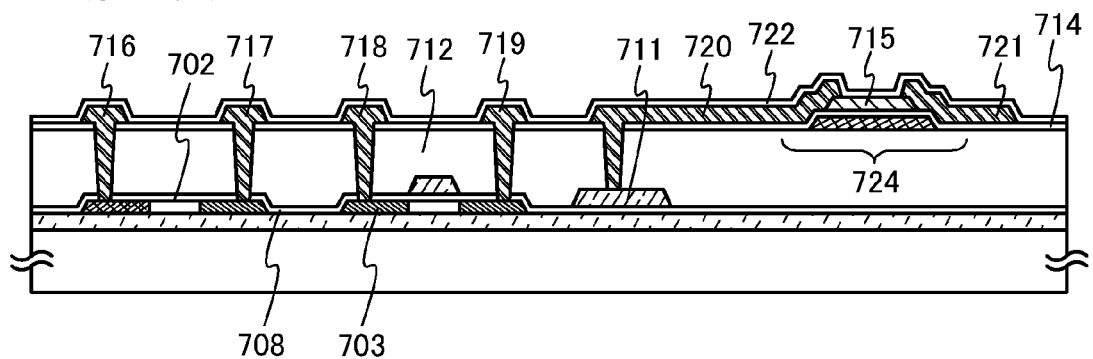

Next, as illustrated in FIG. 15C, the insulating film 722 is formed so as to cover the conductive films 716 to 721 and the oxide semiconductor layer 715. It is preferable that the insulating film 722 contain as little impurities such as moisture or hydrogen as possible. If hydrogen is contained in the insulating film 722, hydrogen might enter the oxide semiconductor layer or extract oxygen from the oxide semiconductor layer, thereby causing reduction in resistance of a back channel portion of the oxide semiconductor layer (making the back channel portion have n-type conductivity), which might result in formation of a parasitic channel. Therefore, it is important that a film formation method in which hydrogen is not used be employed in order to form the insulating film 722 containing as little hydrogen as possible.

The insulating film 722 can be formed by plasma CVD, sputtering, evaporation, or the like. In particular, the insulating film 722 is preferably formed using, as appropriate, a method such as a sputtering method which prevents impurities such as water or hydrogen from entering the insulating layer film 722.

Examples of the material for the insulating film 722 are silicon oxide, gallium oxide, aluminum oxide, silicon nitride, silicon oxynitride, aluminum oxynitride, silicon nitride oxide, hafnium oxide, magnesium oxide, zirconium oxide, lanthanum oxide, and barium oxide.

The insulating film 722 may be a single layer or a stack and can be, for example, a stack of a silicon oxide film and an aluminum oxide film. The aluminum oxide film can be preferably used because of the following reasons. First, it has a high shielding effect (blocking effect), which is impermeable to both oxygen and impurities such as hydrogen and moisture. Second, in and after the fabrication process, the aluminum oxide film functions as a protective film for preventing entry of impurities such as hydrogen or moisture, which cause a change in characteristics, into the oxide semiconductor layer 715 and release of oxygen, which is the main constituent material of the oxide semiconductor, from the oxide semiconductor layer 715.

It is preferable that the insulating film 722 include oxygen in a portion in contact with the oxide semiconductor layer 715. In particular, the insulating film 722 preferably contains a large amount of oxygen which exceeds at least the stoichiometric ratio in the layer (the bulk). For example, when a silicon oxide film is used as the insulating film 722, the composition formula is preferably $SiO_{2+\alpha}$ ($\alpha > 0$). With the use of the silicon oxide film as the insulating film 722, oxygen can be supplied to the oxide semiconductor layer 715, and favorable characteristics can be obtained.

When the insulating film 722 has a stacked structure, it is preferable to employ a stacked structure of an oxide insulating film in contact with the oxide semiconductor layer 715 and an insulating film with high barrier properties in contact with the oxide insulating film. For example, the insulating film with high barrier properties can be a silicon nitride film, a silicon nitride oxide film, an aluminum nitride film, an aluminum nitride oxide film, or the like. When the insulating film with high barrier properties is used, impurities such as moisture or hydrogen can be prevented from entering the oxide semiconductor layer 715, the gate insulating film 714, or the interface between the oxide semiconductor layer 715 and another insulating film and the vicinity thereof.

After the insulating film 722 is formed, heat treatment may be performed. The heat treatment is performed in a nitrogen atmosphere, an atmosphere of ultra-dry air, or a rare gas (e.g., argon or helium) atmosphere preferably at a temperature ranging from 200° C. to 400° C., for example, from 250° C. to 350° C. It is preferable that the water content in the gas be 20 ppm or less, preferably 1 ppm or less, further preferably 10 ppb or less. In this embodiment, for example, heat treatment is performed at 250° C. for 1 hour in a nitrogen atmosphere. Alternatively, RTA treatment for a short time at a high temperature may be performed in a manner similar to that of the heat treatment performed on the oxide semiconductor layer for reduction of moisture or hydrogen. Even when oxygen defects are generated in the oxide semiconductor layer 715 because of the previous heat treatment performed on the oxide semiconductor layer, by performing heat treatment after the insulating film 722 containing oxygen is provided, oxygen is supplied to the oxide semiconductor layer 715 from the insulating film 722. By supplying oxygen to the oxide semiconductor layer 715, oxygen defects that serve as donors can be reduced in the oxide semiconductor layer 715. As a result, the oxide semiconductor layer 715 can be made to be substantially i-type and variation in electrical characteristics of transistors due to oxygen vacancy can be reduced; thus, the electrical characteristics can be improved. There is no particular limitation on the timing of this heat treatment as long as it is after the formation of the insulating film 722. When this heat treatment doubles as another step such as heat treatment for formation of a resin film or heat treatment for reduction of the resistance of a transparent conductive film, the oxide semiconductor layer 715 can be made to be substantially i-type without increase in the number of steps.

Moreover, oxygen defects that serve as donors in the oxide semiconductor layer 715 may be reduced by subjecting the oxide semiconductor layer 715 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (i.e., the impurity concentration in the oxygen gas is preferably 1 ppm or less, more preferably 0.1 ppm or less).

Alternatively, oxygen may be added to the oxide semiconductor layer 715 by an ion implantation method, an ion doping method, or the like to reduce oxygen defects serving as donors. For example, oxygen which is made into a plasma state with a microwave at 2.45 GHz may be added to the oxide semiconductor layer 715.

Note that a backgate electrode may be formed at a position overlapping the oxide semiconductor layer 715 by forming a conductive film over the insulating film 722 and then patterning the conductive film. In the case where the backgate electrode is formed, an insulating film is preferably formed to cover the backgate electrode. The backgate electrode can be formed using a material and a structure similar to those of the gate electrode 713 or the conductive films 716 to 721.

The thickness of the backgate electrode ranges from 10 nm to 400 nm, preferably from 100 nm to 200 nm. For example, the backgate electrode may be formed in a such a manner that a conductive film with a stacked structure of a titanium film, an aluminum film, and a titanium film is formed, a resist mask is formed by photolithography or the like, and unnecessary portions are removed by etching so that the conductive film is processed (patterned) into a desired shape.

Through the above steps, the transistor 724 is formed.

The transistor 724 includes the gate electrode 713, the gate insulating film 714 over the gate electrode 713, the oxide semiconductor layer 715 that overlaps the gate electrode 713 with the gate insulating film 714 placed therebetween, and a pair of the conductive films 720 and 721 formed over the oxide semiconductor layer 715. Further, the insulating film 722 may be considered as a component of the transistor 724. The transistor 724 illustrated in FIG. 15C has a channel-etched structure in which part of the oxide semiconductor layer 715, which is placed between the conductive film 720 and the conductive film 721, is etched.

Although the transistor 724 is described as a single-gate transistor, a multi-gate transistor that includes a plurality of gate electrodes 713 electrically connected to each other and thus has a plurality of channel formation regions can be formed, if needed.

This embodiment can be implemented in combination with the embodiments mentioned above.

Embodiment 9

In this embodiment, a transistor that includes an oxide semiconductor layer in which a channel is formed and has a structure different from that in Embodiment 8 will be described with reference to FIGS. 16A to 16D.

Note that the photodiode 704 and the n-channel transistor 705 included in photosensors illustrated in FIGS. 16A to 16D have the same structures as those in Embodiment 8; thus, the description thereof is omitted.

Figure 16A:
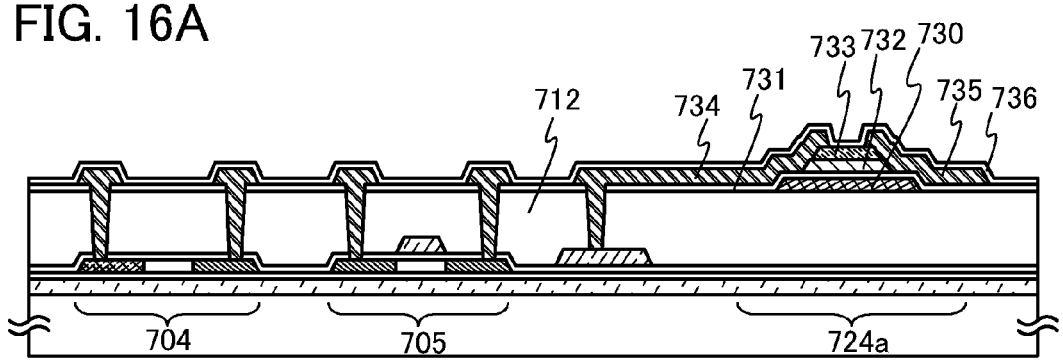
FIGS. 16A to 16D are cross-sectional views of photosensors.

A transistor 724a illustrated in FIG. 16A is a bottom-gate transistor including a channel protective film.

The transistor 724a includes a gate electrode 730 formed over the insulating film 712, a gate insulating film 731 over the gate electrode 730, an oxide semiconductor layer 732 overlapping the gate electrode 730 with the gate insulating film 731 placed therebetween, a channel protective film 733 formed over the oxide semiconductor layer 732 in a position overlapping the gate electrode 730, and a conductive film 734 and a conductive film 735 formed over the oxide semiconductor layer 732. The transistor 724a may further include, as its component, an insulating film 736 formed over the conductive films 734 and 735 and the channel protective film 733.

The channel protective film 733 can prevent the portion serving as a channel formation region in the oxide semiconductor layer 732 from being damaged in a later step (e.g., from being reduced in thickness by plasma or an etchant in etching). Thus, the reliability of the transistor 724a can be improved.

An inorganic material containing oxygen (e.g., silicon oxide, silicon nitride oxide, silicon oxynitride, aluminum oxide, or aluminum oxynitride) can be used for the channel protective film 733. The channel protective film 733 can be formed by sputtering or vapor deposition such as plasma CVD or thermal CVD. After the deposition, the shape of the channel protective film 733 is processed by etching. Here, the channel protective film 733 is formed in such a manner that a silicon oxide film is formed by a sputtering method and processed by etching using a mask formed by photolithography.

By using an inorganic material containing oxygen for the channel protective film 733, oxygen can be supplied from the channel protective film 733 to the oxide semiconductor layer 732 and oxygen vacancies serving as donors can be reduced even when heat treatment for reducing moisture or hydrogen causes the oxygen vacancies in the oxide semiconductor layer 732. Thus, the channel formation region can be made to be close to i-type and variations in electrical characteristics of the transistor 724a due to oxygen vacancies can be reduced, and the electrical characteristics can be improved as a result.

Figure 16B:
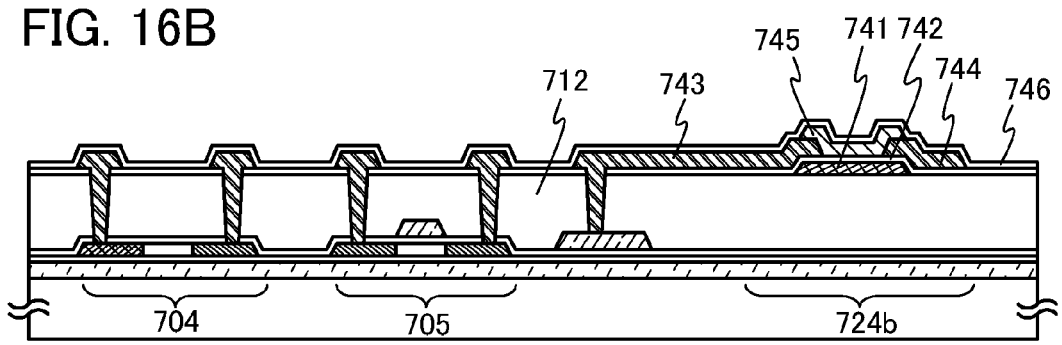

A transistor 724b illustrated in FIG. 16B is a bottom-contact transistor.

The transistor 724b includes a gate electrode 741 formed over the insulating film 712, a gate insulating film 742 over the gate electrode 741, a conductive film 743 and a conductive film 744 over the gate insulating film 742, and an oxide semiconductor layer 745 overlapping the gate electrode 741 with the gate insulating film 742 placed therebetween. The transistor 724b may further include an insulating film 746 formed over the oxide semiconductor layer 745 as its component.

Note that the transistors 724a and 724b may each include a backgate electrode.

Figure 16C:
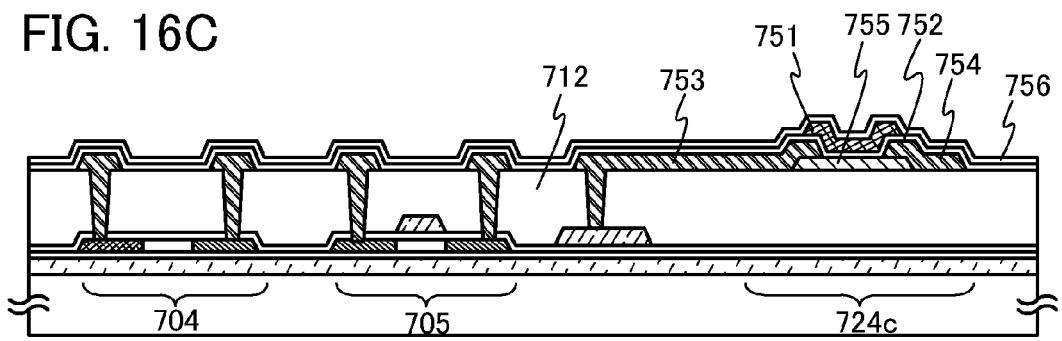

A transistor 724c illustrated in FIG. 16C is a top-contact transistor.

The transistor 724c includes an oxide semiconductor layer 755 formed over the insulating film 712, a conductive film 753 and a conductive film 754 over the oxide semiconductor layer 755, a gate insulating film 752 over the oxide semiconductor layer 755 and the conductive films 753 and 754, and a gate electrode 751 overlapping the oxide semiconductor layer 755 with the gate insulating film 752 placed therebetween. An insulating film 756 formed over the gate electrode 751 may be considered as a component of the transistor 724c.

Figure 16D:
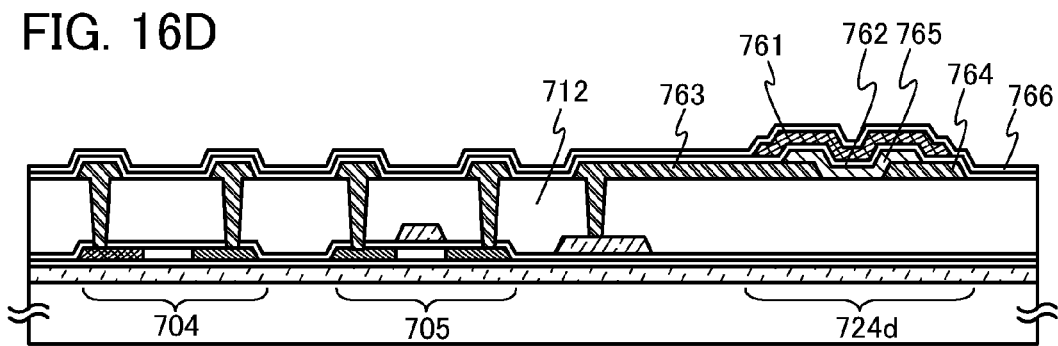

A transistor 724d illustrated in FIG. 16D is a top-contact transistor.

The transistor 724d includes a conductive film 763 and a conductive film 764 formed over the insulating film 712, an oxide semiconductor layer 765 over the conductive films 763 and 764, a gate insulating film 762 over the oxide semiconductor layer 765 and the conductive films 763 and 764, and a gate electrode 761 overlapping the oxide semiconductor layer 765 with the gate insulating film 762 placed therebetween. An insulating film 766 formed over the gate electrode 761 may be considered as a component of the transistor 724d.

This embodiment can be implemented in combination with the embodiments mentioned above.

This application is based on Japanese Patent Applications serial No. 2012-063338 filed with Japan Patent Office on Mar. 21, 2012, the entire contents of which are hereby incorporated by reference.

What is claimed is:
1. A semiconductor device comprising:
   a first photosensor comprising a first light-receiving element, a first transistor, and a second transistor,
   wherein a first electrode of the first light-receiving element is directly connected to a first terminal of the first transistor and a first terminal of the second transistor, and
   wherein a gate electrode of the first transistor is directly connected to a second terminal of the second transistor.
2. The semiconductor device according to claim 1,
   wherein the first transistor comprises a channel formation region comprising an oxide semiconductor, and
   wherein the second transistor comprises a channel formation region comprising an oxide semiconductor.

3. The semiconductor device according to claim 1,
wherein the first photosensor comprises a third transistor, and
wherein a first terminal of the third transistor is electrically connected to the gate electrode of the first transistor and the second terminal of the second transistor.

4. The semiconductor device according to claim 1,
wherein the first photosensor comprises a fourth transistor, and
wherein a gate electrode of the fourth transistor is electrically connected to the gate electrode of the first transistor and the second terminal of the second transistor.

5. The semiconductor device according to claim 1,
wherein the first photosensor comprises a third transistor and a fourth transistor,
wherein a first terminal of the third transistor is electrically connected to the gate electrode of the first transistor and the second terminal of the second transistor, and
wherein a gate electrode of the fourth transistor is electrically connected to the gate electrode of the first transistor and the second terminal of the second transistor.

6. The semiconductor device according to claim 5,
wherein the first transistor comprises a channel formation region comprising an oxide semiconductor,
wherein the second transistor comprises a channel formation region comprising an oxide semiconductor, and
wherein the third transistor comprises a channel formation region comprising an oxide semiconductor.

7. The semiconductor device according to claim 1,
wherein the first photosensor is configured to perform a reset operation by supplying a signal to a second electrode of the first light-receiving element from a first time to a second time,
wherein a light source is configured to perform an irradiation of light to an object from the second time to a fourth time,
wherein the first photosensor is configured to perform a detection of the light reflected off the object from the second time to the fourth time,
wherein the light source is configured to perform the irradiation n times,
wherein the first photosensor is configured to perform the detection n times,
wherein a distance x from the semiconductor device to the object is obtained by:

$$x = \frac{c}{2} \times \left(T - \frac{S1}{n \times k}\right)$$

wherein S1 is a detection signal corresponding to the amount of charge generated by the first light-receiving element in the detection,
wherein T is a time length from the second time to the fourth time,
wherein n is a natural number of 2 or more,
wherein c is light speed, and
wherein k is a constant.

8. The semiconductor device according to claim 1,
wherein a light source is configured to perform an irradiation of light to an object from a first time to a fourth time,
wherein the first photosensor is configured to perform a reset operation by supplying a signal to a second electrode of the first light-receiving element from a third time to the fourth time,
wherein the first photosensor is configured to perform a detection of the light reflected off the object from the fourth time to a sixth time,
wherein the light source is configured to perform the irradiation n times,
wherein the first photosensor is configured to perform the detection n times,
wherein a distance x from the semiconductor device and the object is obtained by:

$$x = \frac{c \times S2}{2 \times n \times k}$$

wherein S2 is a detection signal corresponding to the amount of charge generated by the first light-receiving element in the detection,
wherein n is a natural number of 2 or more,
wherein c is light speed, and
wherein k is a constant.

9. The semiconductor device according to claim 1,
wherein the first photosensor is configured to perform a first reset operation by supplying a signal to a second electrode of the first light-receiving element from a first time to a second time,
wherein a light source is configured to perform a first irradiation of first light to an object from the second time to a fourth time,
wherein the first photosensor is configured to perform a first detection of the first light reflected off the object from the second time to the fourth time,
wherein the light source is configured to perform a second irradiation of second light to the object from a twelfth time to a fifteenth time,
wherein the first photosensor is configured to perform a second reset operation by supplying the signal to the second electrode of the first light-receiving element from a fourteenth time to the fifteenth time,
wherein the first photosensor is configured to perform a second detection of the second light reflected off the object from the fifteenth time to a seventeenth time,
wherein the light source is configured to perform the first irradiation n times,
wherein the light source is configured to perform the second irradiation n times,
wherein the first photosensor is configured to perform the first detection n times,
wherein the first photosensor is configured to perform the second detection n times,
wherein a distance x from the semiconductor device to the object is obtained by:

$$x = \frac{c \times T \times S2}{2 \times (S1 + S2)}$$

wherein S1 is a detection signal corresponding to the amount of charge generated by the first light-receiving element in the first detection,
wherein S2 is a detection signal corresponding to the amount of charge generated by the first light-receiving element in the second detection, wherein T is a time length from the second time to the fourth time, and wherein c is light speed.

10. The semiconductor device according to claim 1, further comprising:
a second photosensor adjacent to the first photosensor, the second photosensor comprising a second light-receiving element, a fourth transistor, a fifth transistor, and a sixth transistor; and
a power supply line,
wherein a first electrode of the second light-receiving element is electrically connected to a first terminal of the fourth transistor and a first terminal of the fifth transistor,
wherein a gate electrode of the fourth transistor is electrically connected to a second terminal of the fifth transistor and a gate electrode of the sixth transistor, and
wherein the power supply line is electrically connected to a second terminal of the first transistor and a second terminal of the fourth transistor.

11. The semiconductor device according to claim 10,
wherein the first transistor comprises a channel formation region comprising an oxide semiconductor,
wherein the second transistor comprises a channel formation region comprising an oxide semiconductor,
wherein the fourth transistor comprises a channel formation region comprising an oxide semiconductor, and
wherein the fifth transistor comprises a channel formation region comprising an oxide semiconductor.

12. The semiconductor device according to claim 10,
wherein the first photosensor is configured to perform a first reset operation by supplying a first signal to a second electrode of the first light-receiving element from a first time to a second time,
wherein a light source is configured to perform an irradiation of light to an object from the second time to a fifth time,
wherein the first photosensor is configured to perform a first detection of the light reflected off the object from the second time to the fifth time,
wherein the second photosensor is configured to perform a second reset operation by supplying a second signal to a second electrode of the second light-receiving element from a fourth time to the fifth time,
wherein the second photosensor is configured to perform a second detection of the light reflected off the object from the fifth time to a seventh time,
wherein the light source is configured to perform the irradiation n times,
wherein the first photosensor is configured to perform the first detection n times,
wherein the second photosensor is configured to perform the second detection n times,
wherein a distance x from the semiconductor device to the object is obtained by:

$$x = \frac{c \times T \times S2}{2 \times (S1 + S2)}$$

wherein S1 is a detection signal corresponding to the amount of charge generated by the first light-receiving element in the first detection, wherein S2 is a detection signal corresponding to the amount of charge generated by the second light-receiving element in the second detection, wherein T is a time length from the second time to the fourth time, wherein n is a natural number of 2 or more, and wherein c is light speed.

13. A semiconductor device comprising:
a first photosensor comprising a first light-receiving element, a second transistor, and a third transistor; and
a second photosensor comprising a second light-receiving element, a fourth transistor, a fifth transistor, and a sixth transistor,
wherein a first electrode of the first light-receiving element is electrically connected to a first terminal of the second transistor,
wherein a second terminal of the second transistor is electrically connected to a gate electrode of the third transistor,
wherein a first electrode of the second light-receiving element is directly connected to a first terminal of the fourth transistor and a first terminal of the fifth transistor,
wherein a gate electrode of the fourth transistor is directly connected to a second terminal of the fifth transistor and a gate electrode of the sixth transistor, and
wherein the first light-receiving element overlaps with the second light-receiving element.

14. The semiconductor device according to claim 13,
wherein the first light-receiving element is configured to detect visible light, and
wherein the second light-receiving element is configured to detect infrared light.

15. The semiconductor device according to claim 14,
wherein the second transistor comprises a channel formation region comprising an oxide semiconductor,
wherein the fourth transistor comprises a channel formation region comprising an oxide semiconductor, and
wherein the fifth transistor comprises a channel formation region comprising an oxide semiconductor.

16. The semiconductor device according to claim 14,
wherein the second photosensor is configured to perform a reset operation by supplying a signal to a second electrode of the second light-receiving element from a first time to a second time,
wherein a light source is configured to perform an irradiation of light to an object from the second time to a fourth time,
wherein the second photosensor is configured to perform a detection of the light reflected off the object from the second time to the fourth time,
wherein the light source is configured to perform the irradiation n times,
wherein the second photosensor is configured to perform the detection n times,
wherein a distance x from the semiconductor device to the object is obtained by:

$$x = \frac{c}{2} \times \left(T - \frac{S1}{n \times k}\right)$$

wherein S1 is a detection signal corresponding to the amount of charge generated by the second light-receiving element in the detection, wherein T is a time length from the second time to the fourth time,
wherein n is a natural number of 2 or more,
wherein c is light speed,
wherein k is a constant, and
wherein the first photosensor is configured to perform a second detection of the light transmitted through the first light-receiving element while the second photosensor performs the detection n times.

17. The semiconductor device according to claim 14,
wherein a light source is configured to perform an irradiation of light to an object from a first time to a fourth time,
wherein the second photosensor is configured to perform a reset operation by supplying a signal to a second electrode of the second light-receiving element from a third time to the fourth time,
wherein the second photosensor is configured to perform a detection of the light reflected off the object from the fourth time to a sixth time,
wherein the light source is configured to perform the irradiation n times,
wherein the second photosensor is configured to perform the detection n times,
wherein a distance x from the semiconductor device and the object is obtained by:

$$x = \frac{c \times S2}{2 \times n \times k}$$

wherein S2 is a detection signal corresponding to the amount of charge generated by the second light-receiving element in the detection,
wherein n is a natural number of 2 or more,
wherein c is light speed,
wherein k is a constant, and
wherein the first photosensor is configured to perform a second detection of the light transmitted through the first light-receiving element while the second photosensor performs the detection n times.

18. The semiconductor device according to claim 14,
wherein the second photosensor is configured to perform a first reset operation by supplying a signal to a second electrode of the second light-receiving element from a first time to a second time,
wherein a light source is configured to perform a first irradiation of first light to an object from the second time to a fourth time,
wherein the second photosensor is configured to perform a first detection of the first light reflected off the object from the second time to the fourth time,
wherein the light source is configured to perform a second irradiation of second light to the object from a twelfth time to a fifteenth time,
wherein the second photosensor is configured to perform a second reset operation by supplying the signal to the second electrode of the second light-receiving element from a fourteenth time to the fifteenth time,
wherein the second photosensor is configured to perform a second detection of the second light reflected off the object from the fifteenth time to a seventeenth time,
wherein the light source is configured to perform the first irradiation n times,
wherein the light source is configured to perform the second irradiation n times,
wherein the second photosensor is configured to perform the first detection n times,
wherein the second photosensor is configured to perform the second detection n times,
wherein a distance x from the semiconductor device to the object is obtained by:

$$x = \frac{c \times T \times S2}{2 \times (S1 + S2)}$$

wherein S1 is a detection signal corresponding to the amount of charge generated by the second light-receiving element in the first detection,
wherein S2 is a detection signal corresponding to the amount of charge generated by the second light-receiving element in the second detection,
wherein T is a time length from the second time to the fourth time,
wherein c is light speed, and
wherein the first photosensor is configured to perform a third detection of the first light and the second light transmitted through the first light-receiving element while the second photosensor performs the first detection n times and the second detection n times.

* * * * *